United States Patent
Togashi et al.

(10) Patent No.: US 11,817,466 B2
(45) Date of Patent: Nov. 14, 2023

(54) PHOTOELECTRIC CONVERSION ELEMENT, PHOTODETECTOR, PHOTODETECTION SYSTEM, ELECTRONIC APPARATUS, AND MOBILE BODY

(71) Applicant: SONY SEMICONDUCTOR SOLUTIONS CORPORATION, Kanagawa (JP)

(72) Inventors: Hideaki Togashi, Kanagawa (JP); Tetsuji Yamaguchi, Kanagawa (JP); Nobuhiro Kawai, Kanagawa (JP); Koji Sekiguchi, Kanagawa (JP); Masahiro Joei, Kanagawa (JP); Kenichi Murata, Kanagawa (JP); Shintarou Hirata, Kanagawa (JP); Yuta Hasegawa, Kanagawa (JP); Yoshito Nagashima, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/618,953

(22) PCT Filed: Jun. 17, 2020

(86) PCT No.: PCT/JP2020/023712
§ 371 (c)(1),
(2) Date: Dec. 14, 2021

(87) PCT Pub. No.: WO2020/255999
PCT Pub. Date: Dec. 24, 2020

(65) Prior Publication Data
US 2022/0271073 A1    Aug. 25, 2022

Related U.S. Application Data

(60) Provisional application No. 62/864,907, filed on Jun. 21, 2019.

(51) Int. Cl.
*H01L 27/146* (2006.01)

(52) U.S. Cl.
CPC .. *H01L 27/14605* (2013.01); *H01L 27/14621* (2013.01); *H01L 27/14623* (2013.01);
(Continued)

(58) Field of Classification Search
CPC ............... H01L 27/14605; H01L 27/14638
See application file for complete search history.

(56) References Cited

U.S. PATENT DOCUMENTS

| 9,111,993 B1 | 8/2015 | Zheng et al. |
| 10,056,423 B1 | 8/2018 | Huang |

(Continued)

FOREIGN PATENT DOCUMENTS

| EP | 3644602 A1 | 4/2020 |
| JP | 2015-216187 | 12/2015 |

(Continued)

OTHER PUBLICATIONS

International Search Report prepared by the Japan Patent Office dated Aug. 11, 2020, for International Application No. PCT/JP2020/023712, 2 pgs.

*Primary Examiner* — Thanh Luu
(74) *Attorney, Agent, or Firm* — Sheridan Ross PC

(57) ABSTRACT

A highly functional photoelectric conversion element is provided. The photoelectric conversion element includes: a first photoelectric converter that detects light in a first wavelength range and photoelectrically converts the light; a second photoelectric converter that detects light in a second wavelength range and photoelectrically converts the light to obtain distance information of a subject; and an optical filter that is disposed between the first photoelectric converter and the second photoelectric converter, and allows the light in the second wavelength range to pass therethrough more easily than the light in the first wavelength range. The first photoelectric converter includes a stacked structure and an (Continued)

electric charge accumulation electrode. The stacked structure includes a first electrode, a first photoelectric conversion layer, and a second electrode that are stacked in order, and the electric charge accumulation electrode is disposed to be separated from the first electrode and be opposed to the first photoelectric conversion layer with an insulating layer interposed therebetween.

21 Claims, 44 Drawing Sheets

(52) U.S. Cl.
CPC .. *H01L 27/14627* (2013.01); *H01L 27/14638* (2013.01); *H01L 27/14649* (2013.01)

(56) References Cited

U.S. PATENT DOCUMENTS

| | | | |
|---|---|---|---|
| 2011/0116078 A1* | 5/2011 | Cho | H01L 27/14632 356/51 |
| 2012/0105696 A1* | 5/2012 | Maeda | H01L 27/1469 438/66 |
| 2016/0181226 A1 | 6/2016 | Wan | |
| 2017/0033141 A1* | 2/2017 | Sugihara | H01L 27/14636 |
| 2017/0045644 A1 | 2/2017 | Kageyama et al. | |
| 2018/0076252 A1* | 3/2018 | Togashi | H01L 27/14621 |
| 2018/0191879 A1* | 7/2018 | Evans, V | G02B 7/285 |
| 2018/0292578 A1 | 10/2018 | Kageyama et al. | |
| 2018/0367746 A1 | 12/2018 | Toda | |
| 2019/0041559 A1 | 2/2019 | Higashitani | |
| 2019/0096949 A1 | 3/2019 | Huang | |
| 2020/0105815 A1* | 4/2020 | Huang | H01L 23/552 |

FOREIGN PATENT DOCUMENTS

| | | |
|---|---|---|
| JP | 2017-112169 | 6/2017 |
| JP | 2017-208496 | 11/2017 |
| JP | 2019-009437 | 1/2019 |
| WO | WO 2017/138370 | 8/2017 |

\* cited by examiner

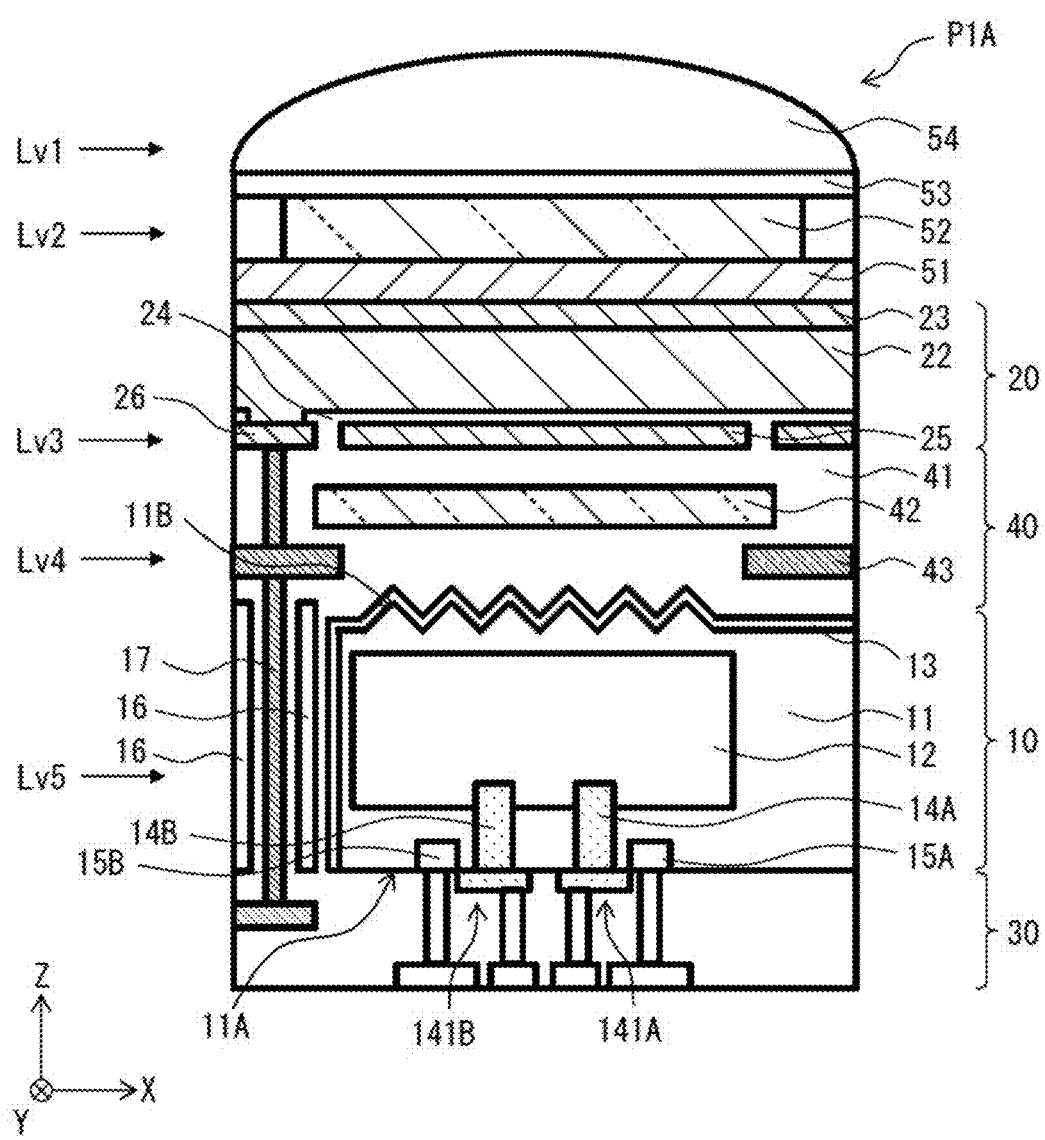

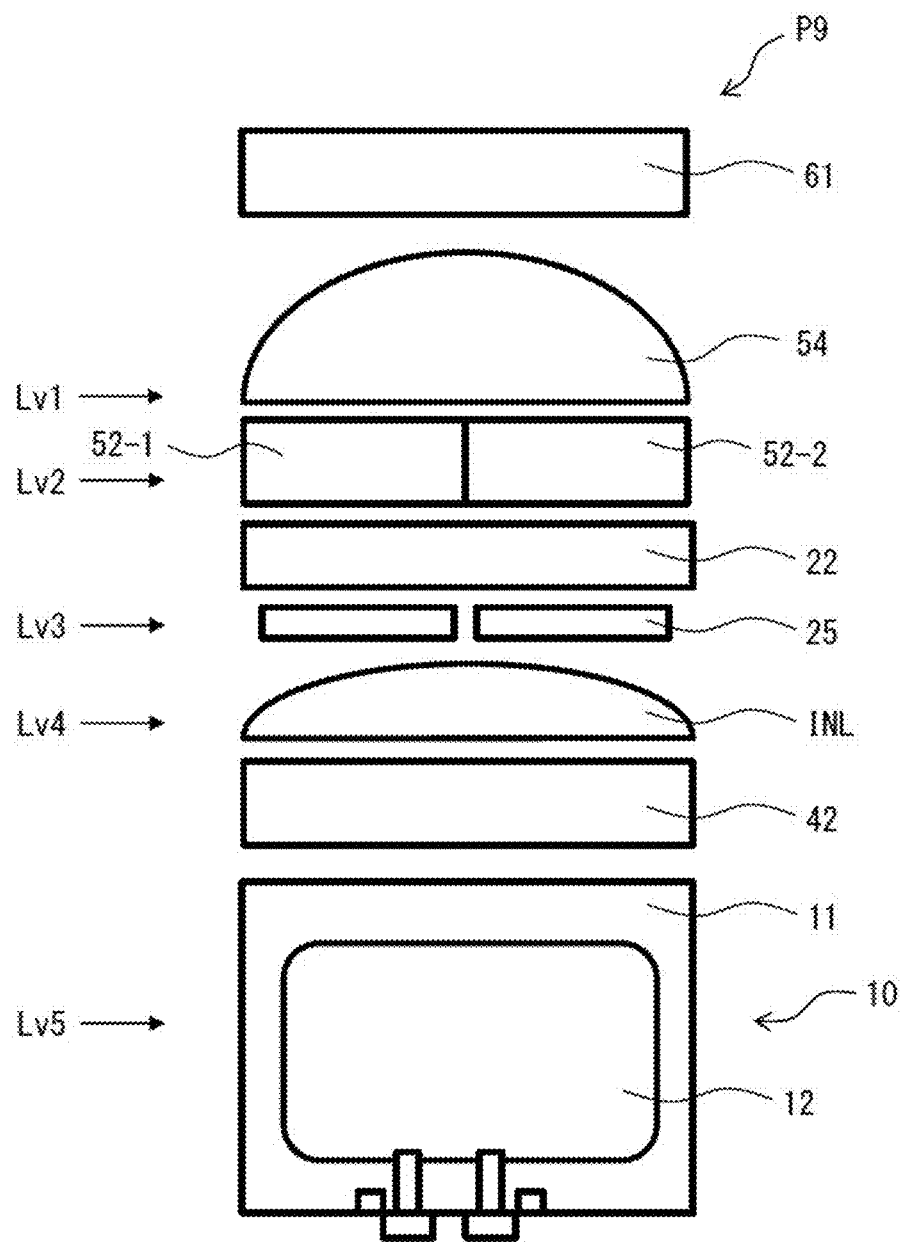

PHOTOELECTRIC CONVERSION ELEMENT, PHOTODETECTOR, PHOTODETECTION SYSTEM, ELECTRONIC APPARATUS, AND MOBILE BODY

CROSS REFERENCE TO RELATED APPLICATIONS

This application is a national stage application under 35 U.S.C. 371 and claims the benefit of PCT Application No. PCT/JP2020/023712 having an international filing date of 17 Jun. 2020, which designated the United States, which PCT application claimed the benefit of U.S. Provisional Patent Application No. 62/864,907 filed 21 Jun. 2019, the entire disclosures of each of which are incorporated herein by reference.

TECHNICAL FIELD

The present disclosure relates to a photoelectric conversion element that performs photoelectric conversion, and a photodetector, a photodetection system, an electronic apparatus, and a mobile body that each include the photoelectric conversion element.

BACKGROUND ART

There has been proposed a solid-state imaging device including a stacked structure of a first photoelectric conversion region that receives mainly visible light and photoelectrically converts the visible light and a second photoelectric conversion region that receives mainly infrared light and photoelectrically converts the infrared light (see PTL 1, for example).

CITATION LIST

Patent Literature

PTL 1: Japanese Unexamined Patent Application Publication No. 2017-208496

SUMMARY OF THE INVENTION

Incidentally, in a solid-state imaging device, functional improvement is desired.

It is therefore desirable to provide a highly functional photoelectric conversion element.

A photoelectric conversion element as an embodiment of the present disclosure includes: a semiconductor substrate; a first photoelectric converter that is provided on the semiconductor substrate, and detects light in a first wavelength range including a visible light range and photoelectrically converts the light; a second photoelectric converter that is provided at a position overlapping the first photoelectric converter in a thickness direction of the semiconductor substrate in the semiconductor substrate, and detects light in a second wavelength range including an infrared light range and photoelectrically converts the light; and an optical filter that is provided on side, opposite to the second photoelectric converter, of the first photoelectric converter, and allows light of a predetermined color component included in a predetermined wavelength range to pass therethrough. The first photoelectric converter includes a stacked structure and an electric charge accumulation electrode. The stacked structure includes a first electrode, a first photoelectric conversion layer, and a second electrode that are stacked in order, and the electric charge accumulation electrode is disposed to be separated from the first electrode and be opposed to the first photoelectric conversion layer with an insulating layer interposed therebetween.

BRIEF DESCRIPTION OF DRAWINGS

FIG. 2D is a schematic cross-sectional view of an example of a schematic configuration of an imaging element as a modification example applied to the pixel illustrated in FIG. 1.

FIG. 29 is a schematic cross-sectional view of an example of an imaging element according to a ninth embodiment of the present disclosure.

MODES FOR CARRYING OUT THE INVENTION

Figure 1:
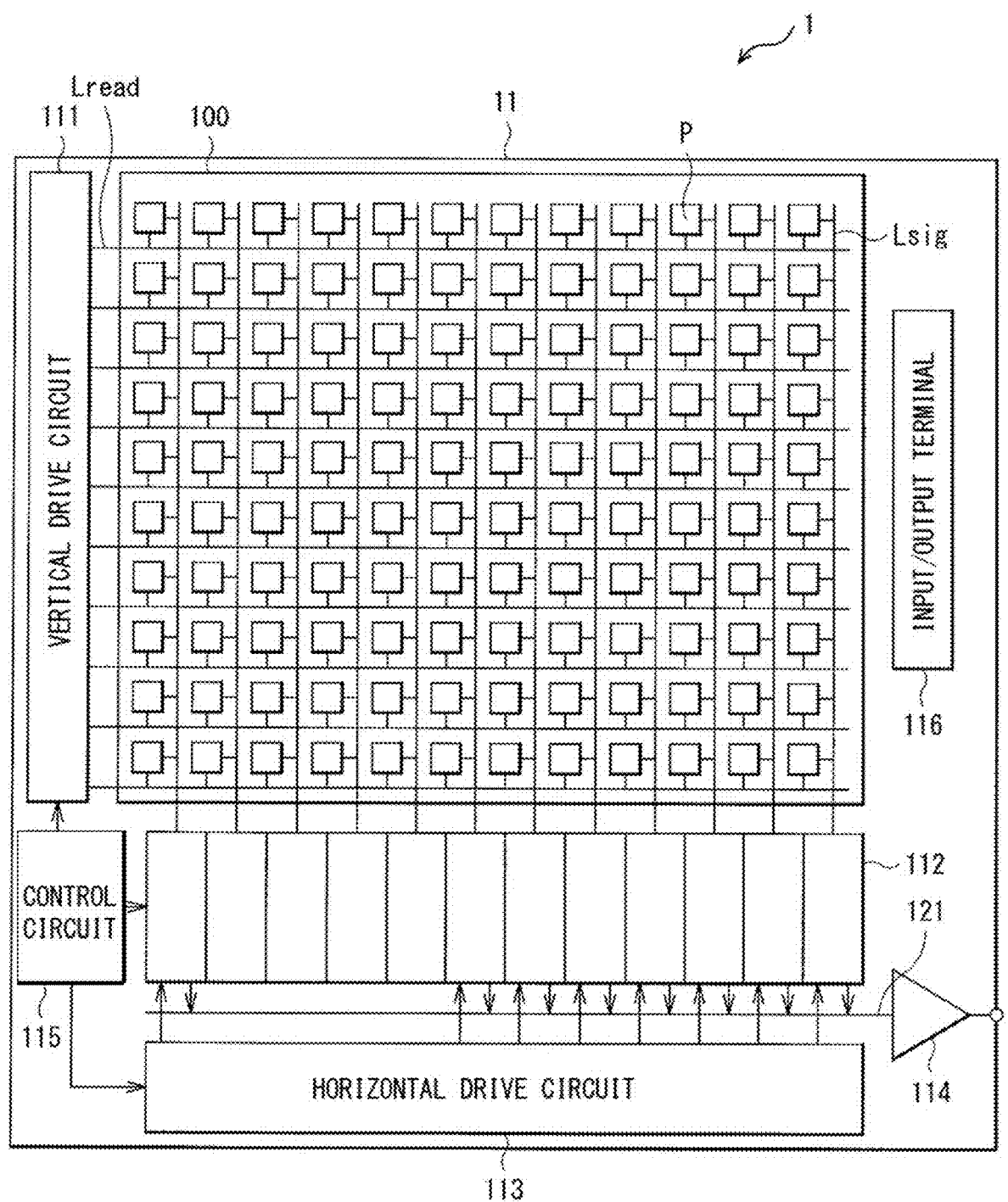
FIG. 1 is a schematic configuration diagram illustrating an example of a solid-state imaging device according to a first embodiment of the present disclosure.

Some embodiments of the present disclosure are described below in detail with reference to the drawings. It is to be noted that the description is given in the following order.

1. First Embodiment

An example of a solid-state imaging device including an organic photoelectric converter that obtains visible light image information and an iTOF sensor section that receives infrared light to obtain distance information 2. Second Embodiment An example of a solid-state imaging device in which four on-chip lenses, four color filters, and four electric charge accumulation electrodes are provided corresponding to one photoelectric converter 3. Third Embodiment An example of a solid-state imaging device in which sixteen on-chip lenses, sixteen color filters, and sixteen electric charge accumulation electrodes 25 are provided corresponding to one photoelectric converter 4. Fourth Embodiment An example of a solid-state imaging device in which four electric charge accumulation electrodes and four electric converters are provided corresponding to one on-chip lens and one color filter 5. Fifth Embodiment An example of a solid-state imaging device in which four electric charge accumulation electrodes are provided corresponding to one on-chip lens, one color filter, and one photoelectric converter 6. Sixth Embodiment An example of a solid-state imaging device in which four on-chip lenses, four color filters, and sixteen electric charge accumulation electrodes are provided corresponding to one photoelectric converter 7. Seventh Embodiment An example of a solid-state imaging device including an iTOF sensor section that includes an electric charge holding section 8. Eighth Embodiment An example of a solid-state imaging device further including a dual bandpass filter 9. Ninth Embodiment An example of a solid-state imaging device further including an inner lens or a light waveguide 10. Tenth Embodiment An example of a solid-state imaging device including a metal layer that shields surroundings of a through electrode 11. Eleventh Embodiment An example of a photodetection system including a light-emitting device and a photodetector 12. Application Example to Electronic Apparatus 13. Practical Application Example to In-vivo Information Acquisition System 14. Practical Application Example to Endoscopic Surgery System 15. Practical Application Example to Mobile Body 16. Other Modification Examples

1. First Embodiment

[Configuration of Solid-State Imaging Device 1]
(Overall Configuration Example)

FIG. 1 is an overall configuration example of a solid-state imaging device 1 according to an embodiment of the present disclosure. The solid-state imaging device 1 is, for example, a CMOS (Complementary Metal Oxide Semiconductor) image sensor. The solid-state imaging device 1 captures incident light (image light) from a subject through an optical lens system, converts the incident light of which an image is formed on an imaging plane into an electric signal on a pixel-by-pixel basis, and outputs the electric signal as a pixel signal. The solid-state imaging device 1 includes, for example, a pixel section 100 as an imaging region, a vertical drive circuit 111, and a column signal processing circuit 112, a horizontal drive circuit 113, an output circuit 114, a control circuit 115, and an input/output terminal 116, which are disposed in a peripheral region of the pixel section 100, on a semiconductor substrate 11, for example. The solid-state imaging device 1 is a specific example corresponding to a "photodetector" of the present disclosure.

The pixel section 100 includes, for example, a plurality of pixels P two-dimensionally arranged in a matrix. The pixel section 100 has, for example, a plurality of pixel rows each including a plurality of pixels P arranged in a horizontal direction (a lateral direction of a paper surface) and a plurality of pixel columns each including a plurality of pixels P arranged in a vertical direction (a longitudinal direction of the paper surface). In the pixel section 100, for example, one pixel drive line Lread (a row selection line and a reset control line) is wired with each pixel row, and one vertical signal line Lsig is wired with each pixel column. The pixel drive line Lread transmits a drive signal for signal reading from each pixel P. A plurality of pixel drive lines Lread each has one end coupled to a corresponding one of output terminals, corresponding to the respective pixel rows, of the vertical drive circuit 111.

The vertical drive circuit 111 includes a shift register, an address decoder, and the like, and is a pixel driving section that drives the respective pixels P in the pixel section 100 in pixel row units, for example. A signal outputted from each of the pixels P in a pixel row selected and scanned by the vertical drive circuit 111 is supplied to the column signal processing circuit 112 through a corresponding one of the vertical signal lines Lsig.

The column signal processing circuit 112 includes an amplifier, a horizontal selection switch, and the like provided for each of the vertical signal lines Lsig.

The horizontal drive circuit 113 includes a shift register, an address decoder, and the like, and drives respective horizontal selection switches of the column signal processing circuits 112 in sequence while scanning the horizontal selection switches. Such selective scanning by the horizontal drive circuit 113 causes the signals of the respective pixels P transmitted through a plurality of respective vertical signal lines Lsig to be outputted in sequence to a horizontal signal line 121 and be transmitted to outside of the semiconductor substrate 11 through the horizontal signal line 121.

The output circuit 114 performs signal processing on the signals supplied in sequence from the respective column signal processing circuits 112 through the horizontal signal line 121, and outputs the processed signals. The output circuit 114 may perform, for example, only buffering, or may perform black level adjustment, column variation correction, various kinds of digital signal processing, and the like.

Circuit components including the vertical drive circuit 111, the column signal processing circuit 112, the horizontal drive circuit 113, the horizontal signal line 121, and the output circuit 114 may be formed directly on the semiconductor substrate 11, or may be provided in an external control IC. Alternatively, these circuit components may be formed in another substrate coupled by a cable, or the like.

The control circuit 115 receives a clock given from the outside of the semiconductor substrate 11, or data or the like on instructions of operation modes, and also outputs data such as internal information of the pixel P that is an imaging element. The control circuit 115 further includes a timing generator that generates various timing signals, and controls driving of peripheral circuits such as the vertical drive circuit 111, the column signal processing circuit 112, and the horizontal drive circuit 113, on the basis of the various timing signals generated by the timing generator.

The input/output terminal 116 exchanges signals with the outside.

(Cross-Sectional Configuration Example of Pixel P)

Figure 2A:
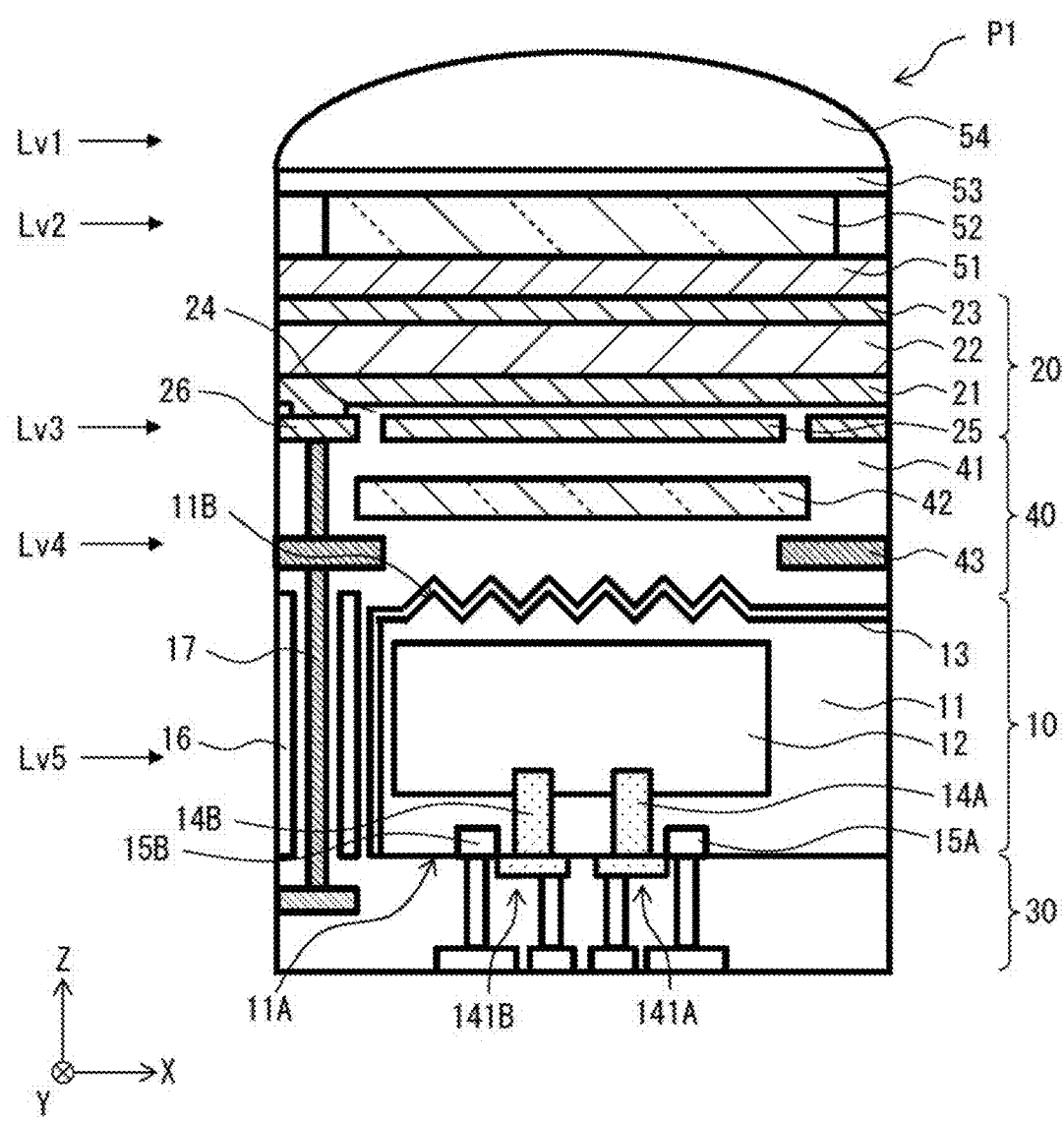
FIG. 2A is a schematic cross-sectional view of an example of a schematic configuration of an imaging element applied to a pixel illustrated in FIG. 1.

FIG. 2A schematically illustrates an example of a cross-sectional configuration of one pixel P1 of the plurality of pixels P arranged in a matrix in the pixel section 100.

As illustrated in FIG. 2, the pixel P1 is, for example, a so-called longitudinal spectral type imaging element including a structure in which one photoelectric converter 10 and one organic photoelectric converter 20 are stacked in a Z-axis direction that is a thickness direction. The pixel P1 that is an imaging element is a specific example corresponding to a "photoelectric conversion element" of the present disclosure. The pixel P1 further includes an intermediate layer 40 and a multilayer wiring layer 30. The intermediate layer 40 is provided between the photoelectric converter 10 and the organic photoelectric converter 20, and the multilayer wiring layer 30 is provided on side opposite to the organic photoelectric converter 20 as viewed from the photoelectric converter 10. Furthermore, for example, one sealing film 51, one color filter 52, one planarization film 53, and one on-chip lens 54 are stacked along the Z-axis direction in order from a position close to the organic photoelectric converter 20 on light incident side that is opposite to the photoelectric converter 10 as viewed from the organic photoelectric converter 20. It is to be noted that the sealing film 51 and the planarization film 53 may each be provided common to a plurality of pixels P.

(Photoelectric Converter 10)

The photoelectric converter 10 is, for example, an indirect TOF (hereinafter referred to as iTOF) sensor that obtains a distance image (distance information) by time of flight (Time-of-Flight; TOF). The photoelectric converter 10 includes, for example, the semiconductor substrate 11, the photoelectric conversion region 12, a fixed electric charge layer 13, a pair of gate electrodes 14A and 14B, electric charge-voltage converters (FDs) 15A and 15B that are floating diffusion regions, an inter-pixel region light-shielding wall 16, and a through electrode 17.

The semiconductor substrate 11 is, for example, an n-type silicon (Si) substrate having a front surface 11A and a back surface 11B, and includes a p-well in a predetermined region. The front surface 11A is opposed to the multilayer wiring layer 30. The back surface 11B is a surface opposed to the intermediate layer 40. It is preferable that a fine recessed and projected structure be formed on the back surface 11B, which is effective in confining infrared light incident on the semiconductor substrate 11 inside the semiconductor substrate 11. It is to be noted that a similar fine recessed and projected structure may be also formed on the front surface 11A.

The photoelectric conversion region 12 is, for example, a photoelectric conversion element including a PIN (Positive Intrinsic Negative) type photodiode (PD), and includes a pn junction formed in a predetermined region of the semiconductor substrate 11. The photoelectric conversion region 12 specifically detects and receives light having a wavelength in an infrared light range of light from a subject, generates electric charges corresponding to the amount of received light by photoelectric conversion, and accumulates the electric charges.

The fixed electric charge layer 13 is provided to cover the back surface 11B of the semiconductor substrate 11. The fixed electric charge layer 13 has, for example, negative fixed electric charges to suppress generation of a dark current caused by an interface state of the back surface 11B that is a light-receiving surface of the semiconductor substrate 11. A hole accumulation layer is formed in proximity to the back surface 11B of the semiconductor substrate 11 by an electric field induced by the fixed electric charge layer 13. The hole accumulation layer suppresses generation of electrons from the back surface 11B. It is to be noted that the fixed electric charge layer 13 also includes a portion extending in the Z-axis direction between the inter-pixel region light-shielding wall 16 and the photoelectric conversion region 12. The fixed electric charge layer 13 is preferably formed with use of an insulating material. Specific examples of a constituent material of the fixed electric charge layer 13 include hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide ($NdO_x$), promethium oxide ($PmO_x$), samarium oxide ($SmO_x$), europium oxide ($EuO_x$), gadolinium oxide ($GdO_x$), terbium oxide ($TbO_x$), dysprosium oxide ($DyO_x$), holmium oxide ($HoO_x$), thulium oxide ($TmO_x$), ytterbium oxide ($YbO_x$), lutetium oxide ($LuO_x$), yttrium oxide ($YO_x$), hafnium nitride ($HfN_x$), aluminum nitride ($AlN_x$), hafnium oxynitride ($HfO_xN_y$), aluminum oxynitride ($AlO_xN_y$), and the like.

The pair of gate electrodes 14A and 14B are respectively included in portions of transfer transistors (TG) 141A and 141B, and extend in the Z-axis direction from the front surface 11A to the photoelectric conversion region 12, for example. The TG 141A and the TG 141B respectively transfer electric charges accumulated in the photoelectric conversion region 12 to the pair of FDs 15A and 15D in accordance with a drive signal applied to the gate electrodes 14A and 14B.

Figure 3:
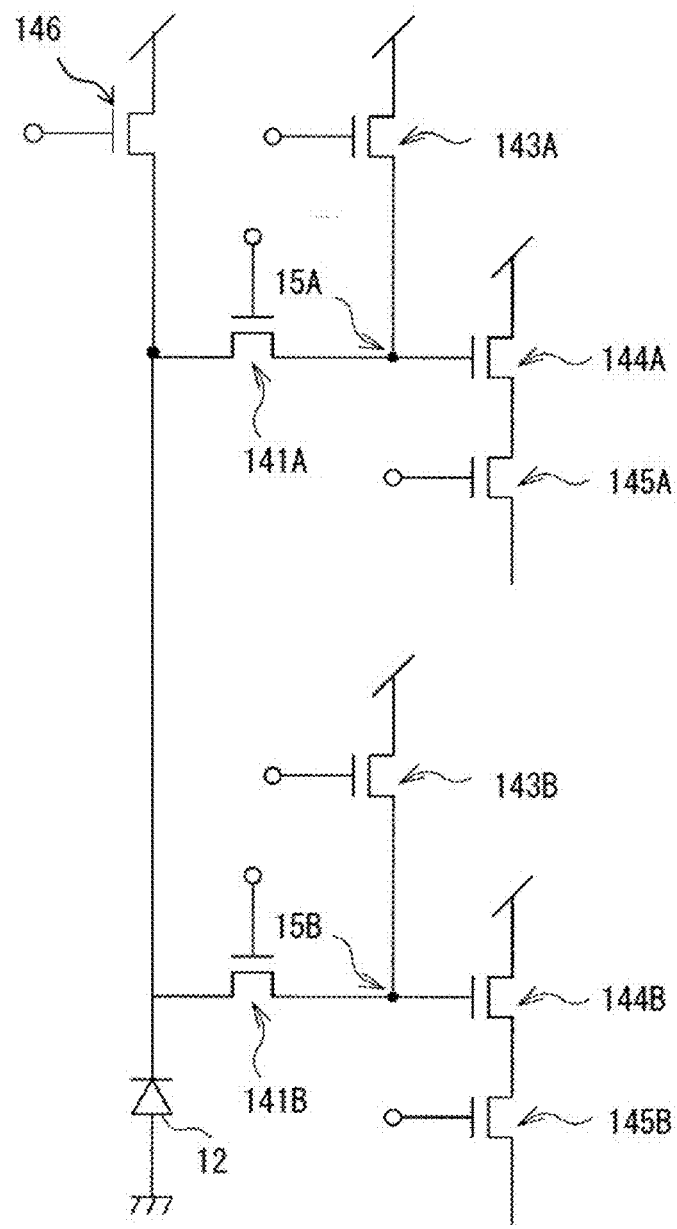
FIG. 3 is a circuit diagram illustrating an example of a readout circuit of an iTOF sensor section illustrated in FIG. 2A.

The pair of FDs 15A and 15B are respectively floating diffusion regions that convert electric charges transferred from the photoelectric conversion region 12 through the TGs 141A and 141B including the gate electrodes 14A and 14B into electric signals (e.g., voltage signals), and output the electric signals. The FDs 15A and 15B are respectively coupled to reset transistors (RSTs) 143A and 143B, and are respectively coupled to vertical signal line Lsig (FIG. 1) through amplification transistors (AMPs) 144A and 144B and selection transistors (SELs) 145A and 145B, as illustrated in FIG. 3 to be described later.

Figure 2B:
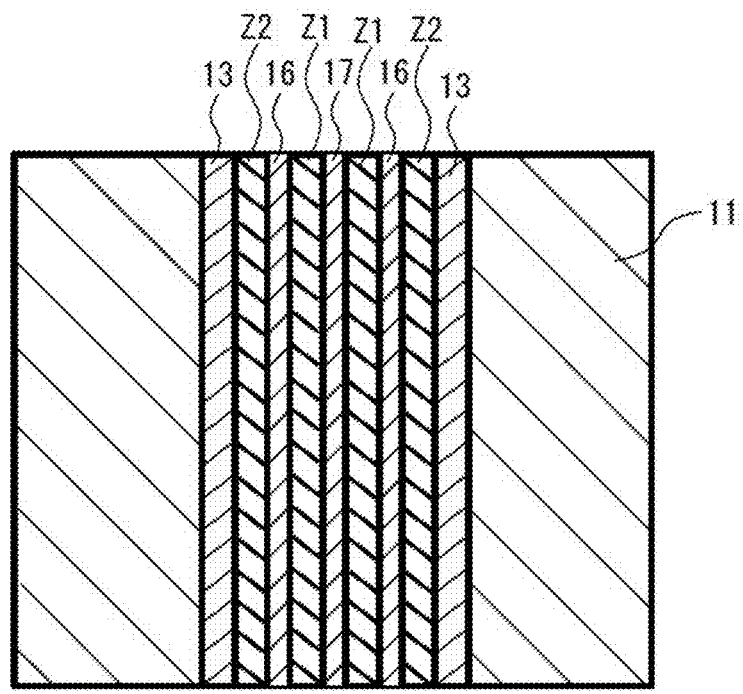
FIG. 2B is a schematic enlarged cross-sectional view of a through electrode and its surroundings illustrated in FIG. 2A.
Figure 2C:
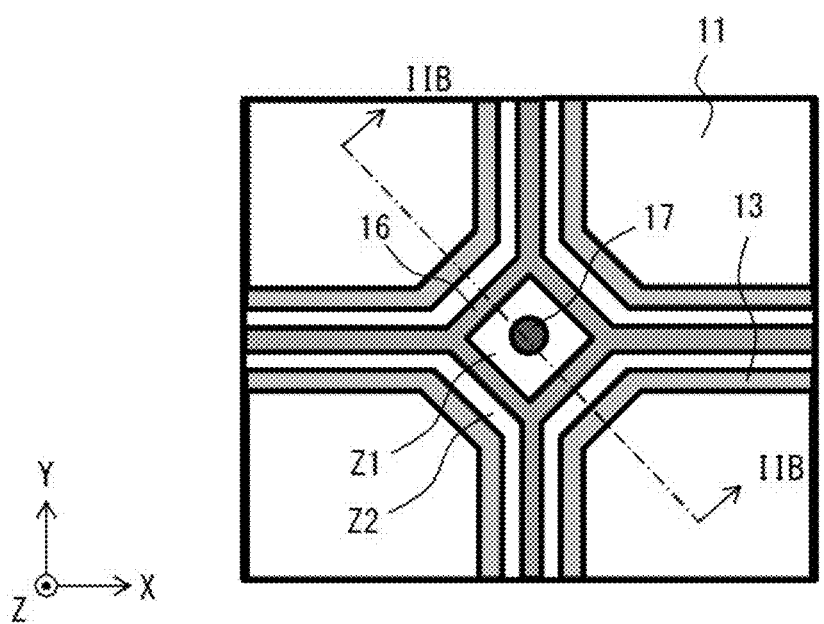
FIG. 2C is a schematic enlarged plan view of the through electrode and its surroundings illustrated in FIG. 2A.

FIG. 2B is an enlarged cross-sectional view taken along an Z axis of the inter-pixel region light-shielding wall 16 that surrounds the through electrode 17, and FIG. 2C is an enlarged cross-sectional view taken along an XY plane of the inter-pixel region light-shielding wall 16 that surrounds the through electrode 17. FIG. 2B illustrates a cross-section taken along a line IIB-IIB illustrated in FIG. 2C as viewed from the direction of an arrow. The inter-pixel region light-shielding wall 16 is provided in boundary portions with other adjacent pixels P in the XY plane. The inter-pixel region light-shielding wall 16 includes, for example, a portion extending along an XZ plane and a portion extending along a YZ plane, and is provided to surround the photoelectric conversion region 12 of each pixel P. In addition, the inter-pixel region light-shielding wall 16 may be provided to surround the through electrode 17. This makes it possible to suppress oblique incidence of unnecessary light onto the photoelectric conversion regions 12 of adjacent pixels P and prevent color mixture.

The inter-pixel region light-shielding wall 16 includes, for example, a material that includes at least one kind of elemental metals, metal alloys, metal nitrides, and metal silicides that have a light-shielding property. More specific constituent materials of the inter-pixel region light-shielding wall 16 include Al (aluminum), Cu (copper), Co (cobalt), W (tungsten), Ti (titanium), Ta (tantalum), Ni (nickel), Mo (molybdenum), Cr (chromium), Ir (iridium), platiniridium, TiN (titanium nitride), a tungsten-silicon compound, and the like. It is to be noted that the constituent materials of the inter-pixel region light-shielding wall 16 are not limited to metal materials, and the inter-pixel region light-shielding wall 16 may be formed with use of graphite. In addition, the inter-pixel region light-shielding wall 16 is not limited to an electrically conductive material, and may include an electrically non-conductive material having a light-shielding property such as an organic material. In addition, for example, an insulating layer Z1 including an insulating material such as SiOx (silicon oxide) and aluminum oxide may be provided between the inter-pixel region light-shielding wall 16 and the through electrode 17. Alternatively, a gap may be provided between the inter-pixel region light-shielding wall 16 and the through electrode 17 to insulate the inter-pixel region light-shielding wall 16 and the through electrode 17 from each other. It is to be noted that the insulating layer Z1 may not be provided in a case where the inter-pixel region light-shielding wall 16 includes an electrically non-conductive material. Furthermore, an insulating layer Z2 may be provided outside the inter-pixel region light-shielding wall 16, that is, between the inter-pixel region light-shielding wall 16 and the fixed electric charge layer 13. The insulating layer Z2 includes, for example, an insulating material such as SiOx (silicon oxide) and aluminum oxide. Alternatively, a gap may be provided between the inter-pixel region light-shielding wall 16 and the fixed electric charge layer 13 to insulate the inter-pixel region light-shielding wall 16 and the fixed electric charge layer 13 from each other. In a case where the inter-pixel region light-shielding wall 16 includes an electrically conductive material, electrical insulation between the inter-pixel region light-shielding wall 16 and the semiconductor substrate 11 is secured by the insulating layer Z2. In addition, in a case where the inter-pixel region light-shielding wall 16 is provided to surround the through electrode 17 and the inter-pixel region light-shielding wall 16 includes an electrically conductive material, electrical insulation between the inter-pixel region light-shielding wall 16 and the through electrode 17 is secured by the insulating layer Z1.

The through electrode 17 is, for example, a coupling member that electrically couples a readout electrode 26 of the organic photoelectric converter 20, which is provided on side of the back surface 11B of the semiconductor substrate 11, to an FD 131 and an AMP 133 (see FIG. 4 to be described later), which are provided on the front surface 11A of the semiconductor substrate 11. The through electrode 17 is, for example, a transmission path where signal electric charges generated in the organic photoelectric converter 20 are transmitted and a voltage that drives an electric charge accumulation electrode 25 is transmitted. For example, it is possible to provide the through electrode 17 to extend in the Z-axis direction from the readout electrode 26 of the organic photoelectric converter 20 to the multilayer wiring layer 30 through the semiconductor substrate 11. The through electrode 17 is able to favorably transfer signal electric charges generated in the organic photoelectric converter 20, which is provided on the side of the back surface 11B of the semiconductor substrate 11, to side of the front surface 11A of the semiconductor substrate 11. The fixed electric charge layer 13 and an insulating layer 41 are provided around the through electrode 17, which electrically insulates the through electrode 17 and a p-well region of the semiconductor substrate 11 from each other.

It is possible to form the through electrode 17 with use of one or more kinds of metal materials such as aluminum (Al), tungsten (W), titanium (Ti), cobalt (Co), platinum (Pt), palladium (Pd), copper (Cu), hafnium (Hf), and tantalum (Ta), in addition to a silicon material doped with an impurity such as PDAS (Phosphorus Doped Amorphous Silicon).

(Multilayer Wiring Layer 30)

The multilayer wiring layer 30 includes, for example, a readout circuit including the TGs 141A and 141B, the RSTs 143A and 143B, the AMPs 144A and 144B, the SELs 145A and 145B, and the like.

(Intermediate Layer 40)

The intermediate layer 40 may include, for example, the insulating layer 41, and an optical filter 42 and an inter-pixel region light-shielding film 43 that are embedded in the insulating layer 41. The insulating layer 41 includes, for example, a single-layer film including one kind of inorganic insulating materials such as silicon oxide ($SiO_x$), silicon nitride (SiNx), and silicon oxynitride (SiON), or a stacked film including two or more kinds of them. Furthermore, an organic insulating material such as polymethyl methacrylate (PMMA), polyvinyl phenol (PVP), polyvinyl alcohol (PVA), polyimide, polycarbonate (PC), polyethylene terephthalate (PET), polystyrene, N-2(aminoethyl)3-aminopropyltrimethoxysilane (AEAPTMS), 3-mercaptopropyl trimethoxysilane (MPTMS), tetraethoxysilane (TEOS), and octadecyltrichlorosilane (OTS) may be used as a material included in the insulating layer 41.

The optical filter 42 has a transmission band in an infrared light range (e.g., a wavelength of 880 nm to 1040 nm both inclusive) where photoelectric conversion is performed in the photoelectric conversion region 12. That is, light having a wavelength in the infrared light range passes through the optical filter 42 more easily than light having a wavelength in a visible light range (e.g., a wavelength of 400 nm to 700 nm both inclusive). Specifically, it is possible to configure the optical filter 42 with use of an organic material, for example, and the optical filter 42 absorbs at least a portion of light having a wavelength in the visible light range while selectively allowing light in the infrared light range to pass therethrough.

The inter-pixel region light-shielding film 43 is provided in boundary portions with other adjacent pixels P in the XY plane. The inter-pixel region light-shielding film 43 includes a portion extending along the XY plane, and is provided to surround the photoelectric conversion region 12 of each pixel P. The inter-pixel region light-shielding film 43 suppresses oblique incidence of unnecessary light onto the photoelectric conversion regions 12 of adjacent pixels P and prevents color mixture, as with the inter-pixel region light-shielding wall 16. It is to be noted that the inter-pixel region light-shielding film 43 may be provided as necessary; therefore, the pixel P1 may not include the inter-pixel region light-shielding film 43.

(Organic Photoelectric Converter 20)

The organic photoelectric converter 20 includes, for example, the readout electrode 26, a semiconductor layer 21, an organic photoelectric conversion layer 22, and an upper electrode 23 that are stacked in order from a position close to the photoelectric converter 10. The organic photoelectric converter 20 further includes an insulating layer 24 provided below the semiconductor layer 21, and the electric charge accumulation electrode 25 provided to be opposed to the semiconductor layer 21 with the insulating layer 24 interposed therebetween. The electric charge accumulation electrode 25 and the readout electrode 26 are separated from each other, and are provided at the same level, for example. The readout electrode 26 is in contact with an upper end of the through electrode 17. It is to be noted that the upper electrode 23, the organic photoelectric conversion layer 22, and the semiconductor layer 21 may each be provided common to some pixels P of the plurality of pixels P (FIG. 2A) in the pixel section 100, or may each be provided common to all the plurality of pixels P in the pixel section 100. The same applies to other embodiments, modification examples, and the like to be described after the present embodiment.

It is to be noted that another organic layer may be provided each between the organic photoelectric conversion layer 22 and the semiconductor layer 21 and between the organic photoelectric conversion layer 22 and the upper electrode 23.

The readout electrode 26, the upper electrode 23, and the electric charge accumulation electrode 25 each include an electrically conductive film having light transmissivity, and include, for example, ITO (indium tin oxide). However, in addition to ITO, a tin oxide (SnOx)-based material doped with a dopant, or a zinc oxide-based material obtained by doping zinc oxide (ZnO) with a dopant may be used as constituent materials of the readout electrode 26, the upper electrode 23, and the electric charge accumulation electrode 25. Examples of the zinc oxide-based material include aluminum zinc oxide (AZO) doped with aluminum (Al) as a dopant, gallium zinc oxide (GZO) doped with gallium (Ga), and indium zinc oxide (IZO) doped with indium (In). In addition, as the constituent materials of the readout electrode 26, the upper electrode 23, and the electric charge accumulation electrode 25, CuI, $InSbO_4$, ZnMgO, $CuInO_2$, $MgIN_2O_4$, CdO, $ZnSnO_3$, $TiO_2$, or the like may be used. Furthermore, a spinel oxide, an oxide having a $YbFe_2O_4$ structure may be used.

The organic photoelectric conversion layer 22 converts light energy into electrical energy, and is formed including two or more kinds of organic materials functioning as a p-type semiconductor and a n-type semiconductor. The p-type semiconductor relatively functions as an electron donor (a donor), and the n-type semiconductor relatively functions as an electron acceptor (an acceptor). The organic photoelectric conversion layer 22 has a bulk heterojunction structure in a layer. The bulk heterojunction structure is a p/n junction surface that is formed by mixing the p-type semiconductor and the n-type semiconductor, and excitons generated upon absorption of light are dissociated into electrons and holes at the p/n junction surface.

The organic photoelectric conversion layer 22 may further include, in addition to the p-type semiconductor and the n-type semiconductor, three kinds of so-called dye materials that photoelectrically convert light in a predetermined wavelength band while allowing light in another wavelength band to pass therethrough. The p-type semiconductor, the n-type semiconductor, and the dye materials preferably have absorption maximum wavelengths different from each other. This makes it possible to absorb wavelengths in a visible light region in a wide range.

For example, various kinds of organic semiconductor materials described above are mixed, and spin coating technology is used, thereby making it possible to form the organic photoelectric conversion layer 22. In addition, the organic photoelectric conversion layer 22 may be formed with use of a vacuum deposition method, printing technology, or the like, for example.

As a material included in the semiconductor layer 21, a material having a large band gap value (e.g., a band gap value of 3.0 eV or greater) and having higher mobility than a material included in the organic photoelectric conversion layer 22 is preferably used. Specific materials thereof may include organic semiconductor materials such as oxide semiconductor materials including IGZO and the like, transition metal dichalcogenide, silicon carbide, diamond, graphene, carbon nanotubes, a condensed polycyclic hydrocarbon compound, and a condensed heterocyclic compound.

The electric charge accumulation electrode 25 forms a kind of capacitor together with the insulating layer 24 and the semiconductor layer 21, and accumulates electric charges generated in the organic photoelectric conversion layer 22 in a portion of the semiconductor layer 21, e.g., a region portion, corresponding to the electric charge accumulation electrode 25 with the insulating layer 24 interposed therebetween, of the semiconductor layer 21. In the present embodiment, one electric charge accumulation electrode 25 is provided corresponding to one photoelectric conversion region 12, one color filter 52, and one on-chip lens 54. The electric charge accumulation electrode 25 is coupled to the vertical drive circuit 111, for example.

It is possible to form the insulating layer 24 with use of, for example, an inorganic insulating material and an organic insulating material, as with the insulating layer 41.

The organic photoelectric converter 20 detects some or all of the wavelengths in the visible light range, as described above. In addition, it is desirable that the organic photoelectric converter 20 not have sensitivity to the infrared light range.

In the organic photoelectric converter 20, light incident from side of the upper electrode 23 is absorbed by the organic photoelectric conversion layer 22. Excitons (electron-hole pairs) thereby generated move to an interface between the electron donor and the electron acceptor included in the organic photoelectric conversion layer 22, and the excitons are dissociated, that is, the excitons are dissociated into electrons and holes. Electric charges generated herein, that is, electrons and holes move to the upper electrode 23 or the semiconductor layer 21 by diffusion resulting from a difference in concentration between carriers and an internal electric field resulting from a potential difference between the upper electrode 23 and the electric charge accumulation electrode 25, and are detected as photocurrent. For example, it is assumed that the readout electrode 26 is a positive potential and the upper electrode 23 is a negative potential. In this case, holes generated by photoelectric conversion in the organic photoelectric conversion layer 22 move to the upper electrode 23. Electrons generated by photoelectric conversion in the organic photoelectric conversion layer 22 are drawn to the electric charge accumulation electrode 25, and are accumulated in the portion of the semiconductor layer 21, e.g., the region portion, corresponding to the electric charge accumulation electrode 25 with the insulating layer 24 interposed therebetween, of the semiconductor layer 21.

Electric charges (e.g., electrons) accumulated in the region portion, corresponding to the electric charge accumulation electrode 25 with the insulating layer 24 interposed therebetween, of the semiconductor layer 21 are read out as follows. Specifically, a potential V26 is applied to the readout electrode 26, and a potential V25 is applied to the electric charge accumulation electrode 25. Herein, the potential V26 is higher than the potential V25 (V25<V26). By doing so, the electrons accumulated in the region portion, corresponding to the electric charge accumulation electrode 25, of the semiconductor layer 21 are transferred to the readout electrode 26.

As described above, the semiconductor layer 21 is provided below the organic photoelectric conversion layer 22, and electric charges (e.g., electrons) are accumulated in the region portion, corresponding to the electric charge accumulation electrode 25 with the insulating layer 24 interposed therebetween, of the semiconductor layer 21, thereby achieving the following effects. That is, as compared with a case where electric charges (e.g., electrons) are accumulated in the organic photoelectric conversion layer 22 without providing the semiconductor layer 21, it is possible to prevent recombination of holes and electrons during electric charge accumulation, and increase transfer efficiency of accumulated electric charges (e.g., electrons) to the readout electrode 26, and it is possible to suppress generation of a dark current. A case where electrons are read out is described above as an example; however, holes may be read out. In a case where holes are read out, the potentials described above are described as potentials sensed by holes.

(Readout Circuit of Photoelectric Converter 10)

FIG. 3 is a circuit diagram illustrating an example of a readout circuit of the photoelectric converter 10 included in the pixel P illustrated in FIG. 2A.

The readout circuit of the photoelectric converter 10 includes, for example, the TGs 141A and 141B, an OFG 146, the FDs 15A and 15B, the RSTs 143A and 143B, the AMPS 144A and 144B, and the SELs 145A and 145B.

The TGs 141A and 141B are respectively coupled between the photoelectric conversion region 12 and the FD 15A and between the photoelectric conversion region 12 and the FD 15B. A drive signal is applied to the gate electrodes 14A and 14B of the TGs 141A and 141B to turn the TGs 141A and 141B to an active state, which turns transfer gates of the TGs 141A and 141B to an electrically conductive state. As a result, signal electric charges converted in the photoelectric conversion region 12 are transferred to the FDs 15A and 15B respectively through the TGs 141A and 141B.

The OFG 146 is coupled between the photoelectric conversion region 12 and a power supply. A drive signal is applied to a gate electrode of the OFG 146 to turn the OFG 146 to the active state, which turns the OFG 146 to the electrically conductive state. As a result, signal electric charges converted in the photoelectric conversion region 12 are discharged to the power supply through the OFG 146.

The FDs 15A and 15B are respectively coupled between the TG 141A and AMP 144A and between the TG 141B and the AMP 144B. The FDs 15A and 15B respectively perform electric charge-voltage conversion of the signal electric charges transferred from the TGs 141A and 141B into voltage signals, and output the voltage signals to the AMPs 144A and 144B.

The RSTs 143A and 143B are respectively coupled between the FD 15A and the power supply and between the FD 15B and the power supply. A drive signal is applied to gate electrodes of the RSTs 143A and 143B to turn the RSTs 143A and 143B to the active state, which turns reset gates of the RSTs 143A and 143B to the electrically conductive state. As a result, potentials of the FDs 15A and 15B are reset to a power supply level.

The AMPs 144A and 144B respectively include gate electrodes coupled to the FDs 15A and 15B, and include drain electrodes coupled to the power supply. The AMPs 144A and 144B are input sections of readout circuits of voltage signals held by the FDs 15A and 15B, that is, so-called source follower circuits. That is, the AMPs 144A and 144B respectively have source electrodes coupled to the vertical signal line Lsig through the SELs 145A and 145B, thereby configuring source follower circuits with a constant current source coupled to one end of the vertical signal line Lsig.

The SELs 145A and 145B are respectively coupled between the source electrode of the AMP 144A and the vertical signal line Lsig and between the source electrode of the AMP 144B and the vertical signal line Lsig. A drive signal is applied to the respective gate electrodes of the SELs 145A and 145B to turn the SELs 145A and 145B to the active state, which turns the SELs 145A and 145B to the electrically conductive state to turn the pixel P to a selection state. Accordingly, readout signals (pixel signals) outputted from the AMPs 144A and 144B are respectively outputted to the vertical signal line Lsig through the SELs 145A and 145B.

In the solid-state imaging device 1, a light pulse in an infrared range is applied to a subject, and the photoelectric conversion region 12 of the photoelectric converter 10 receives the light pulse reflected from the subject. In the photoelectric conversion region 12, a plurality of electric charges are generated by incidence of the light pulse in the infrared range. The plurality of electric charges generated in the photoelectric conversion region 12 are alternately distributed to the FD 15A and the FD 15B by alternately supplying a drive signal to the pair of gate electrodes 14A and 14B over equal time intervals. A shutter phase of the drive signal to be applied to the gate electrodes 14A and 14B is changed with respect to the light pulse to be applied, which causes the amount of electric charges accumulated in the FD 15A and the amount of electric charges accumulated in the FD 15B to be phase-modulated values. A round trip time of the light pulse is estimated by demodulating these values, thereby determining a distance between the solid-state imaging device 1 and the subject.

(Readout Circuit of Organic Photoelectric Converter 20)

Figure 4:
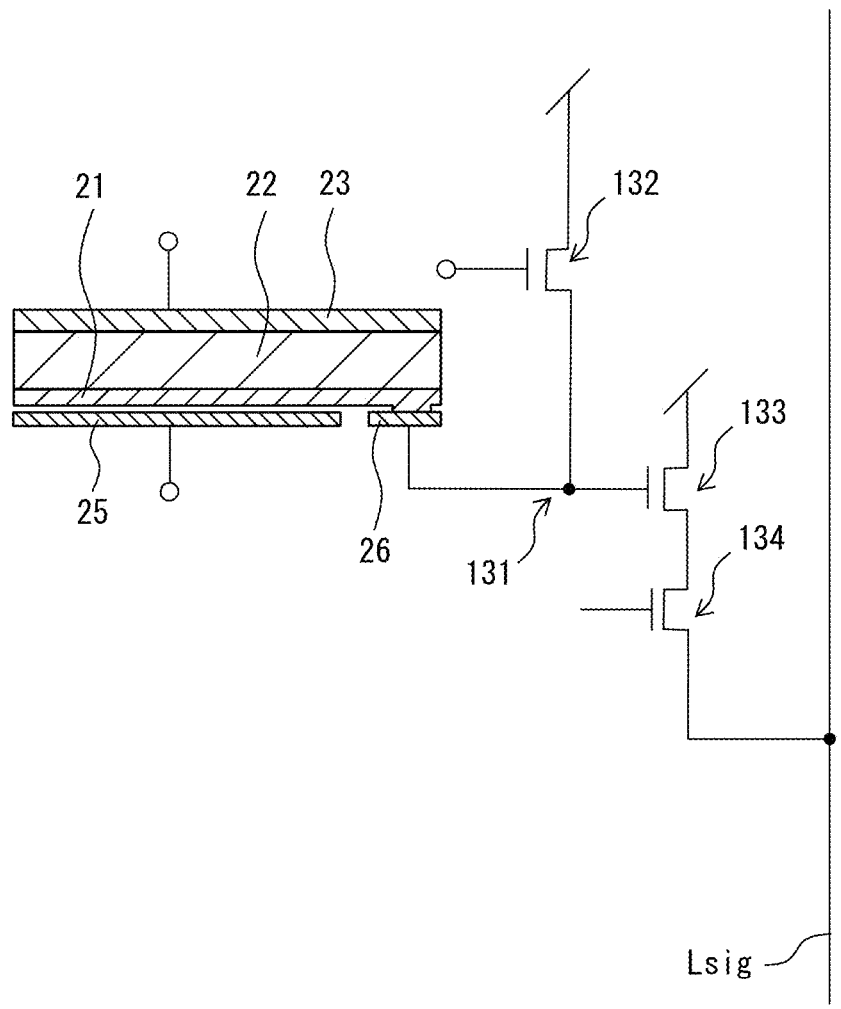
FIG. 4 is a circuit diagram illustrating an example of a readout circuit of an organic photoelectric converter illustrated in FIG. 2A.

FIG. 4 is a circuit diagram illustrating an example of the readout circuit of the organic photoelectric converter 20 included in the pixel P1 illustrated in FIG. 2A.

The readout circuit of the organic photoelectric converter 20 includes, for example, the FD 131, a RST 132, the AMP 133, and a SEL 134.

The FD 131 is coupled between the readout electrode 26 and the AMP 133. The FD 131 performs electric charge-voltage conversion of signal electric charges transferred from the readout electrode 26 into voltage signals, and outputs the voltage signals to the AMP 133.

The RST 132 is coupled between the FD 131 and the power supply. A drive signal is applied to a gate electrode of the RST 132 to turn the RST 132 to the active state, which turns a reset gate of the RST 132 to the electrically conductive state. As a result, a potential of the FD 131 is reset to the power supply level.

The AMP 133 includes a gate electrode coupled to the FD 131 and a drain electrode coupled to the power supply. A source electrode of the AMP 133 is coupled to the vertical signal line Lsig through the SEL 134.

The SEL 134 is coupled between the source electrode of the AMP 133 and the vertical signal line Lsig. A drive signal is applied to a gate electrode of the SEL 134 to turn the SEL 134 to the active state, which turns the SEL 134 to the electrically conductive state to turn the pixel P1 to the selection state. Thus, a readout signal (a pixel signal) outputted from the AMP 133 is outputted to the vertical signal line Lsig through the SEL 134.

(Planar Configuration Example of Pixel P1)

Figure 5:
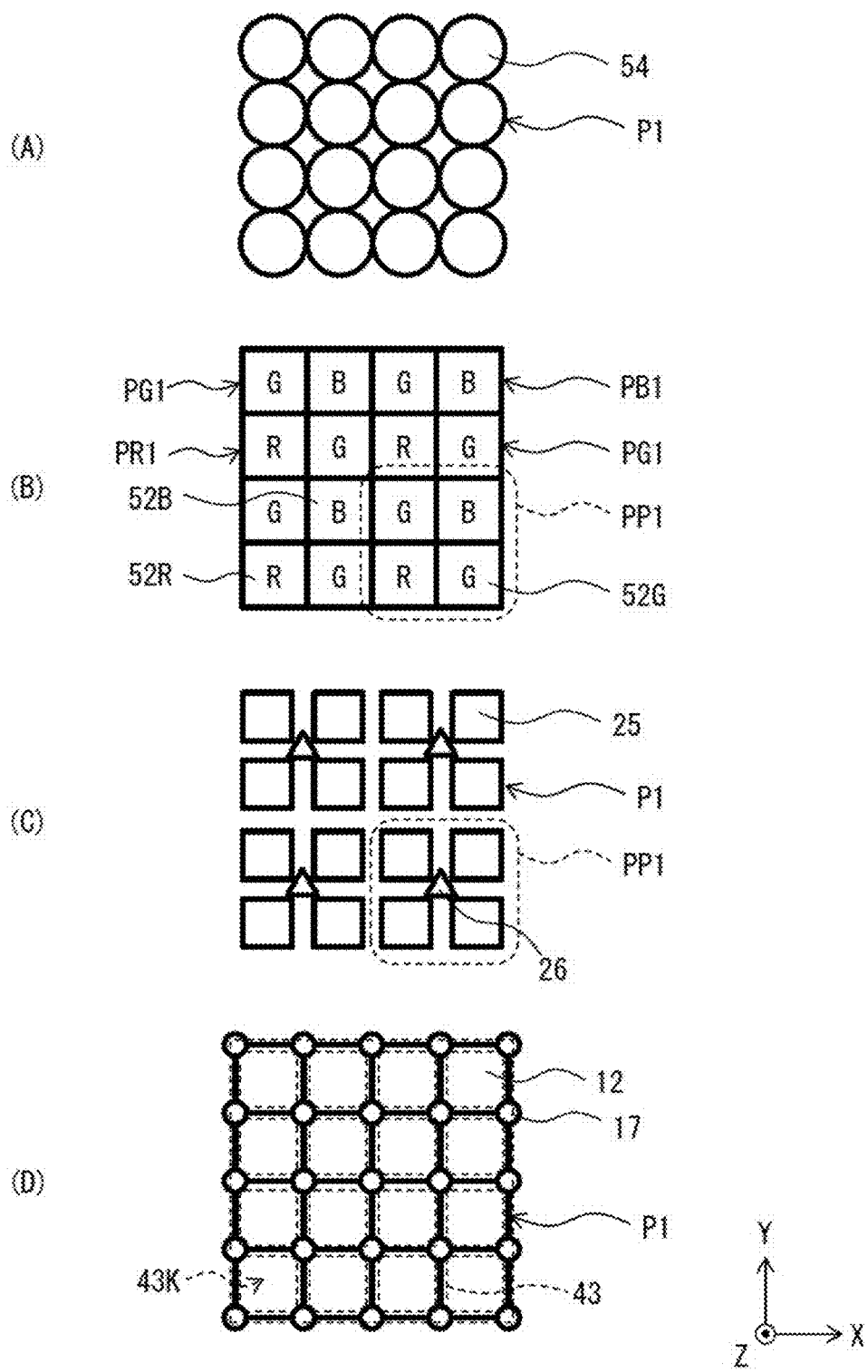
FIG. 5 is a schematic view of an example of an arrangement state of a plurality of pixels in a pixel section illustrated in FIG. 1.

FIG. 5 schematically illustrates an example of an arrangement state of the plurality of pixels P1 in the pixel section 100. (A) to (D) of FIG. 5 respectively illustrate arrangement states at height positions corresponding to levels Lv1 to Lv3 and Lv5 in the Z-axis direction illustrated in FIG. 2A. That is, (A) of FIG. 5 illustrates an arrangement state of the on-chip lenses 54 in the XY plane, (B) of FIG. 5 illustrates an arrangement state of the color filters 52 in the XY plane, (C) of FIG. 5 illustrates an arrangement state of the electric charge accumulation electrodes 25 and the readout electrodes 26 in the XY plane, and (D) of FIG. 5 illustrates an arrangement state of the photoelectric conversion regions 12 and the through electrodes 17 in the XY plane. In (D) of FIG. 5, a planar shape of the inter-pixel region light-shielding film

43 at a height position corresponding to a level Lv4 is illustrated by a broken line. As illustrated in (A) to (D) of FIG. 5, in the pixel section 100, one on-chip lens 54, one color filter 52, one electric charge accumulation electrode 25, and one photoelectric conversion region 12 are provided at positions corresponding to each other in the Z-axis direction. The positions corresponding to each other herein are, for example, positions overlapping each other in the Z-axis direction. Alternatively, the positions are not limited thereto, and it is sufficient if light incident on one on-chip lens 54 sequentially enters one color filter 52, the organic photoelectric converter 20 provided common to a plurality of pixels P1, and one photoelectric conversion region 12, and electric charges generated by photoelectric conversion in the organic photoelectric converter 20 are drawn to one electric charge accumulation electrode 25 to be accumulated in the portion of the semiconductor layer 21, e.g., the region portion, corresponding to the electric charge accumulation electrode 25 with the insulating layer 24 interposed therebetween, of the semiconductor layer 21. In addition, in a case where one on-chip lens 54, one color filter 52, one electric charge accumulation electrode 25 and one photoelectric conversion region 12 are provided at positions overlapping each other in the Z-axis direction, central positions thereof may or may not coincide with each other. It is to be noted that FIG. 5 illustrates a planar configuration example of a total of sixteen pixels P1 arranged four by four in an X-axis direction and a Y-axis direction; however, in the pixel section 100, for example, a plurality of groups of these sixteen pixels P1 is arranged in both the X-axis direction and the Y-axis direction.

In the example in FIG. 5, as illustrated in (B), one red pixel PR1 that includes a red color filter 52R and receives red light, one blue pixel PB1 that includes a blue color filter 52B and receives blue light, and two green pixels PG1 that each include a green color filter 52G and receive green light are included in one pixel group PP1. The arrangement state of a plurality of pixels P illustrated in (B) of FIG. 5 is a so-called Bayer arrangement. The red pixels PR1 are alternately arranged in the X-axis direction and the Y-axis direction. The blue pixels PB1 are alternately arranged in the X-axis direction and the Y-axis direction, and are positioned in an oblique direction with respect to the red pixels PR1. The green pixels PG1 are arranged to fill in gaps between the red pixels PR1 and the blue pixels PB1. It is to be noted that FIG. 5 is an example, and the arrangement state of the plurality of pixels P1 in the pixel section 100 of the present disclosure is not limited thereto.

As illustrated in (C) of FIG. 5, the readout electrodes 26 are provided, one for each pixel group PP1. Specifically, one readout electrode 26 is disposed in a gap around the middle of four electric charge accumulation electrodes 25 in one pixel group PP1. It is to be noted that FIG. 5 is an example, and the arrangement positions of the readout electrodes 26 in the pixel section 100 of the present disclosure are not limited thereto. In the example in FIG. 5, the readout electrode 26 is provided in the middle of four pixels P included in one pixel group PP1, which causes distances from the respective electric charge accumulation electrodes 25 of the four pixels P to the readout electrode 26 to be substantially equal to each other. This is suitable for sharing the readout electrode 26 by adjacent pixels P.

Figure 6:
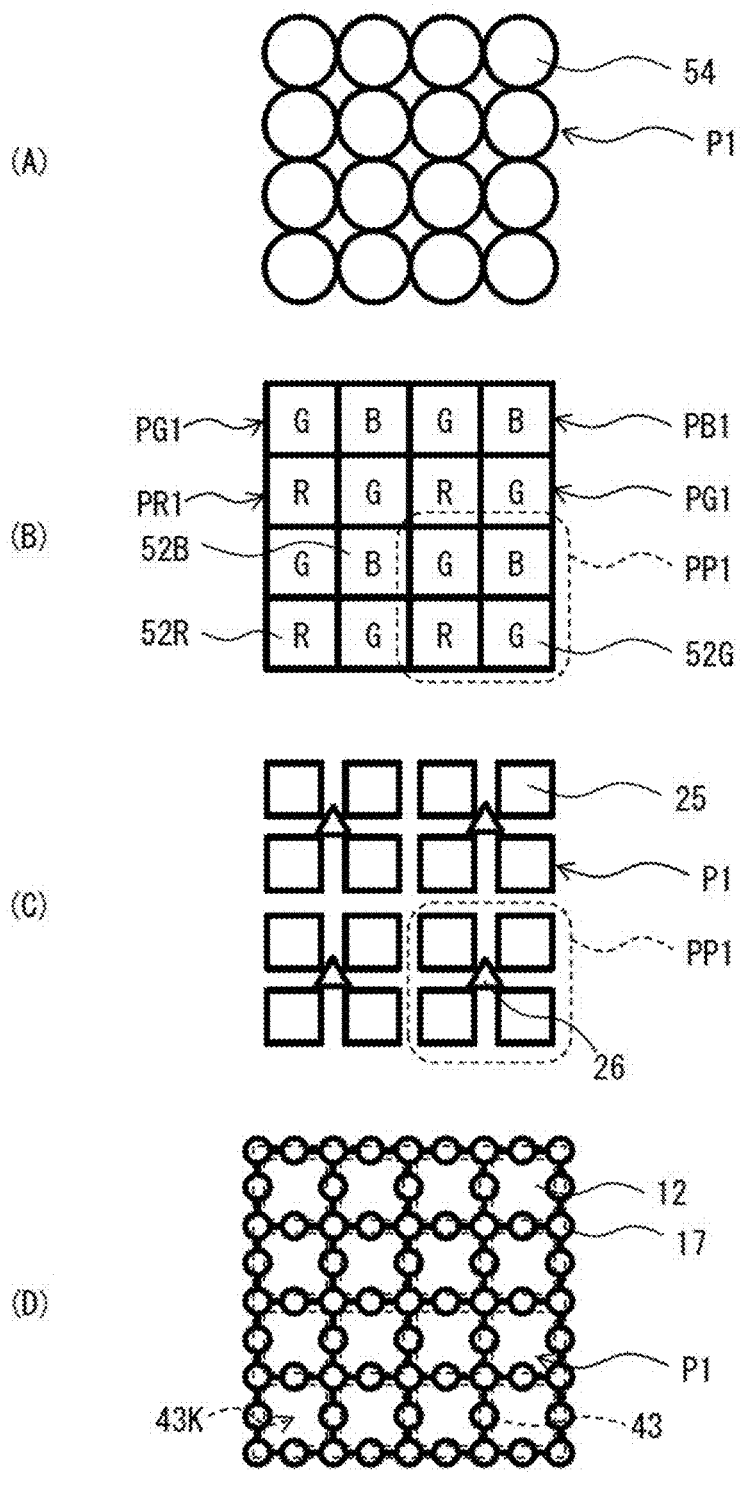
FIG. 6 is a schematic view of a modification example of the arrangement state of the plurality of pixels illustrated in FIG. 5.

As illustrated in (D) of FIG. 5, the through electrodes 17 are provided, one for each pixel P. Specifically, one through electrode 17 is disposed in a gap around four corners of the photoelectric conversion regions 12 in respective pixels P. The through electrodes 17 are disposed around the corners of the photoelectric conversion regions 12 in such a manner, which makes it possible to further increase areas of the photoelectric conversion regions 12. It is to be noted that FIG. 5 is an example, and the arrangement positions of the through electrodes 17 in the pixel section 100 of the present disclosure are not limited thereto. For example, as illustrated in FIG. 6, the through electrodes 17 may be further disposed in proximity to boundaries between adjacent photoelectric conversion regions 12 at midpoints of four corners in each of the photoelectric conversion regions 12. FIG. 6 schematically illustrates a modification example of the arrangement state of the plurality of pixels P1 in the pixel section 100 illustrated in FIG. 1. As illustrated in (D) of FIG. 5 and (D) of FIG. 6, it is preferable that the through electrodes 17 and the readout electrodes 26 be provided at positions not overlapping vicinities of centers of the on-chip lenses 54 in the Z-axis direction. This makes it possible to increase the light amount of infrared light that is able to enter the photoelectric conversion regions 12, and is advantageous to improve infrared light detection sensitivity in each pixel P1. It is to be noted that the present disclosure is not limited to forms illustrated in FIGS. 5 and 6. For example, the through electrodes 17 may be disposed only at midpoints of four corners in the photoelectric conversion regions 12 without disposing the through electrodes 17 at four corners in the photoelectric conversion regions 12. In addition, a plurality of through electrodes 17 are disposed as symmetrical as possible in a plane orthogonal to the Z axis with respect to the photoelectric conversion region 12 in each pixel P, which improves optical characteristics in the photoelectric conversion region 12. That is, this improves uniformity of photoelectric conversion characteristics in the plane orthogonal to the Z axis in the photoelectric conversion region 12 in a case where the photoelectric conversion region 12 receives obliquely incident light, for example.

As illustrated in (D) of FIG. 5 and (D) of FIG. 6, the inter-pixel region light-shielding film 43 is provided in boundary portions with other adjacent pixels P1 in the XY plane to form a grid pattern as a whole. The inter-pixel region light-shielding film 43 is provided to surround the photoelectric conversion region 12 of each pixel P1, and includes a plurality of opening portions 43K. As described above, the inter-pixel region light-shielding film 43 suppresses oblique incidence of unnecessary light onto the photoelectric conversion regions 12 of adjacent pixels P1, and prevents color mixture. Herein, the central position of each of the opening portions 43K in the inter-pixel region light-shielding film 43 may be shifted from the central position of a corresponding one of the pixels P1. One reason for this is to reduce variations in detection characteristics of the plurality of pixels P1 arranged in the pixel section 100, e.g., to prevent a decrease in detection sensitivity of the pixels P1 arranged in a peripheral portion of the pixel section 100. In this case, the shift amount of the central position of each of the opening portions 43K with respect to the central position of a corresponding one of the pixels P1 may be increased from the center of the pixel section 100 to the peripheral portion of the pixel section 100. In particular, the shift amount may be nonlinearly changed from the center of the pixel section 100 to the peripheral portion of the pixel section 100. Doing so makes it possible to further improve shading characteristics at an end portion of the pixel section 100.

Furthermore, a spacing between adjacent pixels P1 may be increased from the center of the pixel section 100 to the peripheral portion of the pixel section 100. In particular, it is preferable that the spacing be nonlinearly changed from the center of the pixel section 100 to the peripheral portion of the pixel section 100. Doing so makes it possible to perform pupil correction in accordance with each image height in the plurality of pixels P1 arranged in the pixel section 100, for example.

[Workings and Effects of Solid-State Imaging Device 1]

The solid-state imaging device 1 according to the present embodiment includes the organic photoelectric converter 20, the optical filter 42, and the photoelectric converter 10 that are stacked in order from incident side. The organic photoelectric converter 20 detects light having a wavelength in the visible light range and photoelectrically convert the light. The optical filter 42 has a transmission band in the infrared light range. The photoelectric converter 10 detects light having a wavelength in the infrared light range and photoelectrically converts the light. This makes it possible to simultaneously obtain a visible light image and an infrared light image at the same position in an in-plane direction of the XY plane. The visible light image is configured by a red light signal, a green light signal, and a blue light signal respectively obtained from the red pixel PR, the green pixel PG, and the blue pixel PB, and the infrared light image uses infrared light signals obtained from all the plurality of pixels P. It is therefore possible to achieve high integration in the in-plane direction of the XY plane.

Furthermore, the photoelectric converter 10 includes the pair of gate electrodes 14A and 14B, and the FDs 15A and 15B, which makes it possible to obtain an infrared light image as a distance image including information about a distance to a subject. Therefore, according to the solid-state imaging device 1 according to the present embodiment, it is possible to obtain both a visible light image having high resolution and an infrared light image having depth information.

In the present embodiment, the organic photoelectric converter 20 includes the insulating layer 24 and the electric charge accumulation electrode 25, in addition to the structure in which the readout electrode 26, the semiconductor layer 21, the organic photoelectric conversion layer 22, and the upper electrode 23 are stacked in order. The insulating layer 24 is provided below the semiconductor layer 21, and the electric charge accumulation electrode 25 is provided to be opposed to the semiconductor layer 21 with the insulating layer 24 interposed therebetween. This makes it possible to accumulate electric charges generated by photoelectric conversion in the organic photoelectric conversion layer 22 in the portion of the semiconductor layer 21, e.g., the region portion, corresponding to the electric charge accumulation electrode 25 with the insulating layer 24 interposed therebetween, of the semiconductor layer 21. This makes it possible to achieve removal of electric charges in the semiconductor layer 21, that is, full depletion of the semiconductor layer 21 upon start of exposure, for example. As a result, it is possible to reduce kTC noise, which makes it possible to suppress a decrease in image quality caused by random noise. Furthermore, as compared with a case where electric charges (e.g., electrons) are accumulated in the organic photoelectric conversion layer 22 without providing the semiconductor layer 21, it is possible to prevent recombination of holes and electrons during electric charge accumulation, and increase transfer efficiency of accumulated electric charges (e.g., electrons) to the readout electrode 26, and it is possible to suppress generation of a dark current.

It is to be noted that in the present disclosure, as with a pixel P1A illustrated in FIG. 2D, the semiconductor layer 21 may not be provided. In the pixel P1A illustrated in FIG. 2D, the organic photoelectric conversion layer 22 is coupled to the readout electrode 26, and the electric charge accumulation electrode 25 is provided to be opposed to the organic photoelectric conversion layer 22 with the insulating layer 24 interposed therebetween. In a case of such a configuration, electric charges generated by photoelectric conversion in the organic photoelectric conversion layer 22 are accumulated in the organic photoelectric conversion layer 22. Even in this case, upon photoelectric conversion in the organic photoelectric conversion layer 22, a kind of capacitor is formed by the organic photoelectric conversion layer 22, the insulating layer 24, and the electric charge accumulation electrode 25. This makes it possible to achieve removal of electric charges in the organic photoelectric conversion layer 22, that is, full depletion of the organic photoelectric conversion layer 22 upon start of exposure, for example. As a result, it is possible to reduce kTC noise, which makes it possible to suppress a decrease in image quality caused by random noise.

In addition, in the present embodiment, one on-chip lens 54, one color filter 52, one electric charge accumulation electrode 25, and one photoelectric conversion region 12 are provided at positions corresponding to each other in the Z-axis direction in the pixel section 100. This makes it possible to obtain an infrared light signal at a position corresponding to each of the red pixel PR1, the green pixel PG1, and the blue pixel PB1. Accordingly, in the pixel P1 according to the present embodiment, an infrared light image having high resolution is obtained, as compared with a pixel P2 according to a second embodiment to be described later and a pixel P3 according to a third embodiment to be described later.

It is to be noted that in the present embodiment, the red color filter 52R, the green color filter 52G, and the blue color filter 52B are included, and respectively receive red light, green light, and blue light to obtain a color visible light image; however, a monochromatic visible light image may be obtained without providing the color filter 52.

In addition, in the present embodiment, the through electrodes 17 and the readout electrodes 26 are provided at positions not overlapping vicinities of the centers of the on-chip lenses 52 in the Z-axis direction, which makes it possible to improve infrared light detection sensitivity in each pixel P1.

2. Second Embodiment

[Configuration of Pixel P2]

Figure 7:
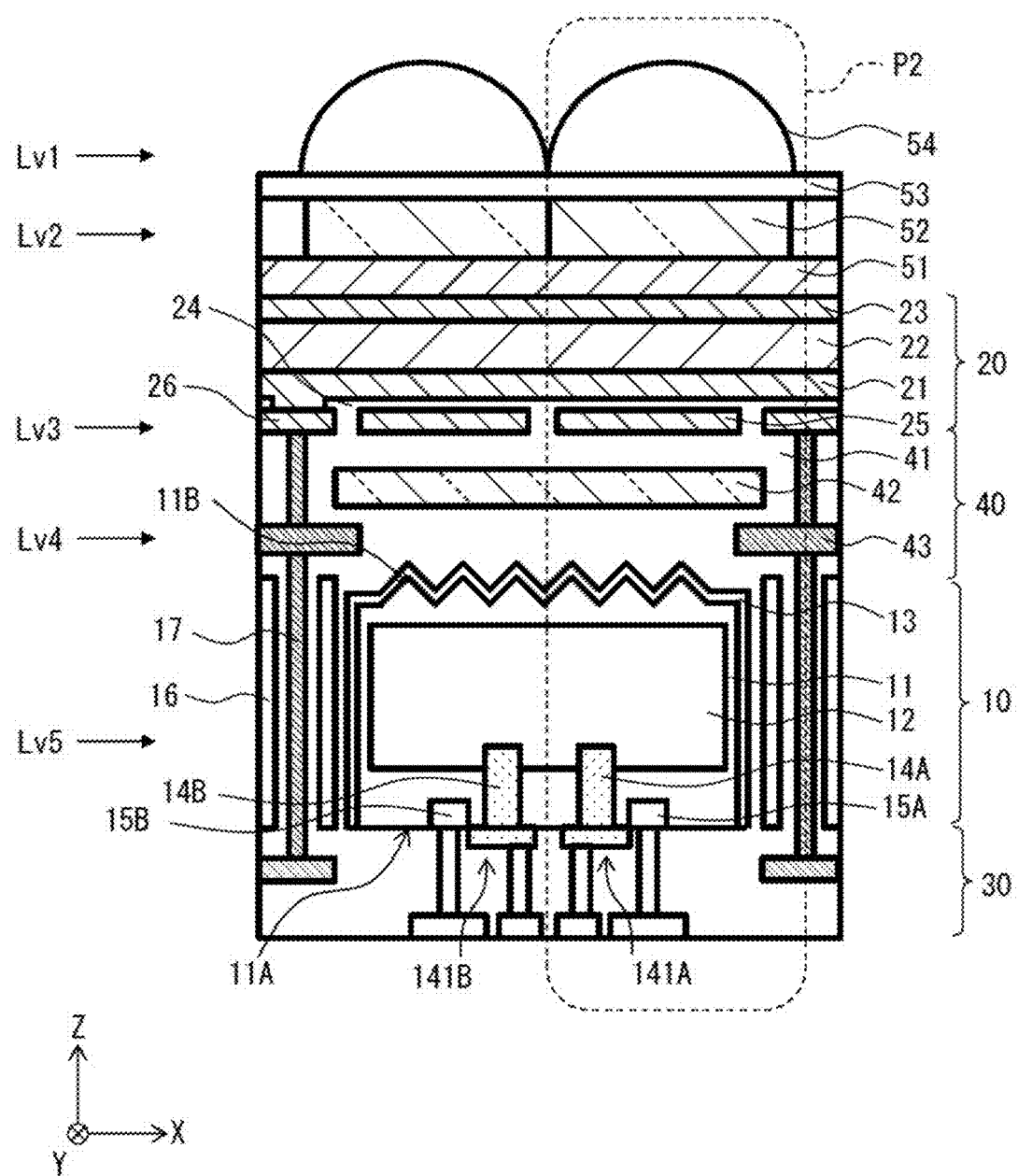
FIG. 7 is a schematic cross-sectional view of an example of an imaging element according to a second embodiment of the present disclosure.
Figure 8:
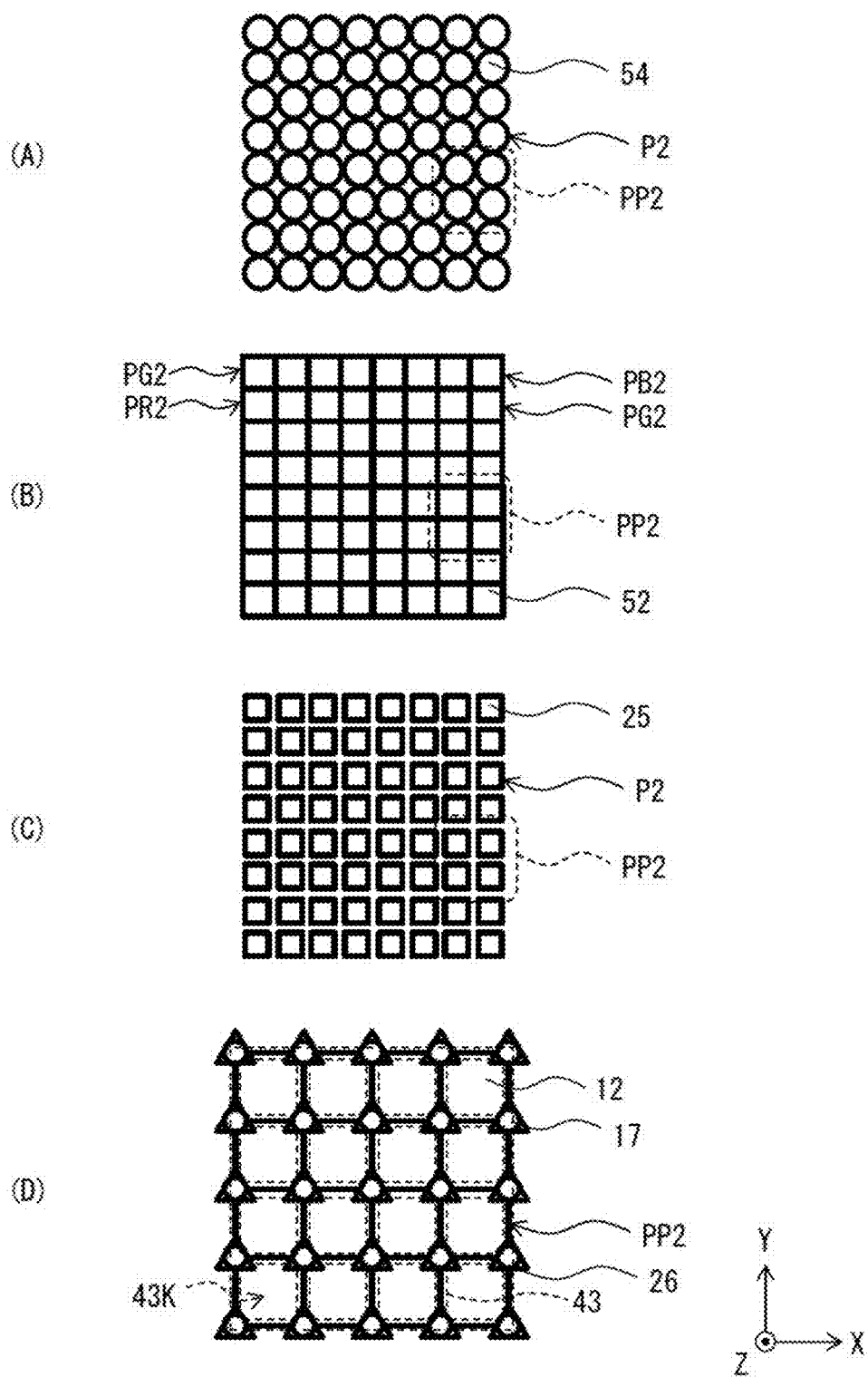
FIG. 8 is a schematic view of an example of an arrangement state of pixels illustrated in FIG. 7.

FIG. 7 schematically illustrates an example of a cross-sectional configuration in the pixel P2 as an imaging element according to the second embodiment. FIG. 8 schematically illustrates an example of an arrangement state in an XY plane of a plurality of pixels P2. The pixel P2 is applicable as the pixel P included in the pixel section 100 in the solid-state imaging device 1 illustrated in FIG. 1, as with the pixel P1 as the imaging element according to the first embodiment described above. However, in the present embodiment, as illustrated in FIG. 8, four pixels P2 are included in one pixel group PP2, and share one photoelectric converter 10. Accordingly, in a case where the pixel P2 according to the present embodiment is used as the pixel P illustrated in FIG. 1, as an example, driving of the organic photoelectric converter 20 including one electric charge accumulation electrode 25 may be performed in the pixel P2 as a unit, and driving of one photoelectric converter 10 may be performed in the pixel group PP2 as a unit. It is to be noted that two through electrodes 17 and two readout electrodes 26 in contact with upper ends of the through electrodes 17 are illustrated on the left and the right in FIG. 7, and the readout electrode 26 on the right appears to be separated from the semiconductor layer 21. However, in actuality, the readout electrode 26 on the right is also coupled to the semiconductor player 21 in a cross-section different from a cross-section illustrated in FIG. 7.

(A) to (D) of FIG. 8 respectively illustrate arrangement states at height positions corresponding to levels Lv1 to Lv3 and Lv5 in the Z-axis direction illustrated in FIG. 7. That is, (A) of FIG. 8 illustrates an arrangement state of the on-chip lenses 54 in the XY plane, (B) of FIG. 8 illustrates an arrangement state of the color filters 52 in the XY plane, (C) of FIG. 8 illustrates an arrangement state of the electric charge accumulation electrodes 25 in the XY plane, and (D) of FIG. 8 illustrates an arrangement state of the photoelectric conversion regions 12, the through electrodes 17, and the readout electrodes 26 in the XY plane. It is to be noted that in FIG. 8, to secure visibility, the readout electrodes 26 are also illustrated in (D). In addition, in (B) of FIG. 8, a sign PR2 indicates the pixel P2 of red, a sign PG2 indicates the pixel P2 of green, and a sign PB2 indicates the pixel P2 of blue. The color arrangement of the color filters 52 is not specifically limited, and may be, for example, a Bayer arrangement.

In the first embodiment described above, in the pixel section 100, one on-chip lens 54, one color filter 52, one electric charge accumulation electrode 25, and one photoelectric conversion region 12 are provided at positions corresponding to each other in the Z-axis direction. In contrast, in the present embodiment, four on-chip lenses 54, four color filters 52, and four electric charge accumulation electrodes 25 are provided, corresponding to one photoelectric conversion region 12, at positions corresponding to each other in the Z-axis direction. More specifically, the on-chip lenses 54, the color filters 52, and the electric charge accumulation electrodes 25 are arranged, corresponding to one photoelectric conversion region 12, in two columns in the X-axis direction and two rows in the Y-axis direction. That is, in the present embodiment, as illustrated in FIGS. 7 and 8, each of the pixels P2 includes one on-chip lens 54, one color filter 52, and one electric charge accumulation electrode 25, four pixels P2 adjacent to each other in both the X-axis direction and the Y-axis direction are included in one pixel group PP2, and the four pixels P2 share one photoelectric converter 10. The configuration of the pixel P2 is substantially the same as the configuration of the pixel P1, except for this point. It is to be noted that (D) of FIG. 8 illustrates an example in which the through electrodes 17 and the readout electrodes 26 are disposed in proximity to boundaries between adjacent photoelectric conversion regions 12 at respective four corners in each of the photoelectric conversion regions 12.

[Workings and Effects of Pixel P2]

The pixel P2 according to the present embodiment has the configuration described above, which makes it possible to simultaneously obtain a visible light image and an infrared light image including distance information at the same position in an in-plane direction. Furthermore, according to the pixel P2, as compared with a case where the plurality of pixels P1 is included in the pixel section 100, it is possible to reduce a difference in infrared light detection sensitivity among the plurality of pixels P2 included in the pixel section 100. In a case where the pixel section 100 includes the plurality of pixels P1, transmittance of infrared light passing through the color filter 52 differs depending on colors of the color filters 52. Accordingly, intensity of infrared light reaching the photoelectric conversion region 12 differs among the red pixel PR1, the blue pixel PB1, and the green pixel PG1. This causes a difference in infrared light detection sensitivity among the plurality of pixels P1 included in one pixel group PP1. In that respect, according to the pixel P2 according to the present embodiment, infrared light having passed through each of one color filter 52R, one color filter 52B, and two color filters 52G enters each photoelectric conversion region 12. This makes it possible to reduce a difference in infrared light detection sensitivity caused among a plurality of pixel groups PP2.

In addition, in the present embodiment, the through electrodes 17 and the readout electrodes 26 are provided at positions not overlapping vicinities of the centers of the respective on-chip lenses 54 in the Z-axis direction, which makes it possible to improve infrared light detection sensitivity in each pixel P2.

In addition, even in a case where the plurality of pixels P2 according to the present embodiment is arranged, the central position of each of the opening portions 43K in the inter-pixel region light-shielding film 43 may be shifted from the central position of a corresponding one of the pixels P2. One reason for this is to reduce variations in detection characteristics of the plurality of pixels P2 arranged in the pixel section 100, e.g., to prevent a decrease in detection sensitivity of the pixels P2 arranged in the peripheral portion of the pixel section 100. In this case, the shift amount of the central position of each of the opening portions 43K with respect to the central position of a corresponding one of the pixels P2 may be increased from the center of the pixel section 100 to the peripheral portion of the pixel section 100. In particular, it is preferable that the shift amount be nonlinearly changed from the center of the pixel section 100 to the peripheral portion of the pixel section 100.

Furthermore, a spacing between adjacent pixels P2 may be increased from the center of the pixel section 100 to the peripheral portion of the pixel section 100. In particular, it is preferable that the spacing be nonlinearly changed from the center of the pixel section 100 to the peripheral portion of the pixel section 100. Doing so makes it possible to perform pupil correction in accordance with each image height in the plurality of pixels P2 arranged in the pixel section 100, for example.

Figure 9:
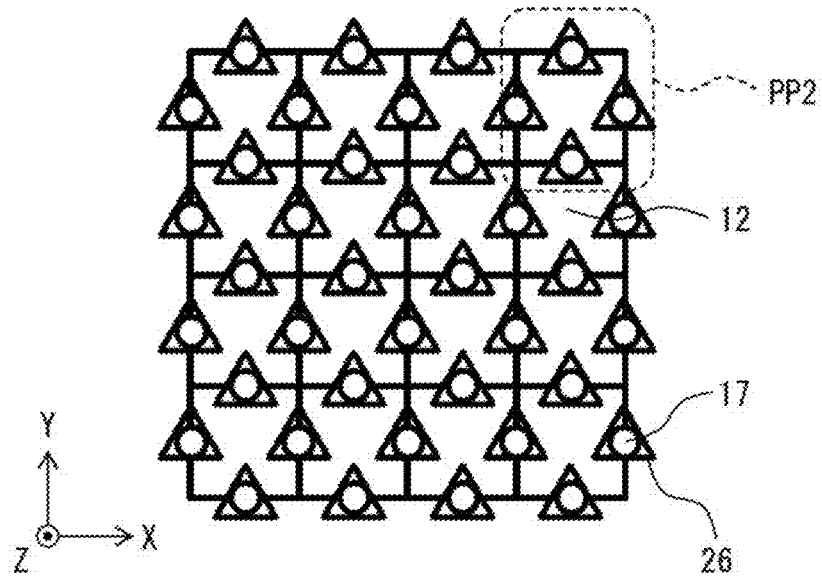
FIG. 9 is a schematic view of a first modification example of the arrangement state of the pixels illustrated in FIG. 7.
Figure 10:
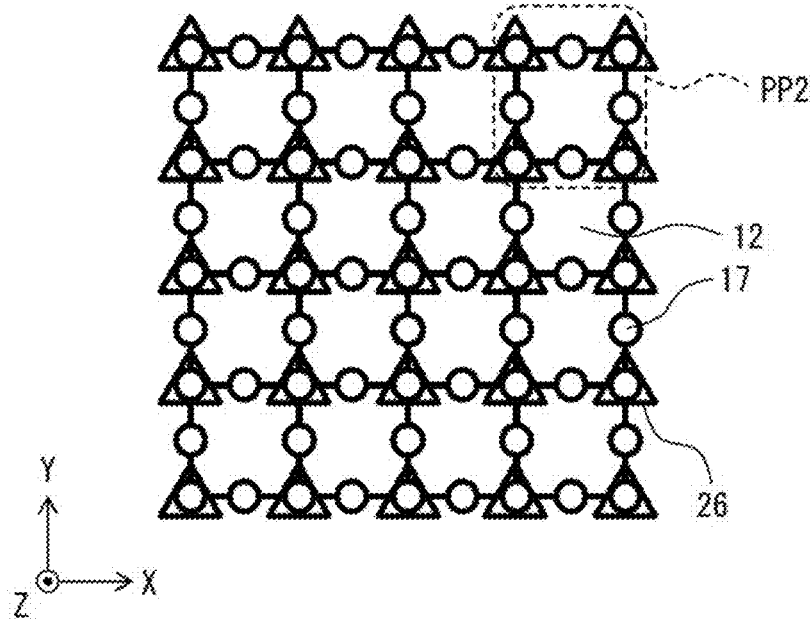
FIG. 10 is a schematic view of a second modification example of the arrangement state of the pixels illustrated in FIG. 7.
Figure 11:
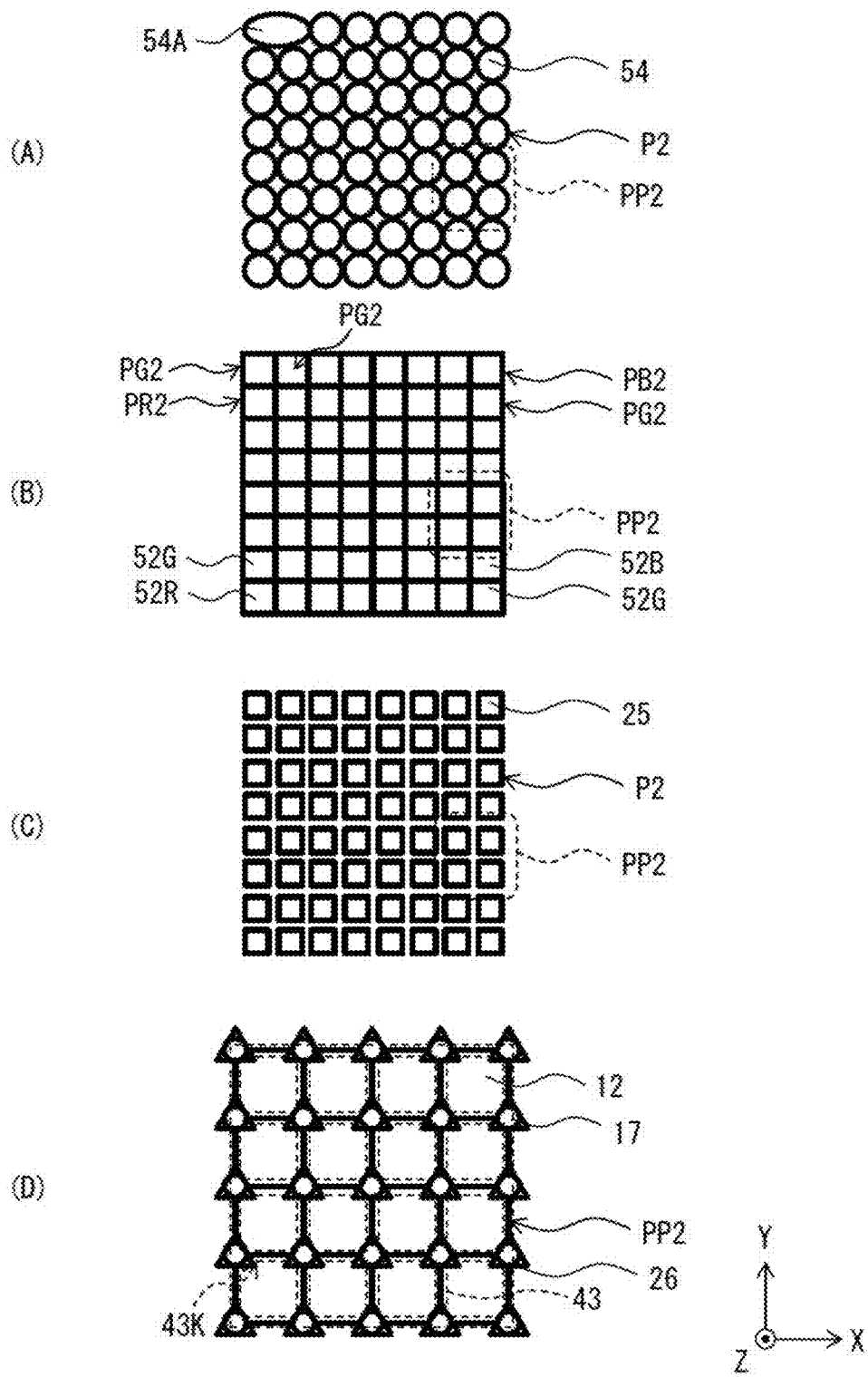
FIG. 11 is a schematic view of a third modification example of the arrangement state of the pixels illustrated in FIG. 7.

It is to be noted that FIG. 8 is an example, and the arrangement state of the through electrodes 17 and the arrangement state of the readout electrodes 26 in the plurality of pixels P2 arranged in the pixel section 100 of the present disclosure are not limited thereto. For example, as illustrated in FIG. 9, the through electrodes 17 may be disposed in proximity to boundaries between adjacent photoelectric conversion regions 12 at midpoints of four corners in each of the photoelectric conversion regions 12. FIG. 9 schematically illustrates a first modification example of the arrangement state of the plurality of pixels P2 in the pixel section 100. Alternatively, as illustrated in FIG. 10, the through electrodes 17 may be disposed in proximity to boundaries between adjacent photoelectric conversion regions 12 at both four corners in each of the photoelectric conversion regions 12 and midpoints of the four corners in each of the photoelectric conversion regions 12. FIG. 10 schematically illustrates a second modification example of the arrangement state of the plurality of pixels P2 in the pixel section 10. Furthermore, as illustrated in FIG. 11, one on-chip lens 54A having a size corresponding to two on-chip lenses 54 may be disposed in place of two on-chip lenses 54 arranged side by side in the X-axis direction. FIG. 11 schematically illustrates a third modification example of the arrangement state of the plurality of pixels P2 in the pixel section 100. In an example in FIG. 11, both the color filters 52 disposed directly below the on-chip lens 54A are, for example, the green color filters 52G that allows green to pass therethrough. Accordingly, light having passed through the on-chip lens 54A is received by two pixels PG2, which makes it possible to obtain image plane phase difference information. It is to be noted that the color arrangement of the color filters 52 is not specifically limited, and the color arrangement other than a portion corresponding to the on-chip lens 54A may be, for example, a Bayer arrangement. In addition, in FIG. 11, the through electrodes 17 and the readout electrodes 26 are disposed at positions of four corners in each of the photoelectric conversion regions 12; however, the present disclosure is not limited thereto. For example, in addition to the configuration in FIG. 11, the through electrodes 17 may be further disposed in proximity to boundaries between the adjacent photoelectric conversion regions 12 at midpoints of the four corners in each of the photoelectric conversion regions 12. Alternatively, the through electrodes 17 may not be disposed at the four corners in each of the photoelectric conversion regions 12, and may be disposed only at the midpoints of the four corners in each of the photoelectric conversion regions 12.

3. Third Embodiment

[Configuration of Pixel P3]

Figure 12:
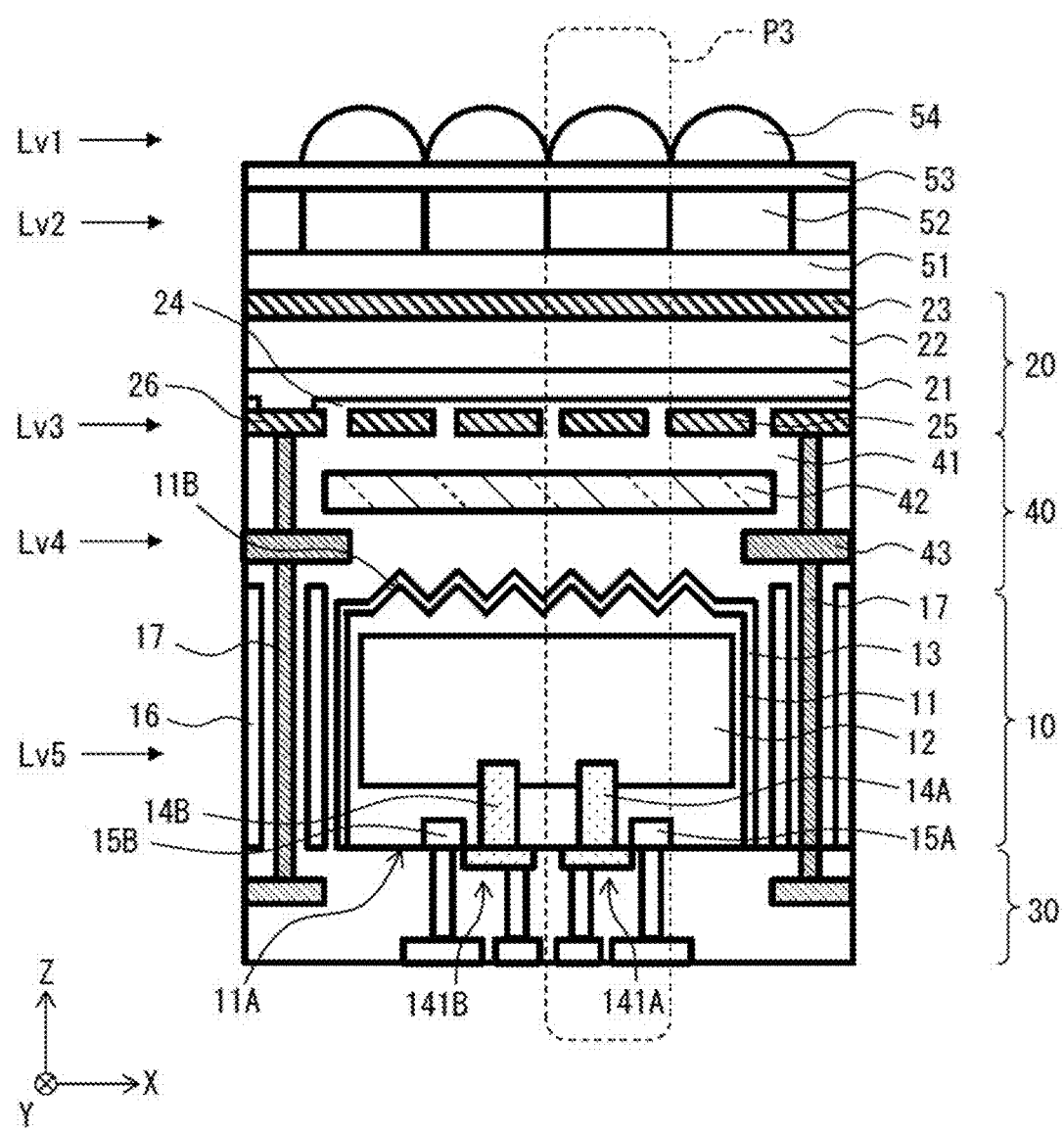
FIG. 12 is a schematic cross-sectional view of an example of an imaging element according to a third embodiment of the present disclosure.
Figure 13:
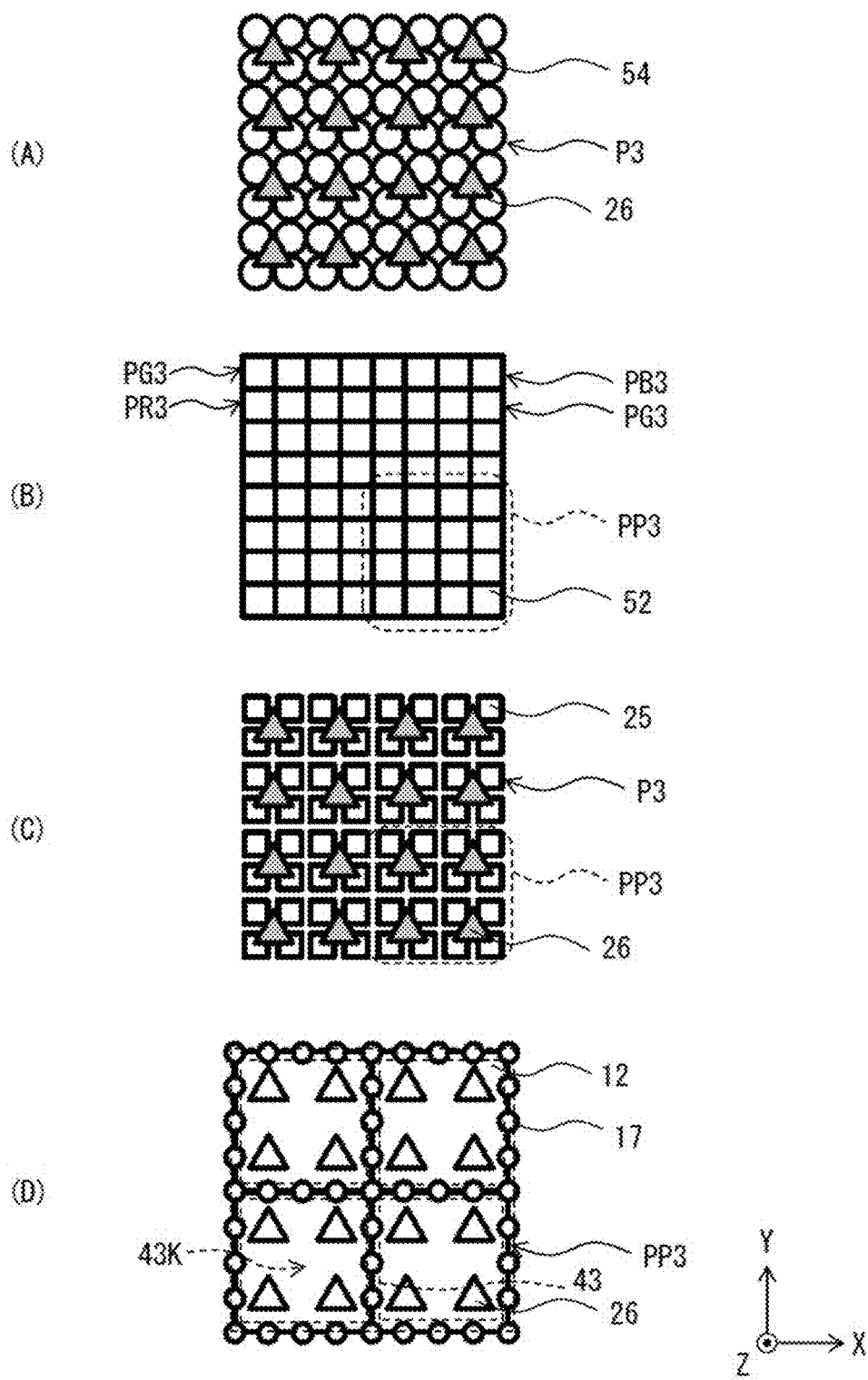
FIG. 13 is a schematic view of an example of an arrangement state of pixels illustrated in FIG. 12.

FIG. 12 schematically illustrates an example of a cross-sectional configuration of the pixel P3 as an imaging element according to the third embodiment. FIG. 13 is a schematic view of an example of an arrangement state in an XY plane of a plurality of pixels P3. The pixel P3 is applicable as the pixel P included in the pixel section 100 in the solid-state imaging device 1 illustrated in FIG. 1, as with the pixel P1 as the imaging element according to the first embodiment described above. However, in the present embodiment, as illustrated in FIG. 13, sixteen pixels P3 are included in one pixel group PP3, and share one photoelectric converter 10. Accordingly, in a case where the pixel P3 according to the present embodiment is used as the pixel P illustrated in FIG. 1, as an example, driving of the organic photoelectric converter 20 including one electric charge accumulation electrode 25 may be performed in the pixel P3 as a unit, and driving of one photoelectric converter 10 may be performed in the pixel group PP3 as a unit.

(A) to (D) of FIG. 13 respectively illustrate arrangement states at height positions corresponding to levels Lv1 to Lv3 and Lv5 in the Z-axis direction illustrated in FIG. 12. That is, (A) of FIG. 13 illustrates an arrangement state of the on-chip lenses 54 in the XY plane, (B) of FIG. 13 illustrates an arrangement state of the color filters 52 in the XY plane, (C) of FIG. 13 illustrates an arrangement state of the electric charge accumulation electrodes 25 and the readout electrodes 26 in the XY plane, and (D) of FIG. 13 illustrates an arrangement state of the photoelectric conversion regions 12 and the through electrodes 17 in the XY plane. It is to be noted that in FIG. 13, to secure visibility, the readout electrodes 26 are also illustrated in (D). In addition, (C) of FIG. 13 illustrates the electric charge accumulation electrode 25 and the readout electrode 26 that partially overlap each other; however, in actuality, the electric charge accumulation electrode 25 and the readout electrode 26 are disposed to be separated from each other. Furthermore, in (B) of FIG. 13, a sign PR3 indicates the pixel P3 of red a sign PG3 indicates the pixel P3 of green, and a sign PB3 indicates the pixel P3 of blue. It is to be noted that the color arrangement of the color filters 52 is not specifically limited, and may be, for example, a Bayer arrangement.

In the first embodiment described above, in the pixel section 100, one on-chip lens 54, one color filter 52, one electric charge accumulation electrode 25, and one photoelectric conversion region 12 are provided at positions corresponding to each other in the Z-axis direction. In contrast, in the present embodiment, sixteen on-chip lenses 54, sixteen color filters 52, and sixteen electric charge accumulation electrodes 25 are provided, corresponding to one photoelectric conversion region 12, at positions corresponding to each other in the Z-axis direction. More specifically, the on-chip lenses 54, the color filters 52, and the electric charge accumulation electrodes 25 are arranged, corresponding to one photoelectric conversion region 12, in four columns in the X-axis direction and four rows in the Y-axis direction. That is, in the present embodiment, as illustrated in FIGS. 12 and 13, sixteen pixels P3 adjacent to each other in both the X-axis direction and the Y-axis direction are included in one pixel group PP3, and share one photoelectric converter 10. The configuration of the pixel P3 is substantially the same as the configuration of the pixel P1, except for this point. It is to be noted that (D) of FIG. 13 illustrates an example in which the through electrodes 17 are disposed in proximity to boundaries between adjacent photoelectric conversion regions 12 at respective four corners in each of the photoelectric conversion regions 12 and on straight lines connecting the four corners. In addition, in (D) of FIG. 13, one of the readout electrodes 26 is disposed at a middle position of every four pixels P3, and the one readout electrode 26 is shared by the four pixels P3.

[Workings and Effects of Pixel P3]

The pixel P3 according to the present embodiment has the configuration described above, which makes it possible to simultaneously obtain a visible light image and an infrared light image including distance information at the same position in an in-plane direction. Furthermore, according to the pixel P3, as compared with a case where the plurality of pixels P1 is included in the pixel section 100, it is possible to reduce a difference in infrared light detection sensitivity among a plurality of pixel groups PP3 included in the pixel section 100.

In addition, in the present embodiment, the through electrodes 17 and the readout electrodes 26 are provided at positions not overlapping vicinities of the centers of the respective on-chip lenses 54 in the Z-axis direction, which makes it possible to improve infrared light detection sensitivity in each pixel P2 It is to be noted that FIG. 13 is an example, and the arrangement positions of the through electrodes 17 and the arrangement positions of the readout electrodes 26 in the plurality of pixels P3 arranged in the pixel section 100 of the present disclosure are not limited thereto.

In addition, even in a case where the plurality of pixels P3 according to the present embodiment is arranged, the central position of each of the opening portions 43K in the inter-pixel region light-shielding film 43 may be shifted from the central position of a corresponding one of the pixels P3. one reason for this is to reduce variations in detection characteristics of the plurality of pixels P3 arranged in the pixel section 100, e.g., to prevent a decrease in detection sensitivity of the pixels P3 arranged in the peripheral portion of the pixel section 100. In this case, the shift amount of the central position of each of the opening portions 43K with respect to the central position of a corresponding one of the pixels P3 may be increased from the center of the pixel section 100 to the peripheral portion of the pixel section 100.

In particular, it is preferable that the shift amount be non-linearly changed from the center of the pixel section 100 to the peripheral portion of the pixel section 100.

Furthermore, a spacing between adjacent pixels P3 may be increased from the center of the pixel section 100 to the peripheral portion of the pixel section 100. In particular, it is preferable that the spacing be nonlinearly changed from the center of the pixel section 100 to the peripheral portion of the pixel section 100. Doing so makes it possible to perform pupil correction in accordance with each image height in the plurality of pixels P2 arranged in the pixel section 100, for example.

4. Fourth Embodiment

[Configuration of Pixel P4]

Figure 14:
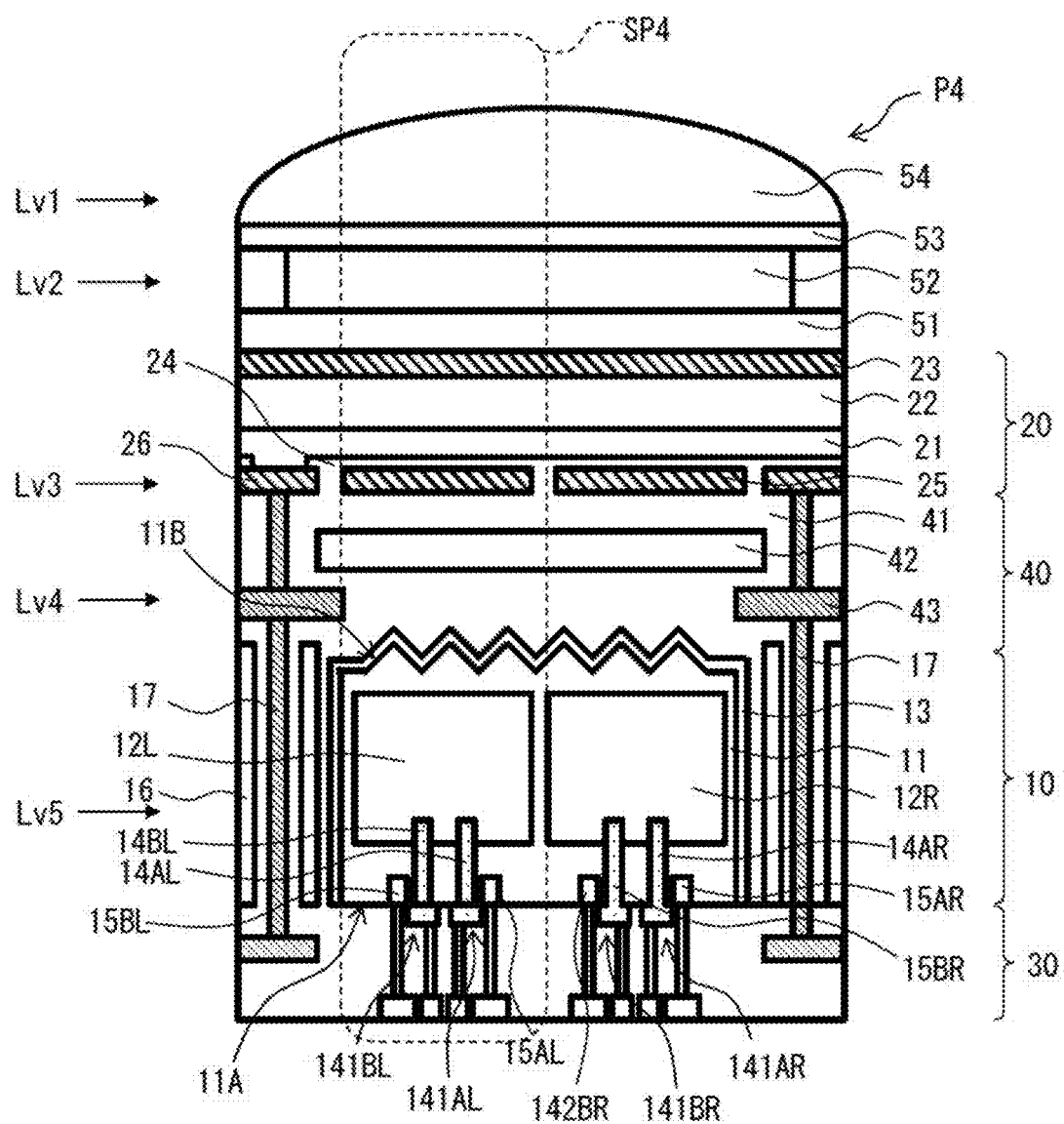
FIG. 14 is a schematic cross-sectional view of an example of an imaging element according to a fourth embodiment of the present disclosure.
Figure 15:
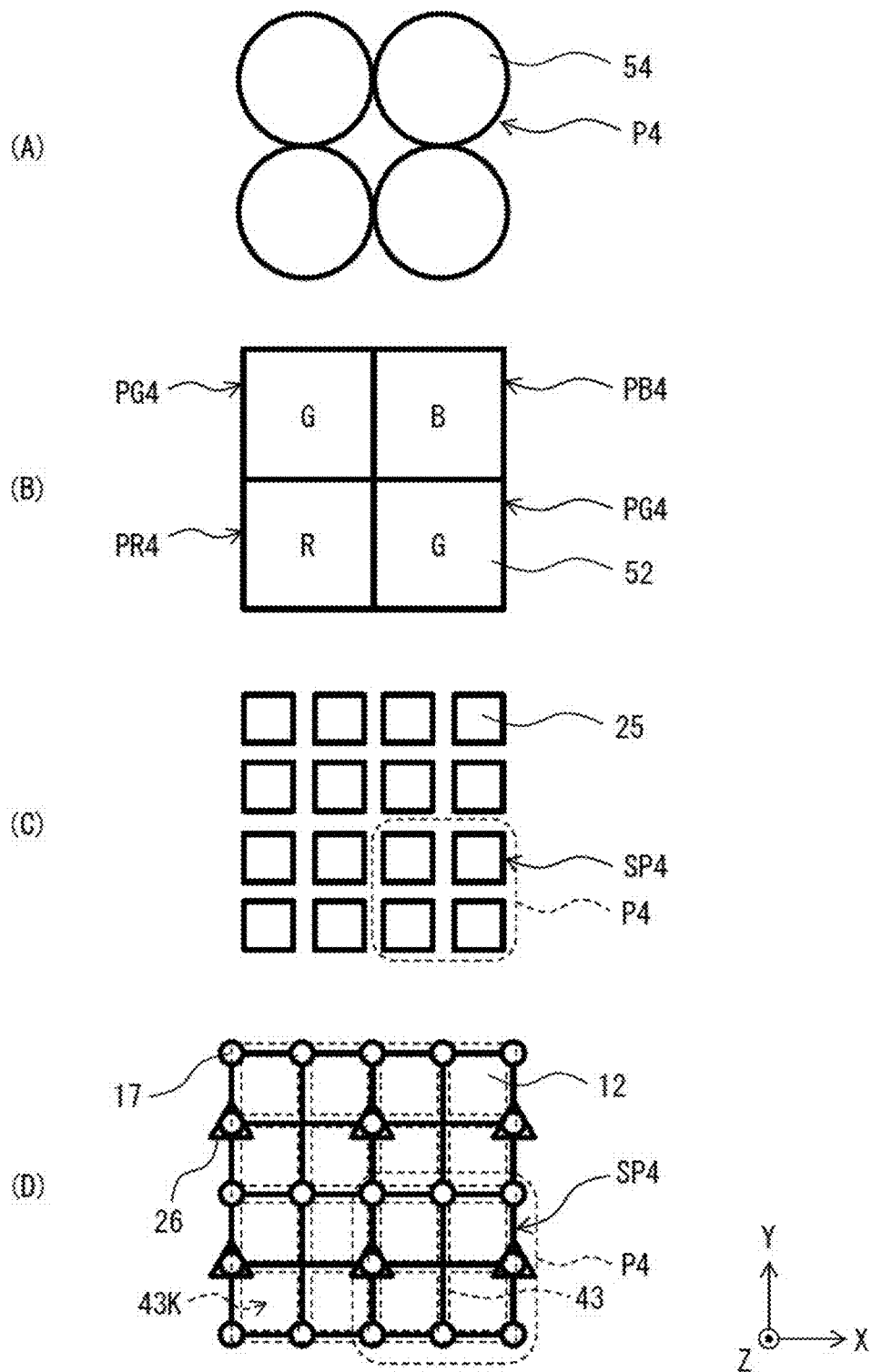
FIG. 15 is a schematic view of an example of an arrangement state of pixels illustrated in FIG. 14.

FIG. 14 schematically illustrates an example of a cross-sectional configuration in a pixel P4 as an imaging element according to a fourth embodiment. FIG. 15 is a schematic view of an example of an arrangement state in an XY plane of a plurality of pixels P4. The pixel P4 is applicable as the pixel P included in the pixel section 100 in the solid-state imaging device 1 illustrated in FIG. 1, as with the pixel P1 as the imaging element according to the first embodiment described above. However, in the present embodiment, as illustrated in FIGS. 14 and 15, one pixel P4 includes four sub-pixels SP4, and each of the sub-pixels SP4 includes one electric charge accumulation electrode 25 and one photoelectric converter 10. Accordingly, in a case where the pixel P4 according to the present embodiment is used as the pixel P illustrated in FIG. 1, as an example, driving of the organic photoelectric converter 20 including one electric charge accumulation electrode 25 may be performed in the sub-pixel SP4 as a unit, and driving of one photoelectric converter 10 may be performed in the sub-pixel SP4 as a unit.

(A) to (D) of FIG. 15 respectively illustrate arrangement states at height positions corresponding to levels Lv1 to Lv3 and Lv5 in the Z-axis direction illustrated in FIG. 14. That is, (A) of FIG. 15 illustrates an arrangement state of the on-chip lenses 54 in the XY plane, (B) of FIG. 15 illustrates an arrangement state of the color filters 52 in the XY plane, (C) of FIG. 15 illustrates an arrangement state of the electric charge accumulation electrodes 25 in the XY plane, and (D) of FIG. 15 illustrates an arrangement state of the photoelectric conversion regions 12 and the through electrodes 17 in the XY plane. It is to be noted that in FIG. 15, to secure visibility, the readout electrodes 26 are also illustrated in (D). In addition, in (B) of FIG. 15, a sign PR4 indicates the pixel P4 of red, a sign PG4 indicates the pixel P4 of green, and a sign PB4 indicates the pixel P4 of blue.

Figure 16:
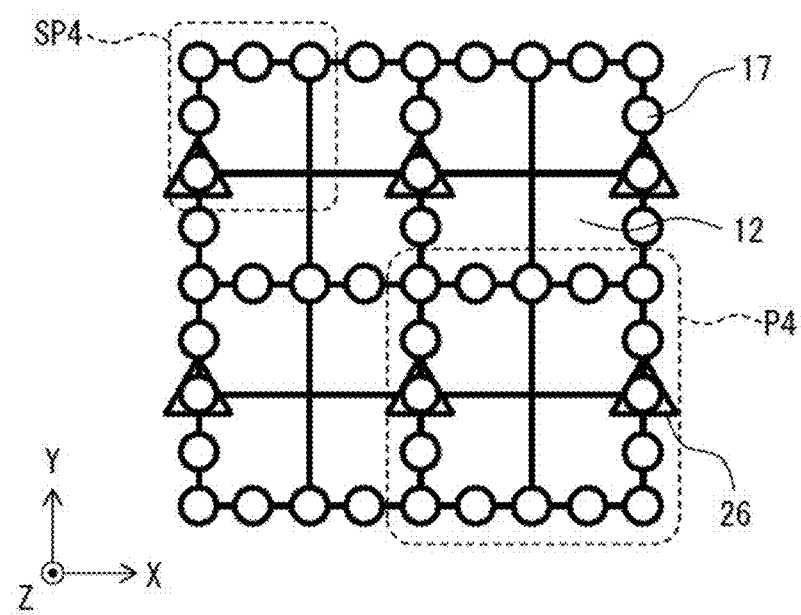
FIG. 16 is a schematic view of a modification example of the arrangement state of the pixels illustrated in FIG. 14.

In the first embodiment described above, in the pixel section 100, one on-chip lens 54, one color filter 52, one electric charge accumulation electrode 25, and one photoelectric conversion region 12 are provided at positions corresponding to each other in the Z-axis direction. In contrast, in the present embodiment, one color filter 52, four electric charge accumulation electrodes 25, and four photoelectric conversion regions 12 are provided, corresponding to one on-chip lens 54, at positions corresponding to each other in the Z-axis direction. More specifically, the electric charge accumulation electrodes 25 and the photoelectric conversion regions 12 are arranged, corresponding to one on-chip lens 54 and one color filter 52, in two columns in the X-axis direction and two rows in the Y-axis direction. That is, in the present embodiment, as illustrated in FIGS. 15 and 16, one pixel P4 includes four electric charge accumulation electrodes 25 and four photoelectric conversion regions 12. The configuration of the pixel P4 is substantially the same as the configuration of the pixel P1, except for this point.

[Workings and Effects of Pixel P4]

The pixel P4 according to the present embodiment has the configuration described above, which makes it possible to simultaneously obtain a visible light image and an infrared light image including distance information at the same position in an in-plane direction. Furthermore, it is possible to obtain image plane phase difference information in the X-axis direction and the Y-axis direction by infrared light in each pixel P4.

In addition, it is possible to obtain an infrared light signal at a position corresponding to each of the red pixel PR4, the green pixel PG4, and the blue pixel PB4. Accordingly, in the pixel P4 according to the present embodiment, an infrared light image having high resolution is obtained, as compared with the pixel P2 according to the second embodiment and the pixel P3 according to the third embodiment.

In addition, in the present embodiment, the through electrodes 17 and the readout electrodes 26 are provided at positions not overlapping vicinities of the centers of the on-chip lenses 54 in the Z-axis direction, which makes it possible to improve infrared light detection sensitivity in each pixel P4.

In addition, even in a case where the plurality of pixels P4 according to the present embodiment is arranged, the central position of each of the opening portions 43K in the inter-pixel region light-shielding film 43 may be shifted from the central position of a corresponding one of the sub-pixels SP4. One reason for this is to reduce variations in detection characteristics of the plurality of pixels P4 arranged in the pixel section 100, e.g., to prevent a decrease in detection sensitivity of the pixels P4 arranged in the peripheral portion of the pixel section 100. In this case, the shift amount of the central position of each of the opening portions 43K with respect to the central position of a corresponding one of the sub-pixels SP4 may be increased from the center of the pixel section 100 to the peripheral portion of the pixel section 100. In particular, it is preferable that the shift amount be non-linearly changed from the center of the pixel section 100 to the peripheral portion of the pixel section 100.

Furthermore, a spacing between adjacent pixels P4 may be increased from the center of the pixel section 100 to the peripheral portion of the pixel section 100. In particular, it is preferable that the spacing be nonlinearly changed from the center of the pixel section 100 to the peripheral portion of the pixel section 100. Doing so makes it possible to perform pupil correction in accordance with each image height in the plurality of pixels P4 arranged in the pixel section 100, for example.

It is to be noted that FIG. 15 is an example, and the arrangement positions of the through electrodes 17 and the arrangement positions of the readout electrodes 26 in the plurality of pixels P4 arranged in the pixel section 100 of the present disclosure are not limited thereto. For example, as illustrated in FIG. 16, the through electrodes 17 may be further disposed in proximity to boundaries between adjacent photoelectric conversion regions 12 at midpoints of four corners in each of the photoelectric conversion regions 12. FIG. 16 schematically illustrates a modification example of the arrangement state of the plurality of pixels P4 in the pixel section 100.

5. Fifth Embodiment

[Configuration of Pixel P5]

Figure 17:
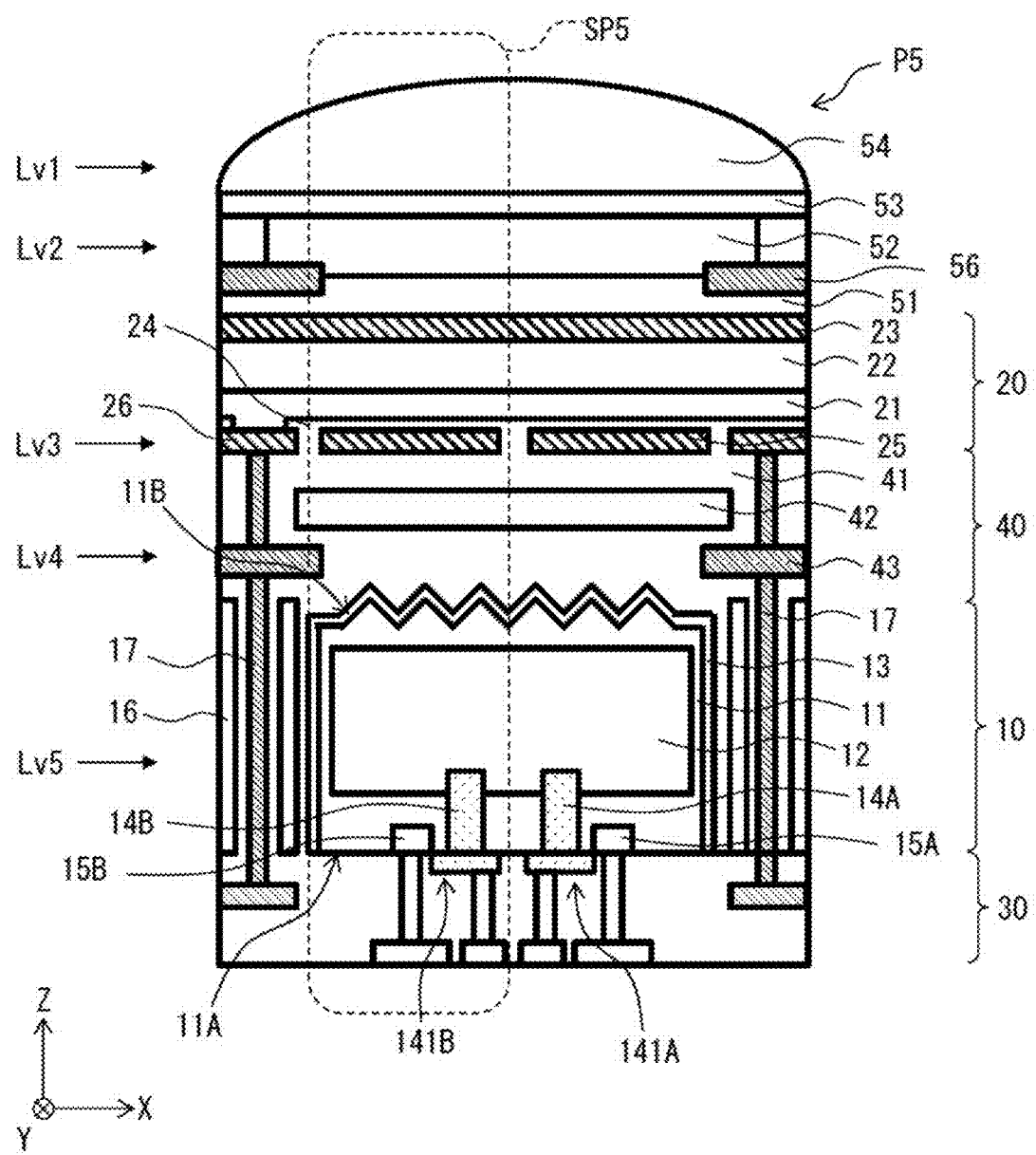
FIG. 17 is a schematic cross-sectional view of an example of an imaging element according to a fifth embodiment of the present disclosure.
Figure 18:
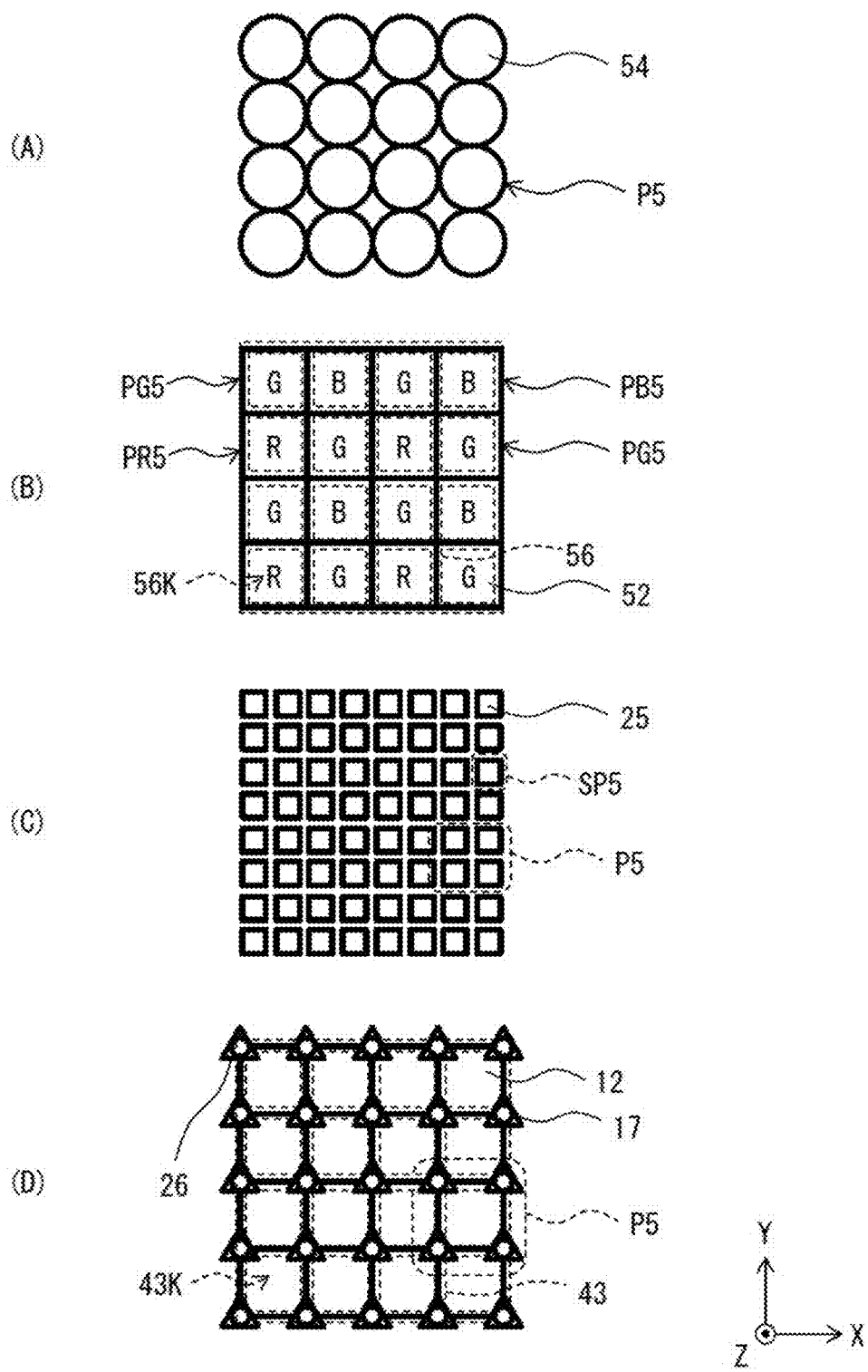
FIG. 18 is a schematic view of an example of an arrangement state of pixels illustrated in FIG. 17.

FIG. 17 schematically illustrates an example of a cross-sectional configuration in a pixel P5 as an imaging element according to a fifth embodiment. FIG. 18 is a schematic view of an example of an arrangement state in an XY plane of a plurality of pixels P5. The pixel P5 is applicable as the pixel P included in the pixel section 100 in the solid-state imaging device 1 illustrated in FIG. 1, as with the pixel P1 as the imaging element according to the first embodiment described above. However, in the present embodiment, as illustrated in FIGS. 17 and 18, one pixel P5 includes four sub-pixels SP5, and each of the sub-pixels SP5 includes one electric charge accumulation electrode 25. Accordingly, in a case where the pixel P5 according to the present embodiment is used as the pixel P illustrated in FIG. 1, as an example, driving of the organic photoelectric converter 20 including one electric charge accumulation electrode 25 may be performed in the sub-pixel SP5 as a unit, and driving of one photoelectric converter 10 may be performed in the pixel P5 as a unit.

(A) to (D) of FIG. 18 respectively illustrate arrangement states at height positions corresponding to levels Lv1 to Lv3 and Lv5 in the Z-axis direction illustrated in FIG. 17. That is, (A) of FIG. 18 illustrates an arrangement state of the on-chip lenses 54 in the XY plane, (B) of FIG. 18 illustrates an arrangement state of the color filters 52 in the XY plane, (C) of FIG. 18 illustrates an arrangement state of the electric charge accumulation electrodes 25 in the XY plane, and (D) of FIG. 18 illustrates an arrangement state of the photoelectric conversion regions 12 and the through electrodes 17 in the XY plane. It is to be noted that in FIG. 18, to secure visibility, the readout electrodes 26 are also illustrated in (D). In addition, in (B) of FIG. 18, a sign PR5 indicates the pixel P5 of red, a sign PG5 indicates the pixel P2 of green, and a sign PB2 indicates the pixel P2 of blue.

In the first embodiment described above, in the pixel section 100, one on-chip lens 54, one color filter 52, one electric charge accumulation electrode 25, and one photoelectric conversion region 12 are provided at positions corresponding to each other in the Z-axis direction. In contrast, in the present embodiment, one color filter 52, four electric charge accumulation electrodes 25, and one photoelectric conversion region 12 are provided, corresponding to one on-chip lens 54, at positions corresponding to each other in the Z-axis direction. More specifically, the electric charge accumulation electrodes 25 are arranged, corresponding to one on-chip lens 54, one color filter 52, and one photoelectric conversion region 12, in two columns in the X-axis direction and two rows in the Y-axis direction. That is, in the present embodiment, as illustrated in FIGS. 17 and 18, one pixel P5 includes four electric charge accumulation electrodes 25. Furthermore, in the pixel P5 according to the present embodiment, an inter-pixel region light-shielding film 56 may be provided, for example, between the organic photoelectric converter 20 and the on-chip lens 54 in the Z-axis direction, more specifically, for example, between the color filter 52 and the sealing film 51. The inter-pixel region light-shielding film 56 includes a metal such as W (tungsten) and Al (aluminum) as a main component. The inter-pixel region light-shielding film 56 includes a plurality of opening portions 56K, and is provided in boundary portions with other adjacent pixels P5 in the XY plane, that is, regions between color filters 52 of different colors to form a grid pattern as a whole. This makes it possible to suppress oblique incidence of unnecessary light onto the organic photoelectric converters 20 of adjacent pixels P5 and prevent color mixture. Furthermore, the inter-pixel region light-shielding film 56 is provided to surround the photoelectric conversion region 12 of each pixel P5 in plan view. This makes it possible to suppress oblique incidence of unnecessary light onto the photoelectric conversion regions 12 of adjacent pixels P5 and prevent color mixture. In (B) of FIG. 18, the inter-pixel region light-shielding film 56 is illustrated by a broken line. The configuration of the pixel P5 is substantially the same as the configuration of the pixel P1, except for this point. In the present embodiment, specifically an arrangement pitch of the color filters 52 and an arrangement pitch of the photoelectric conversion regions 12 coincide with each other; therefore, providing the inter-pixel region light-shielding film 56 makes it possible to expect a color mixture prevention effect on both the organic photoelectric converters 20 and the photoelectric conversion regions 12. Herein, the central position of each of the opening portions 56K in the inter-pixel region light-shielding film 43 may be shifted from the central position of a corresponding one of the pixels P5. One reason for this is to reduce variations in detection characteristics of the plurality of pixels P5 arranged in the pixel section 100, e.g., to prevent a decrease in detection sensitivity of the pixels P5 arranged in the peripheral portion of the pixel section 100. In this case, the shift amount of the central position of each of the opening portions 56K with respect to the central position of a corresponding one of the pixels P5 may be increased from the center of the pixel section 100 to the peripheral portion of the pixel section 100. In particular, the shift amount may be nonlinearly changed from the center of the pixel section 100 to the peripheral portion of the pixel section 100. It is to be noted that the inter-pixel region light-shielding film 56 is appropriately applicable to any pixels described as respective embodiments and modification examples in the present specification, other than the pixel P5 according to the present embodiment. However, the inter-pixel region light-shielding film 56 may not be provided in the pixels described in the embodiments and the modification examples.

[Workings and Effects of Pixel P5]

The pixel P5 according to the present embodiment has the configuration described above, which makes it possible to simultaneously obtain a visible light image and an infrared light image including distance information at the same position in an in-plane direction. Furthermore, it is possible to obtain image plane phase difference information in the X-axis direction and the Y-axis direction by visible light in each pixel P5.

In addition, in the present embodiment, the through electrodes 17 and the readout electrodes 26 are provided at positions not overlapping vicinities of the centers of the on-chip lenses 54 in the Z-axis direction, which makes it possible to improve infrared light detection sensitivity in each pixel P5.

In addition, even in a case where the plurality of pixels P5 according to the present embodiment is arranged, the central position of each of the opening portion 43K in the inter-pixel region light-shielding film 43 may be shifted from the central position of a corresponding one of the pixels P5. One reason for this is to reduce variations in detection characteristics of the plurality of pixels P5 arranged in the pixel section 100, e.g., to prevent a decrease in detection sensitivity of the pixels P5 arranged in the peripheral portion of the pixel section 100. In this case, the shift amount of the central position of each of the opening portions 43K with respect to the central position of a corresponding one of the pixels P5 may be increased from the center of the pixel section 100 to the peripheral portion of the pixel section 100. In particular, it is preferable that the shift amount be non-linearly changed from the center of the pixel section 100 to the peripheral portion of the pixel section 100.

Furthermore, a spacing between adjacent pixels P5 may be increased from the center of the pixel section 100 to the peripheral portion of the pixel section 100. In particular, it is preferable that the spacing be nonlinearly changed from the center of the pixel section 100 to the peripheral portion of the pixel section 100. Doing so makes it possible to perform pupil correction in accordance with each image height in the plurality of pixels P5 arranged in the pixel section 100, for example.

Figure 19:
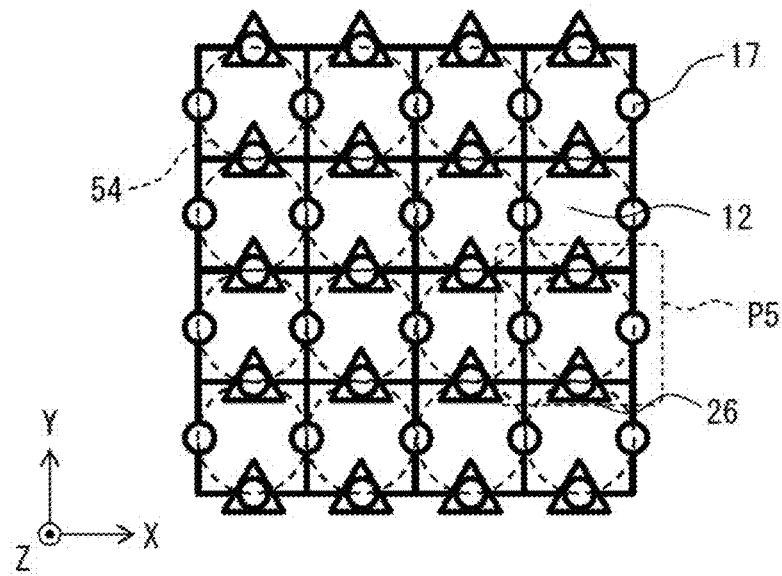
FIG. 19 is a schematic view of a first modification example of the arrangement state of the pixels illustrated in FIG. 17.
Figure 20:
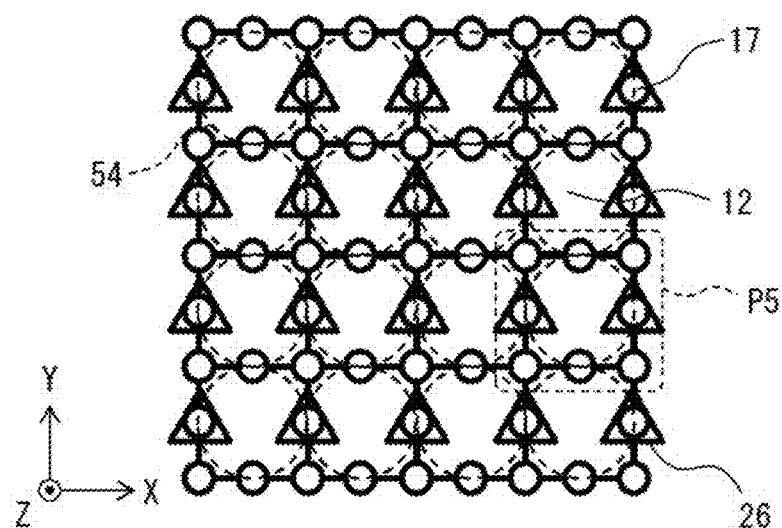
FIG. 20 is a schematic view of a second modification example of the arrangement state of the pixels illustrated in FIG. 17.

It is to be noted that FIG. 18 is an example, and the arrangement positions of the through electrodes 17 and the arrangement positions of the readout electrodes 26 in the plurality of pixels P4 arranged in the pixel section 100 of the present disclosure are not limited thereto. For example, as illustrated in FIG. 19, the through electrodes 17 may be further disposed in proximity to boundaries between adjacent photoelectric conversion regions 12 at midpoints of four corners in each of the photoelectric conversion regions 12. FIG. 19 schematically illustrates a first modification example of the arrangement state of the plurality of pixels P5 in the pixel section 100. Alternatively, as illustrated in FIG. 20, the through electrodes 17 may be disposed in proximity to boundaries between adjacent photoelectric conversion regions 12 at both four corners in each of the photoelectric conversion regions 12 and midpoints of the four corners in each of the photoelectric conversion regions 12. FIG. 20 schematically illustrates a second modification example of the arrangement state of the plurality of pixels P5 in the pixel section 100.

Figure 21A:
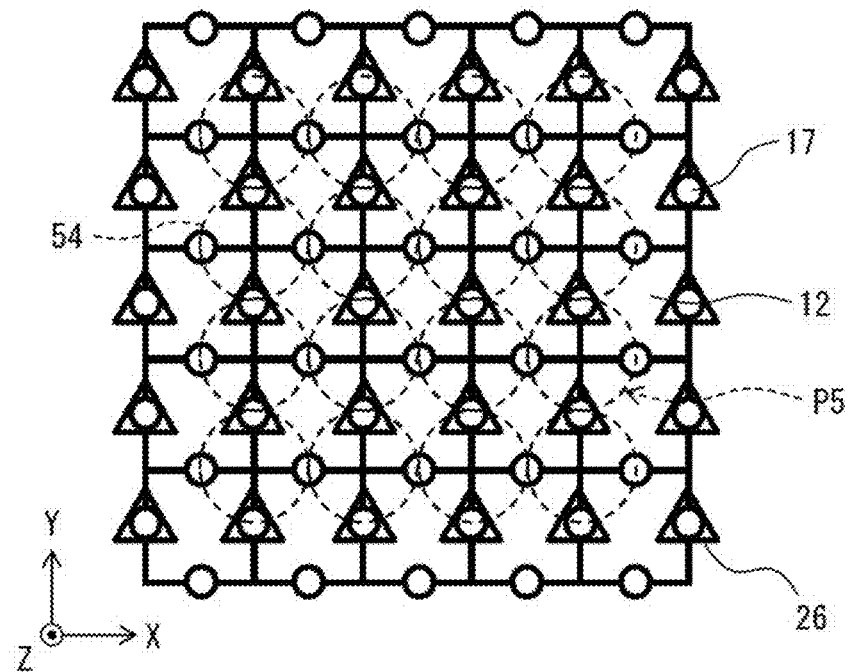
FIG. 21A is a first schematic view of a third modification example of the arrangement state of the pixels illustrated in FIG. 17.
Figure 21B:
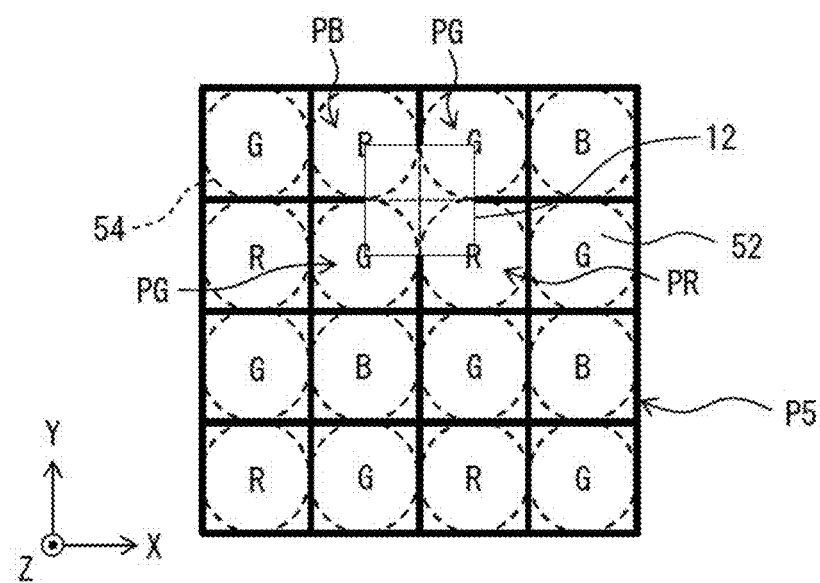
FIG. 21B is a second schematic view of the third modification example of the arrangement state of the pixels illustrated in FIG. 17.

Furthermore, as illustrated in FIGS. 21A and 21B, in each pixel P5, for example, the central position of the color filter 52 and the central position of the photoelectric conversion region 12 may be displaced by a half in both the X-axis direction and the Y-axis direction. Doing so makes it possible to reduce variations in light reception sensitivity to infrared light in each photoelectric conversion region 12. It is to be noted that FIGS. 21A and 21B schematically illustrate a third modification example of the arrangement state of the plurality of pixels P5 in the pixel section 100. FIG. 21A specifically illustrates a positional relationship among the on-chip lenses 54, the photoelectric conversion regions 12, the through electrodes 17, and the readout electrodes 26. FIG. 21B specifically illustrates a positional relationship among the on-chip lenses 54, the color filters 52, and the photoelectric conversion regions 12.

6. Sixth Embodiment

[Configuration of Pixel P6]

Figure 22:
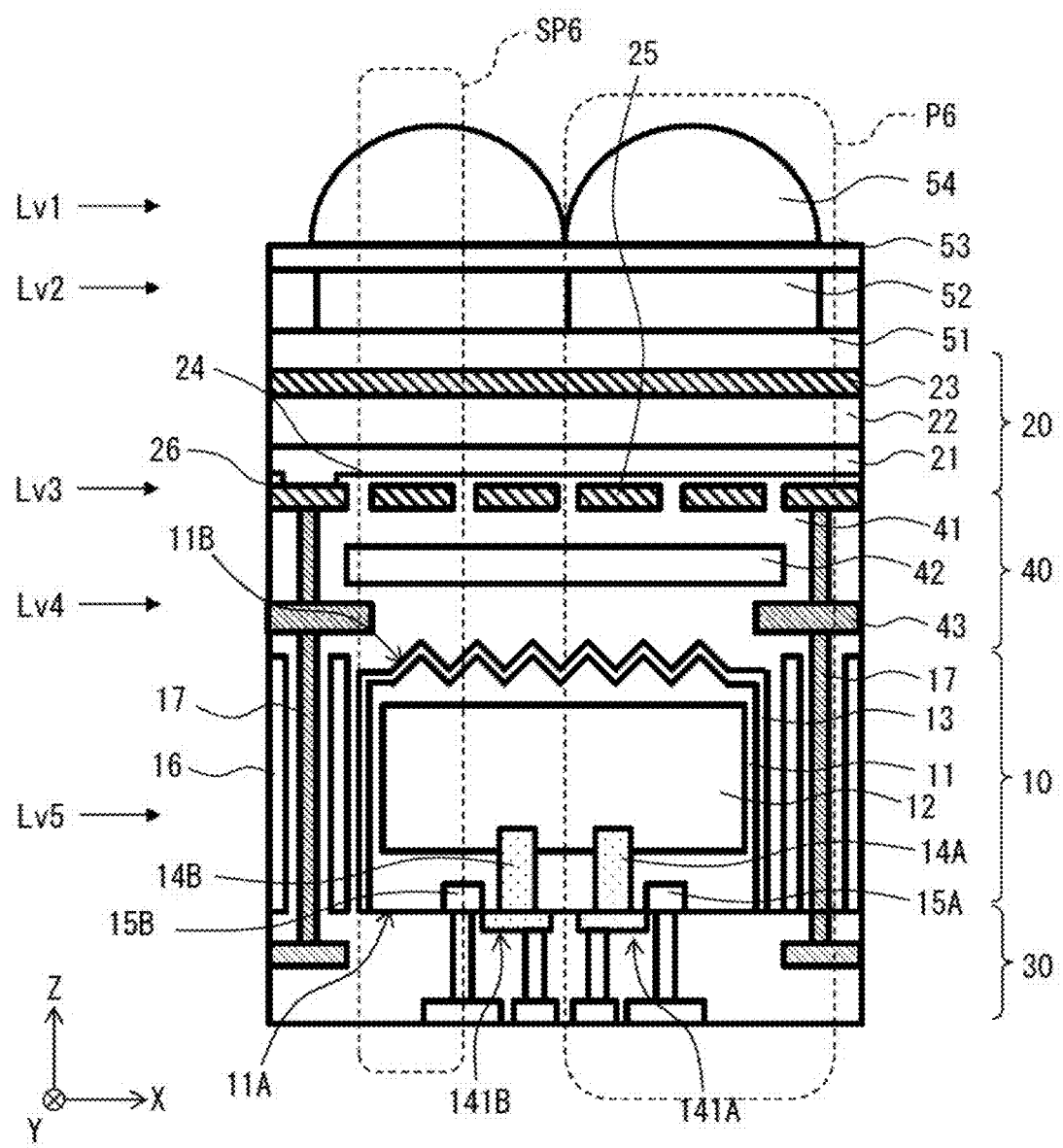
FIG. 22 is a schematic cross-sectional view of an example of an imaging element according to a sixth embodiment of the present disclosure.
Figure 23:
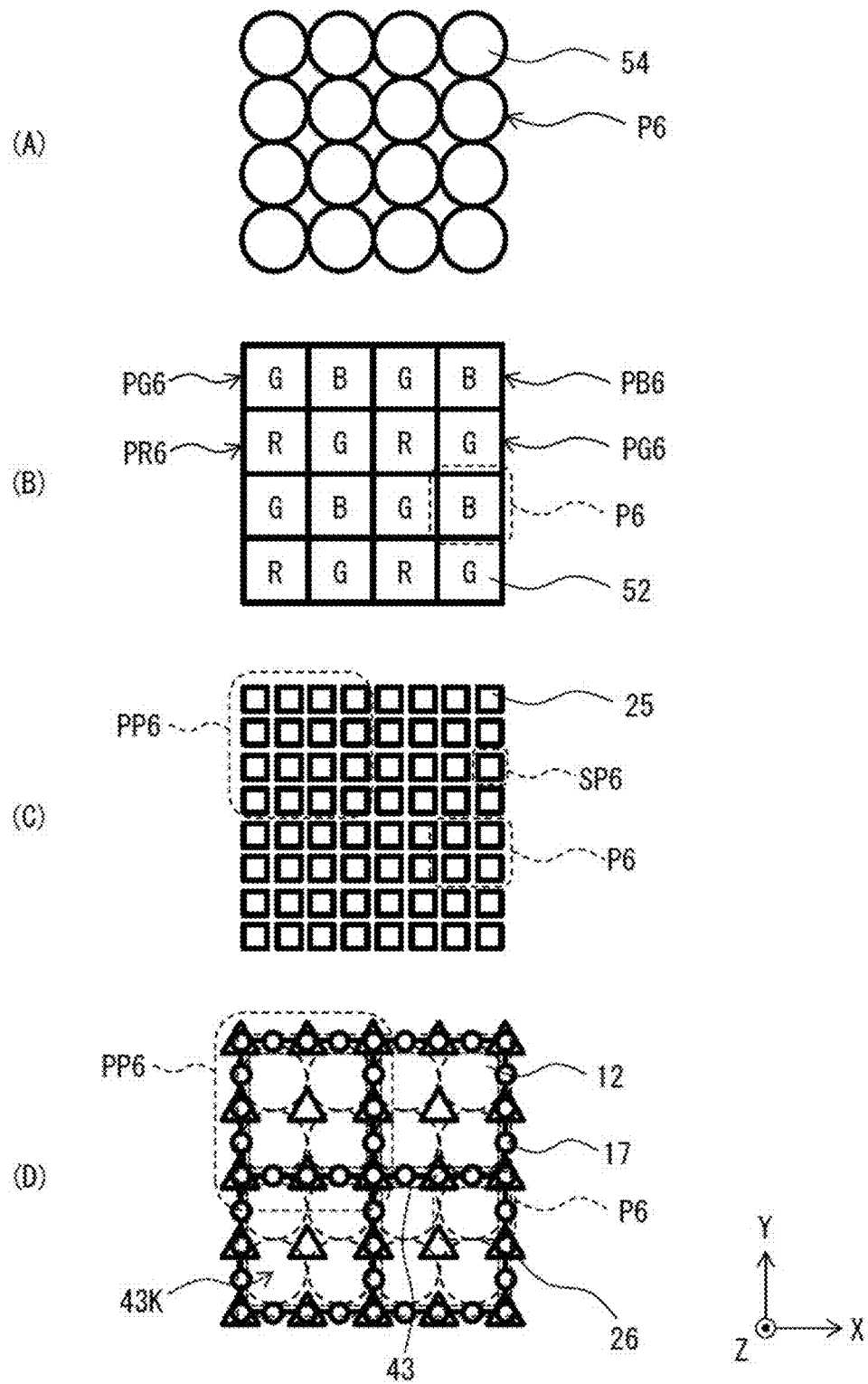
FIG. 23 is a schematic view of an example of an arrangement state of pixels illustrated in FIG. 22.

FIG. 22 schematically illustrates an example of a cross-sectional configuration in a pixel P6 as an imaging element according to a sixth embodiment. FIG. 23 is a schematic view of an example of an arrangement state in an XY plane of a plurality of pixels P6. The pixel P6 is applicable as the pixel P included in the pixel section 100 in the solid-state imaging device 1 illustrated in FIG. 1, as with the pixel P1 as the imaging element according to the first embodiment described above. However, in the present embodiment, as illustrated in FIGS. 22 and 23, one pixel P6 includes four sub-pixels SP4, and each of the sub-pixels SP6 includes one electric charge accumulation electrode 25. In addition, four pixels P6 are included in one pixel group PP6, and share one photoelectric converter 10. Accordingly, in a case where the pixel P6 according to the present embodiment is used as the pixel P illustrated in FIG. 1, as an example, driving of the organic photoelectric converter 20 including one electric charge accumulation electrode 25 may be performed in the sub-pixel SP6 as a unit, and driving of one photoelectric converter 10 may be performed in the pixel group PP6 as a unit.

(A) to (D) of FIG. 23 respectively illustrate arrangement states at height positions corresponding to levels Lv1 to Lv3 and Lv5 in the Z-axis direction illustrated in FIG. 22. That is, (A) of FIG. 23 illustrates an arrangement state of the on-chip lenses 54 in the XY plane, (B) of FIG. 23 illustrates an arrangement state of the color filters 52 in the XY plane, (C) of FIG. 23 illustrates an arrangement state of the electric charge accumulation electrodes 25 in the XY plane, and (D) of FIG. 23 illustrates an arrangement state of the photoelectric conversion regions 12 and the through electrodes 17 in the XY plane. It is to be noted that in FIG. 23, to secure visibility, the readout electrodes 26 are also illustrated in (D). In addition, in (B) of FIG. 23, a sign PR6 indicates the pixel P6 of red, a sign PG6 indicates the pixel P6 of green, and a sign PB6 indicates the pixel P6 of blue.

In the first embodiment described above, in the pixel section 100, one on-chip lens 54, one color filter 52, one electric charge accumulation electrode 25, and one photoelectric conversion region 12 are provided at positions corresponding to each other in the Z-axis direction. In contrast, in the present embodiment, four on-chip lenses 54, four color filters 52, and sixteen electric charge accumulation electrodes 25 are provided, corresponding to one photoelectric conversion region 12, at positions corresponding to each other in the Z-axis direction. More specifically, the on-chip lenses 54 and the color filters 52 are arranged, corresponding to one photoelectric conversion region 12, in two columns in the X-axis direction and two rows in the Y-axis direction, and the electric charge accumulation electrodes 25 are arranged, corresponding to one photoelectric conversion region 12, in four columns in the X-axis direction and four rows in the Y-axis direction. That is, in the present embodiment, as illustrated in FIGS. 22 and 23, four pixels P6 adjacent to each other in both the X-axis direction and the Y-axis direction are included in one pixel group PP6, and share one photoelectric converter 10. The configuration of the pixel P6 is substantially the same as the configuration of the pixel P1, except for this point.

[Workings and Effects of Pixel P6]

The pixel P6 according to the present embodiment has the configuration described above, which makes it possible to simultaneously obtain a visible light image and an infrared light image including distance information at the same position in an in-plane direction. Furthermore, it is possible to obtain image plane phase difference information in the X-axis direction and the Y-axis direction by visible light in each pixel P6.

In addition, in the present embodiment, the through electrodes 17 and the readout electrodes 26 are provided at positions not overlapping vicinities of the centers of the on-chip lenses 54 in the Z-axis direction, which makes it possible to improve infrared light detection sensitivity in each pixel P2.

In addition, even in a case where the plurality of pixels P6 according to the present embodiment is arranged, the central position of each of the opening portions 43K in the inter-pixel region light-shielding film 43 may be shifted from the central position of a corresponding one of the pixels P5. One reason for this is to reduce variations in detection characteristics of the plurality of pixels P6 arranged in the pixel section 100, e.g., to prevent a decrease in detection sensitivity of the pixels P6 arranged in the peripheral portion of the pixel section 100. In this case, the shift amount of the central position of each of the opening portions 43K with respect to the central position of a corresponding one of the pixels P6 may be increased from the center of the pixel section 100 to the peripheral portion of the pixel section 100. In particular, it is preferable that the shift amount be nonlinearly changed from the center of the pixel section 100 to the peripheral portion of the pixel section 100.

Furthermore, a spacing between adjacent pixels P6 may be increased from the center of the pixel section 100 to the peripheral portion of the pixel section 100. In particular, it is preferable that the spacing be nonlinearly changed from the center of the pixel section 100 to the peripheral portion of the pixel section 100. Doing so makes it possible to perform pupil correction in accordance with each image height in the plurality of pixels P6 arranged in the pixel section 100, for example.

Figure 24:
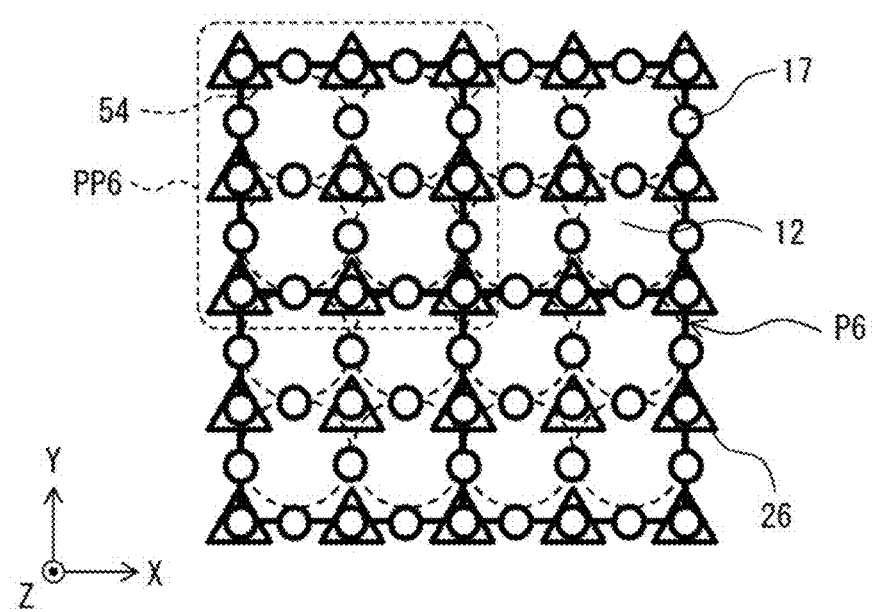
FIG. 24 is a schematic view of a modification example of the arrangement state of the pixels illustrated in FIG. 22.

It is to be noted that FIG. 23 is an example, and the arrangement positions of the through electrodes 17 and the arrangement positions of the readout electrodes 26 in the plurality of pixels P6 arranged in the pixel section 100 of the present disclosure are not limited thereto. For example, as illustrated in FIG. 24, the through electrodes 17 may be disposed in proximity to boundaries between adjacent pixel groups PP6 to surround each of the on-chip lenses 54. FIG. 24 schematically illustrates a modification example of the arrangement state of the plurality of pixels P6 in the pixel section 100.

7. Seventh Embodiment

[Configuration of Pixel P7]

Figure 25:
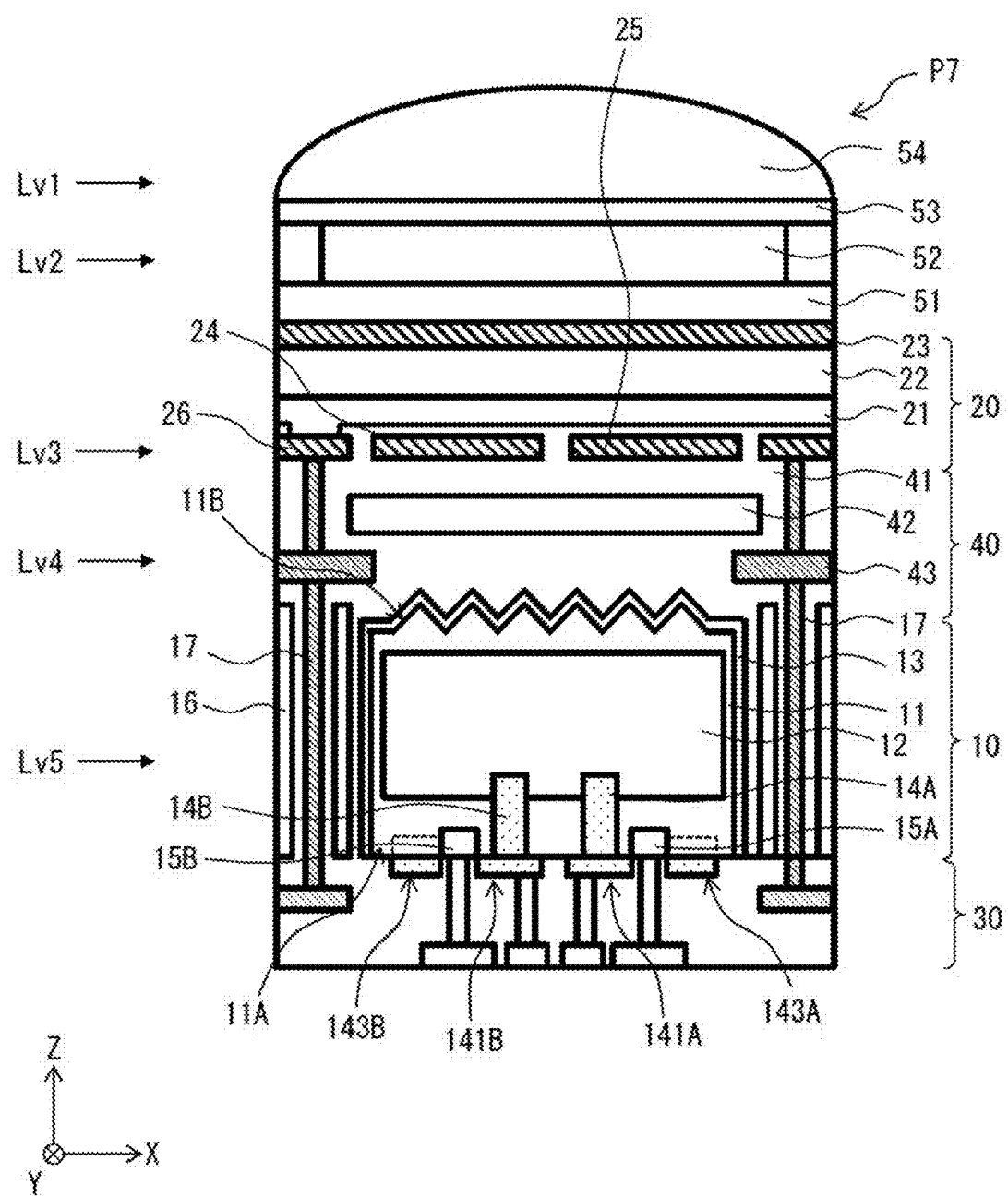
FIG. 25 is a schematic cross-sectional view of an example of an imaging element according to a seventh embodiment of the present disclosure.

FIG. 25 schematically illustrates an example of a cross-sectional configuration in a pixel P7 as an imaging element according to a seventh embodiment. The pixel P7 is applicable as the pixel P included in the pixel section 100 in the solid-state imaging device 1 illustrated in FIG. 1, as with the pixel P1 as the imaging element according to the first embodiment described above.

The pixel P7 according to the present embodiment further includes a pair of electric charge holding sections (MEMs) 143A and 143B on the front surface 11A of the semiconductor substrate 11, in addition to the configuration of the pixel P1. The MEMs 143A and 143B are regions where electric charges generated and accumulated in the photoelectric conversion region 12 are temporarily held to share the FDs 15A and 15B with other pixels. The configuration of the pixel P7 is substantially the same as the configuration of the pixel P1, except for this point. It is to be noted that the MEMs 143A and 143B have a configuration in which an insulating film and an electrode are stacked from the side of the front surface 11A. In addition, a configuration or the like may be adopted in which floating diffusion layers of 15A and 15B are removed, the electric charge holding sections 143A and 143B are provided next to the TGs 141A and 141B, and the FDs 15A and 15B are provided next to the electric charge holding sections 143A and 143B. It is to be noted that the MEMs 143A and 143B are appropriately applicable to any pixels described as respective embodiments and modification examples in the present specification, other than the pixel P7 according to the present embodiment.

[Workings and Effects of Pixel P7]

According to the pixel P7 according to the present embodiment, the photoelectric converter 10 includes the MEMS 143A and 143B, which makes it possible to share the floating diffusion layers of 15A and 15B, thereby improving installation efficiency of the imaging element on the semiconductor substrate. For example, increasing the area of an amplifier transistor makes it possible to improve noise characteristics of a photoelectric conversion film. In addition, the pixel P7 has workings and effects similar to those of the pixel P1 according to the first embodiment described above.

8. Eighth Embodiment

Figure 26:
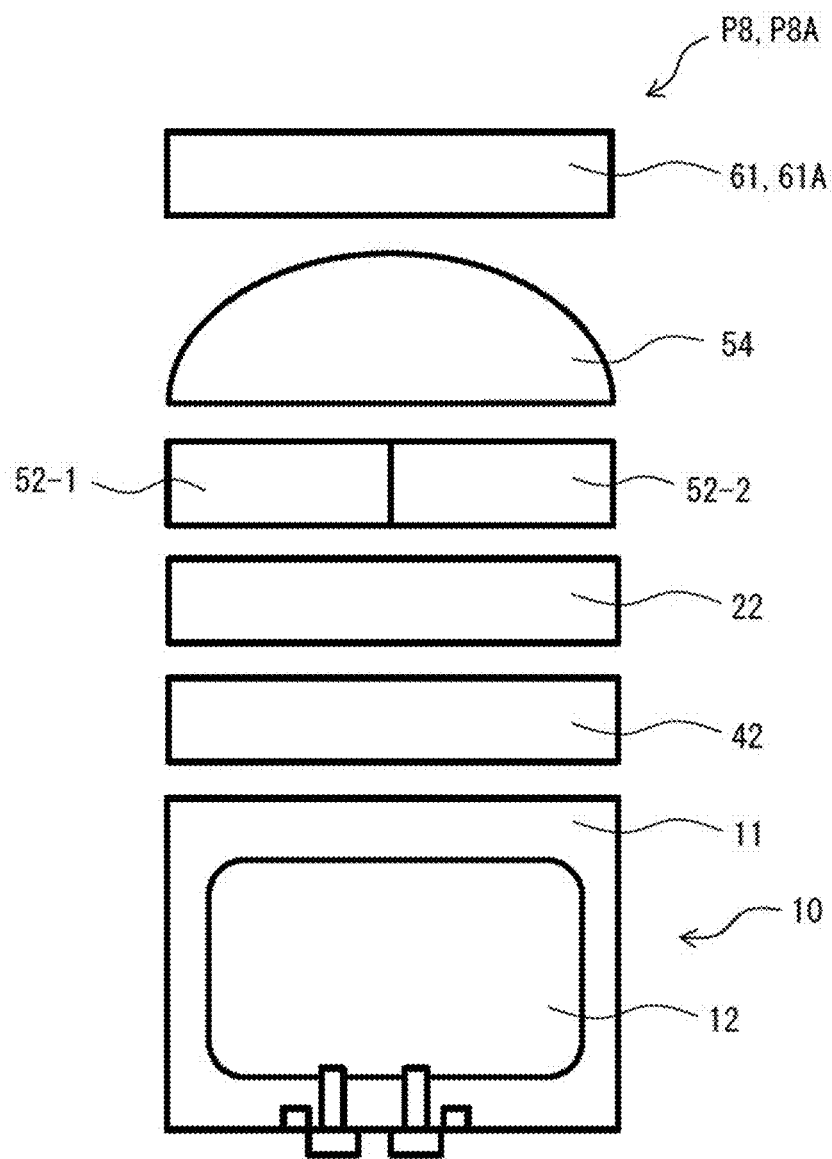
FIG. 26 is a schematic cross-sectional view of an example of an imaging element according to an eighth embodiment of the present disclosure.

FIG. 26 schematically illustrates an example of a cross-sectional configuration of a pixel P8 as an imaging element according to an eighth embodiment. The pixel P8 is applicable as the pixel P included in the pixel section 100 in the solid-state imaging device 1 illustrated in FIG. 1, as with the pixel P1 as the imaging element according to the first embodiment described above.

The pixel P8 according to the present embodiment further includes an optical filter 61 on incident side of the on-chip lens 54, that is, on side opposite to the organic photoelectric converter 20 as viewed from the on-chip lens 54, in addition to the configuration of the pixel P1 described in the first embodiment described above. Note that FIG. 26 illustrates an example in which a plurality of color filters 52 of colors different from each other are arranged corresponding to one optical filter 61, one on-chip lens 54, one organic photoelectric conversion layer 22, one optical filter 42, and one photoelectric conversion region 12. For the sake of convenience, FIG. 26 illustrates a color filter 52-1 and a color filter 52-2 of colors different from each other. The configuration of the pixel P8 is substantially the same as the configuration of the pixel P1, except for this point. It is to be noted that the pixel P8 is not limited to that illustrated in FIG. 26. For example, one color filter 52 may be provided corresponding to one optical filter 61, or a plurality of on-chip lenses 54, a plurality of organic photoelectric conversion layers 22, a plurality of optical filters 42, and a plurality of photoelectric conversion regions 12 may be provided corresponding to one optical filter 61. It is to be noted that the organic photoelectric conversion layer 22 may be provided common to some pixels P8, or may be provided common to all of a plurality of pixels P8 in the pixel section 100. Alternatively, one optical filter 61 may be provided over a plurality of pixels P8. It is to be noted that the optical filter 61 is applicable to any of the pixels P1 to P7 described in the first to seventh embodiments described above and the modification examples thereof.

Figure 27A:
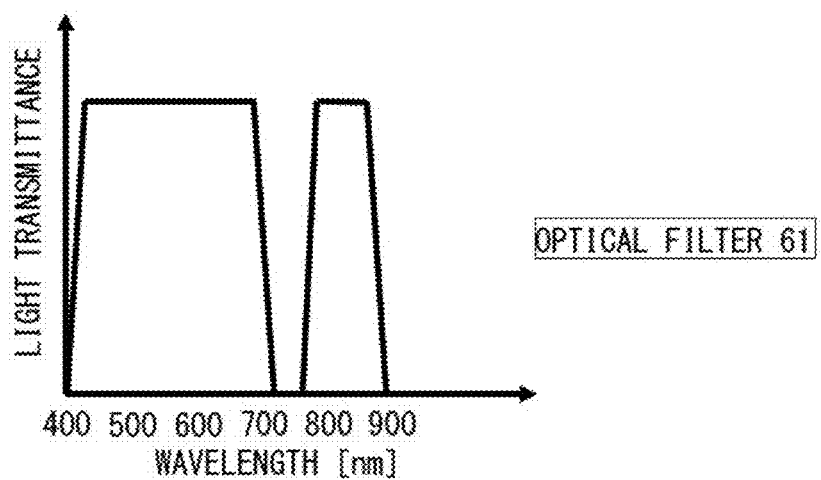
FIG. 27A is a characteristic diagram illustrating a light transmittance distribution of a dual bandpass filter in the imaging element illustrated in FIG. 26.
Figure 27B:
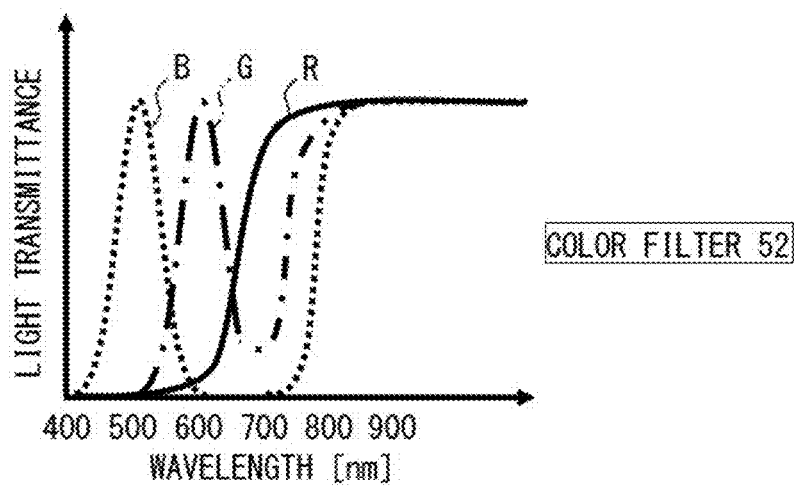
FIG. 27B is a characteristic diagram illustrating a light transmittance distribution of a color filter in the imaging element illustrated in FIG. 26.
Figure 27C:
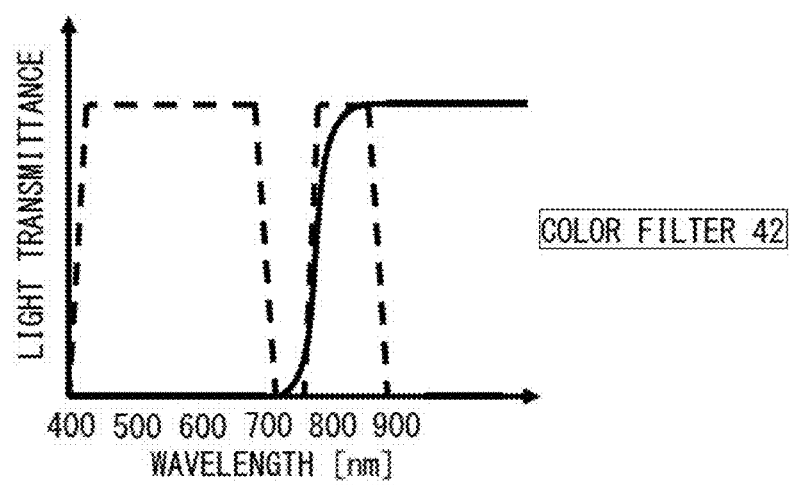
FIG. 27C is a characteristic diagram illustrating a light transmittance distribution of an optical filter in the imaging element illustrated in FIG. 26.
Figure 27D:
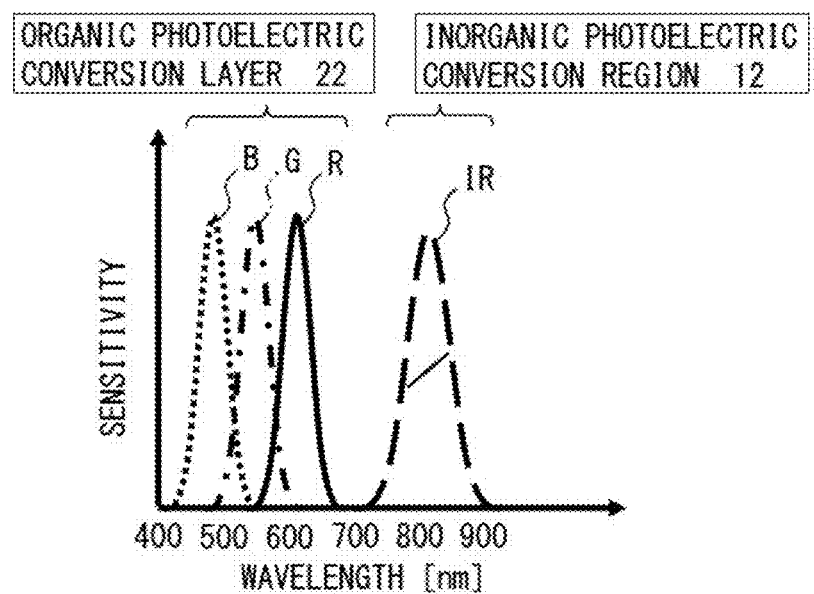
FIG. 27D is a characteristic diagram illustrating wavelength dependence of sensitivity of an organic photoelectric conversion layer and wavelength dependence of sensitivity of a photoelectric conversion region in the imaging element illustrated in FIG. 26.

FIGS. 27A to 27C respectively schematically illustrates wavelength dependence of light transmittance of the optical filter 61, the color filter 52, and the optical filter 42 in the pixel P8. Specifically, FIG. 27A illustrates a light transmittance distribution of the optical filter 61, FIG. 27B illustrates a light transmittance distribution of the color filter 52, and FIG. 27C illustrates a light transmittance distribution of the optical filter 42. Furthermore, FIG. 27D illustrates each of a relationship between a wavelength incident on the organic photoelectric conversion layer 22 and sensitivity to incident light on the organic photoelectric conversion layer 22, and a relationship between a wavelength incident on the photoelectric conversion region 12 and sensitivity to incident light on the photoelectric conversion region 12. It is to be noted that in FIG. 27B, a light transmittance distribution curve of the red color filter 52R is indicated by R, a light transmittance distribution curve of the green color filter 52G is indicated by G, and a light transmittance distribution curve of the blue color filter 52B is indicated by B. In addition, in FIG. 27C, the light transmittance distribution of the optical filter 61 is illustrated by a broken line, and the light transmittance distribution of the optical filter 42 is illustrated by a solid line. The optical filter 61 is a so-called dual bandpass filter, and is an optical member that has a transmission wavelength range in both the visible light range and the infrared light range, and selectively allows visible light (e.g., light having a wavelength of 400 nm to 650 nm both inclusive) and a portion of infrared light (e.g., light having a wavelength of 800 nm to 900 nm both inclusive) to pass therethrough. Of incident light, the visible light and the portion of the infrared light pass through the optical filter 61 (FIG. 27A). Of light having passed through the optical filter 61, visible light in a blue region and the portion of infrared light pass through the blue color filter 52B (FIG. 27B). In a case where the organic photoelectric conversion layer 22 is configured to detect some or all of wavelengths in the visible light range and have no sensitivity to the infrared light range, of light having passed through the blue color filter 52B, the visible light in the blue region is absorbed by the organic photoelectric conversion layer 22, and of the light having passed through the blue color filter 52B, the portion of the infrared light passes through the organic photoelectric conversion layer 22. Of light having passed through the organic photoelectric conversion layer 22, the infrared light having passed through the optical filter 42 is incident on the photoelectric conversion region 12. The same applies to the red color filter 52R and the green color filter 52G. As a result, as illustrated in FIG. 27D, visible light information (R, G, B) is obtained in the organic photoelectric conversion layer 22, and infrared light information (IR) is obtained in the photoelectric conversion region 12. As illustrated in FIGS. 27A to 27D, according to the pixel P8, only infrared light in a predetermined wavelength range having passed through all of the optical filter 61, the color filter 52, the organic photoelectric conversion layer 22, and the optical filter 42 is selectively incident on the photoelectric conversion region 12, and is photoelectrically converted.

Figure 28A:
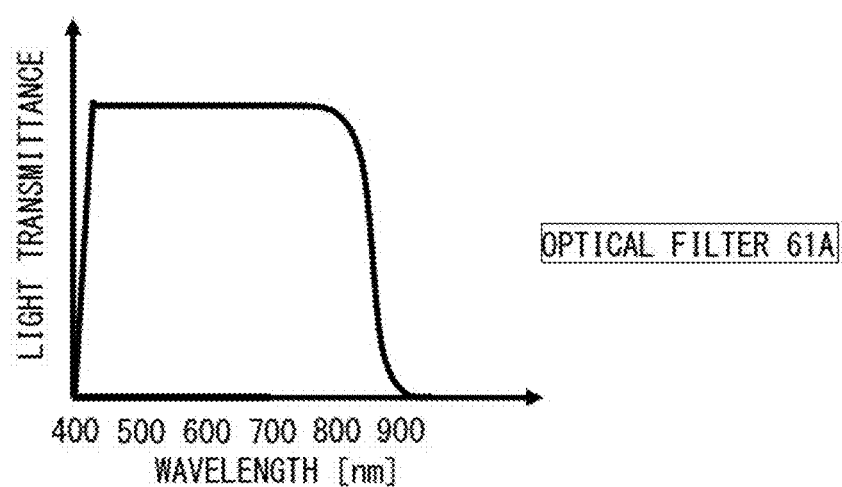
FIG. 28A is a characteristic diagram illustrating a light transmittance distribution of a dual bandpass filter in a modification example of the imaging element illustrated in FIG. 26.
Figure 28B:
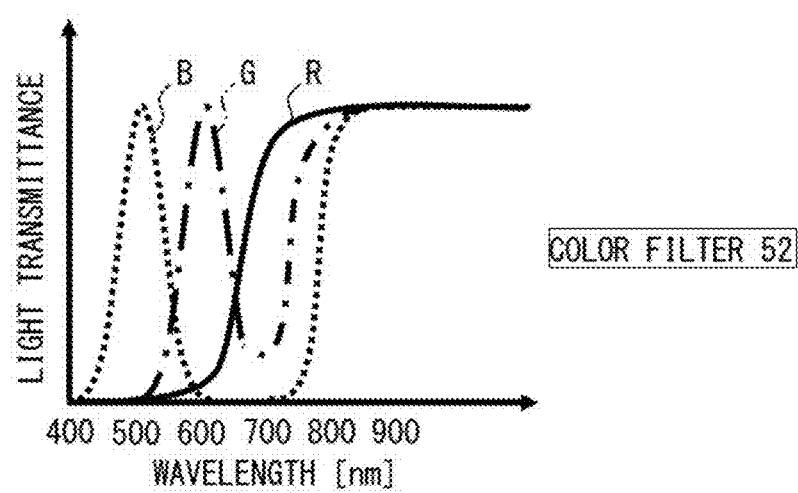
FIG. 28B is a characteristic diagram illustrating a light transmittance distribution of a color filter in the modification example of the imaging element illustrated in FIG. 26.
Figure 28C:
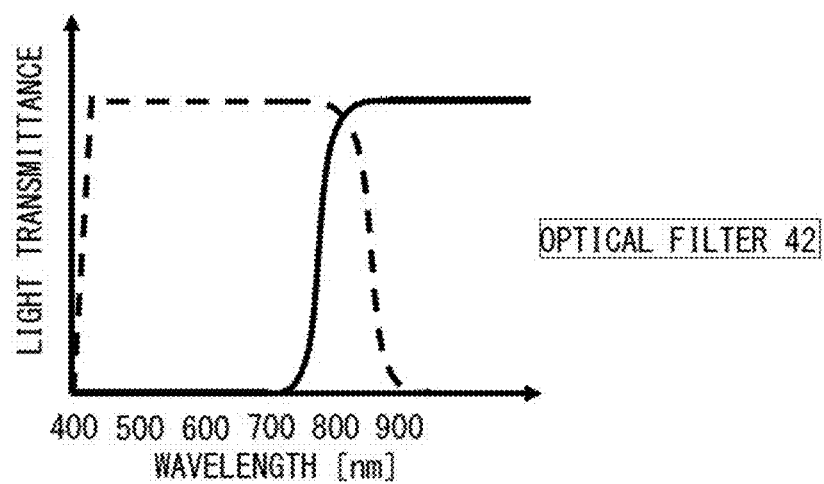
FIG. 28C is a characteristic diagram illustrating a light transmittance distribution of an optical filter in the modification example of the imaging element illustrated in FIG. 26.
Figure 28D:
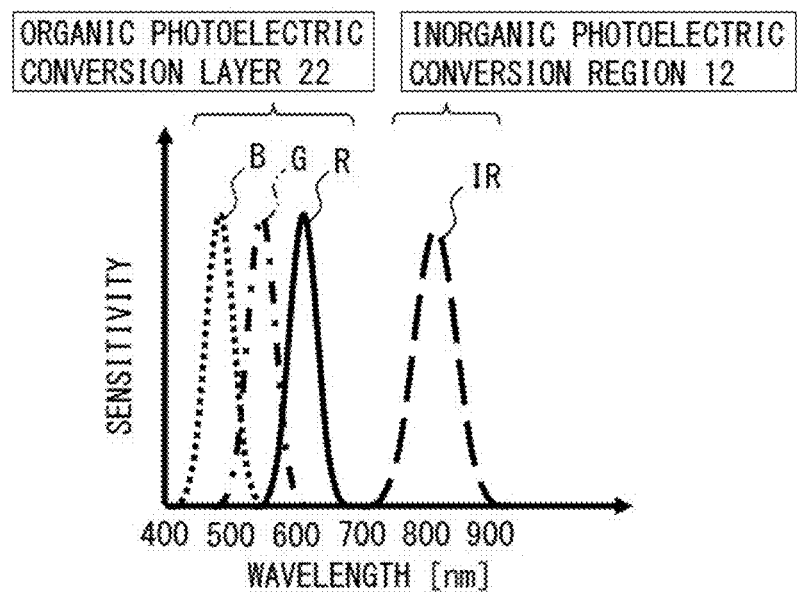
FIG. 28D is a characteristic diagram illustrating wavelength dependence of sensitivity of an organic photoelectric conversion layer and wavelength dependence of sensitivity of a photoelectric conversion region in the modification example of the imaging element illustrated in FIG. 26.

It is to be noted that characteristics in FIGS. 27A to 27D are examples, and a light transmittance distribution of an optical filter applicable to the pixel P8 is not limited to those in FIGS. 27A to 27D. For example, like an optical filter 61A as a modification example illustrated in FIGS. 28A to 28D, an optical filter may be adopted that selectively allows light in a continuous wavelength range from the visible light range to a portion of the infrared light range to pass therethrough. Specifically, FIG. 28A illustrates a light transmittance distribution of the optical filter 61A, FIG. 28B illustrates the light transmittance distribution of the color filter 52, and FIG. 28C illustrates the light transmittance distribution of the optical filter 42. Furthermore, FIG. 28D illustrates each of a relationship between a wavelength incident on the organic photoelectric conversion layer 22 and sensitivity to incident light on the organic photoelectric conversion layer 22 and a relationship between a wavelength incident on the photoelectric conversion region 12 and sensitivity to incident light on the photoelectric conversion region 12 in a case where the optical filter 61A is used.

9. Ninth Embodiment

FIG. 29 schematically illustrates an example of a cross-sectional configuration of a pixel P9 as an imaging element according to a ninth embodiment. The pixel P9 is applicable as the pixel P included in the pixel section 100 in the solid-state imaging device 1 illustrated in FIG. 1, as with the pixel P1 as the imaging element according to the first embodiment described above.

The pixel P9 according to the present embodiment further includes an inner lens INL between the organic photoelectric converter 20 and the photoelectric converter 10, more specifically between the organic photoelectric conversion layer 22 and the optical filter 42, in addition to the configuration of the pixel P8 described in the eighth embodiment described above. The configuration of the pixel P9 is substantially the same as the configuration of the pixel P8, except for this point. It is to be noted that the configuration in which the inner lens INL is provided between the organic photoelectric conversion layer 22 and the optical filter 42 is applicable to any of the pixels P1 to P7 described in the first to seventh embodiments described above and the modification examples thereof.

Figure 30:
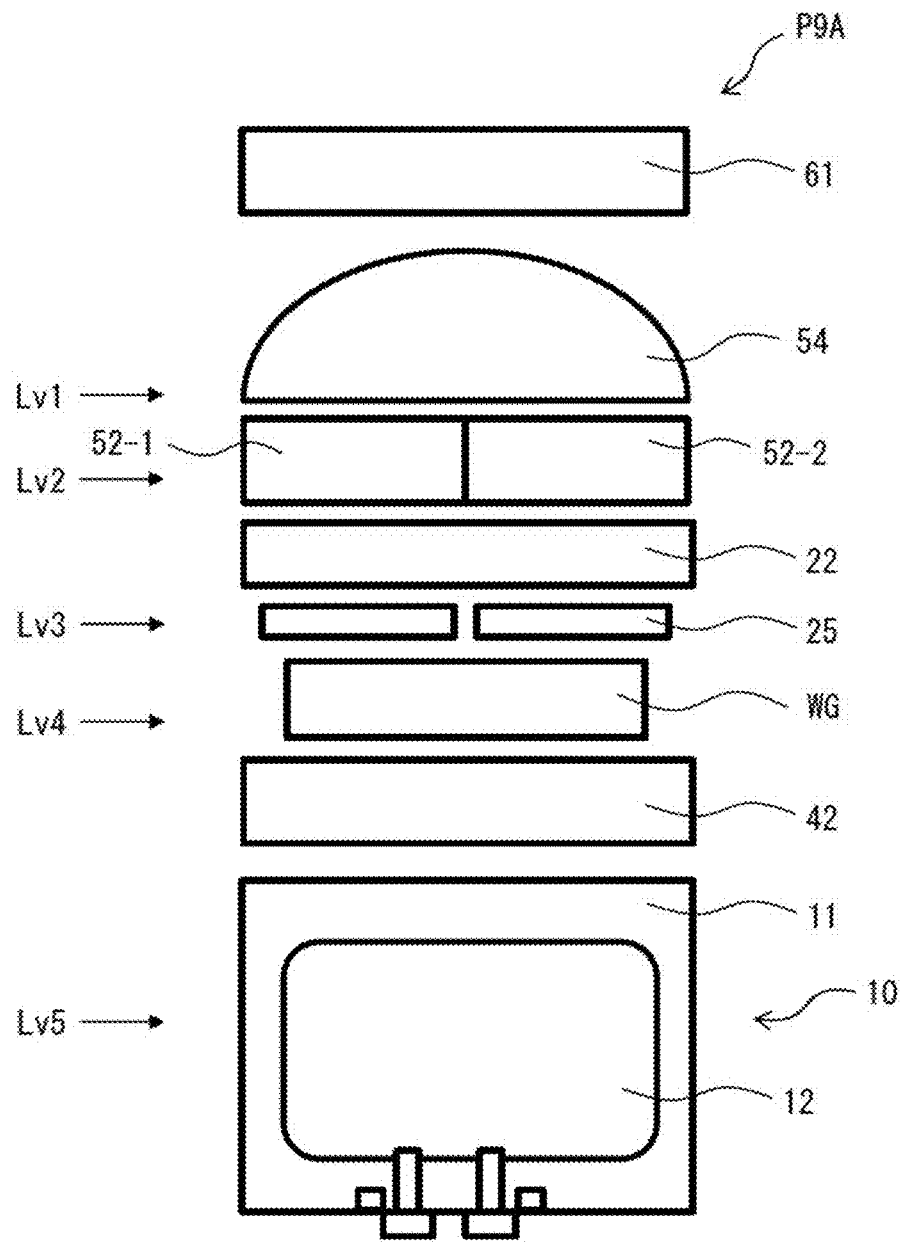
FIG. 30 is a schematic cross-sectional view of an example of the imaging element according to the ninth embodiment of the present disclosure.

In addition, like a pixel P9A illustrated in FIG. 30, a light waveguide WG may be provided in place of the inner lens INL. FIG. 30 is a schematic view of a cross-sectional configuration of the pixel P9A as an imaging element that is a modification example of the ninth embodiment. It is to be noted that the configuration in which the light waveguide WG is provided between the organic photoelectric conversion layer 22 and the optical filter 42 is applicable to any of the pixels P1 to P7 described in the first to seventh embodiments described above and the modification examples thereof.

Figure 31:
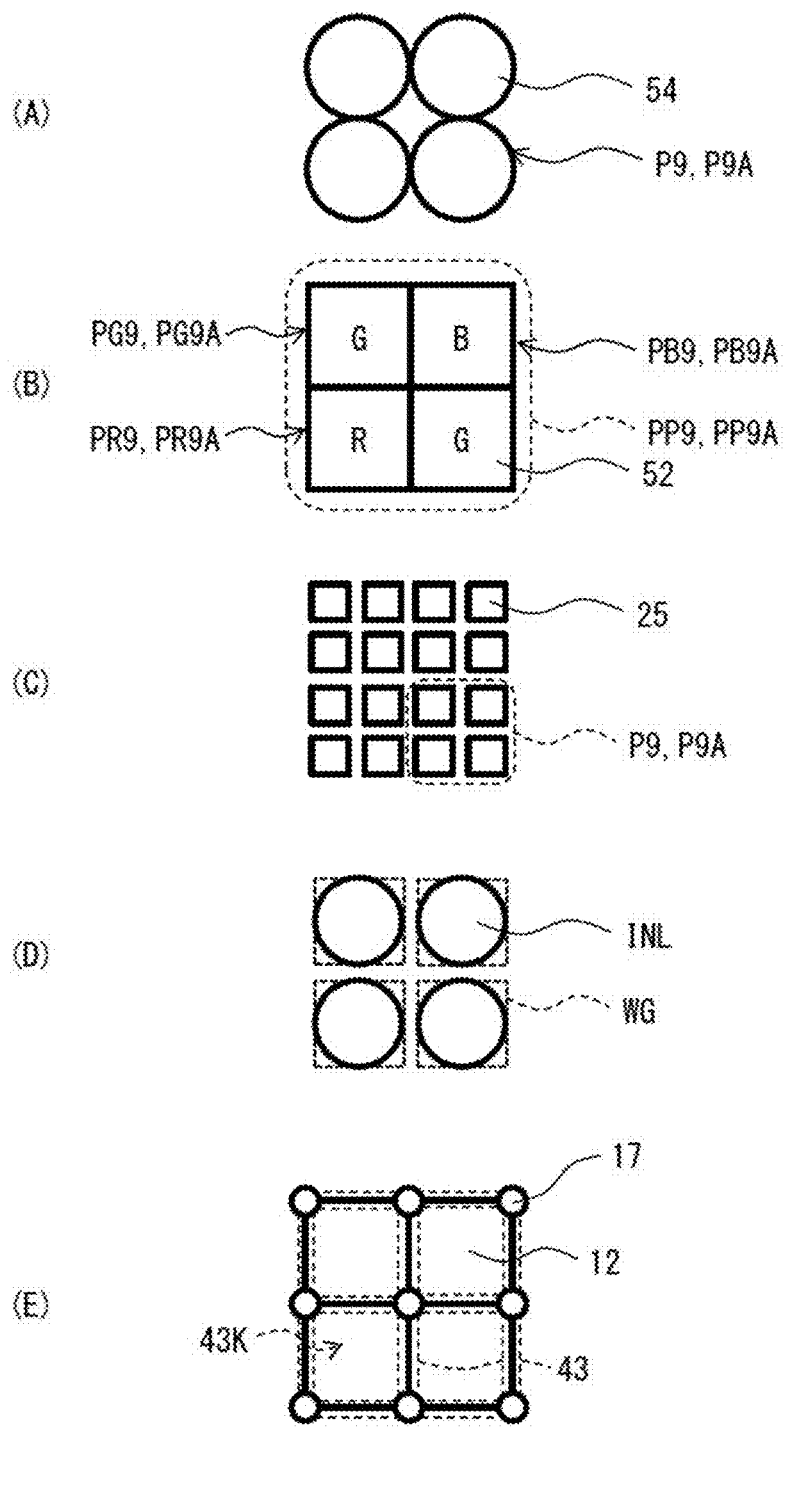
FIG. 31 is a schematic view of an example of an arrangement state of pixels illustrated in FIGS. 29 and 30.

FIG. 31 is a schematic view of an example of an arrangement state in an XY plane of a plurality of pixels P9 or P9A. (A) to (E) of FIG. 31 respectively illustrate arrangement states at height positions corresponding to levels Lv1 to Lv5 in the Z-axis direction illustrated in FIGS. 29 and 30. That is, (A) of FIG. 31 illustrates an arrangement state of the on-chip lenses 54 in the XY plane, (B) of FIG. 31 illustrates an arrangement state of the color filters 52 in the XY plane, (C) of FIG. 31 illustrates an arrangement state of the electric charge accumulation electrodes 25 in the XY plane, (D) of FIG. 13 illustrates an arrangement state of the inner lenses INL or the light waveguides WG in the XY plane, and (E) of FIG. 31 illustrates an arrangement state of the photoelectric conversion regions 12 and the through electrodes 17 in the XY plane. In addition, in (B) of FIG. 31, signs PR9 and PR9A respectively indicate the pixels P9 and P9A of red, signs PG9 and PG9A respectively indicate the pixels P9 and P9A of green, and signs PB9 and PB9A respectively indicate the pixels P9 and P9A of blue. It is to be noted that in (E) of FIG. 31, the through electrodes 17 are disposed in proximity to boundaries between adjacent photoelectric conversion regions 12 at four corners in each of the photoelectric conversion regions 12; however, the arrangement positions of the through electrodes 17 are not limited thereto. For example, the through electrodes 17 may be disposed at midpoints of four corners in each of the photoelectric conversion regions 12. Alternatively, the through electrodes 17 may be disposed in proximity to boundaries between adjacent photoelectric conversion regions 12 at both four corners in each of the photoelectric conversion regions 12 and midpoints of the four corners in each of the photoelectric conversion regions 12. In addition, (E) of FIG. 31 illustrates the inter-pixel region light-shielding film 43; however, the pixels P9 and P9A that are the present embodiment and the modification example thereof may not include the inter-pixel region light-shielding film 43.

In the pixels P9 and 9A according to the present embodiment and the modification example thereof, the inner lens INL or the light waveguide WG is provided, which makes it possible to avoid even vignetting of incident light oblique to the back surface 11B, which extends in the XY plane, in the inter-pixel region light-shielding wall 16, for example, and makes it possible to improve oblique incidence characteristics.

Figure 32A:
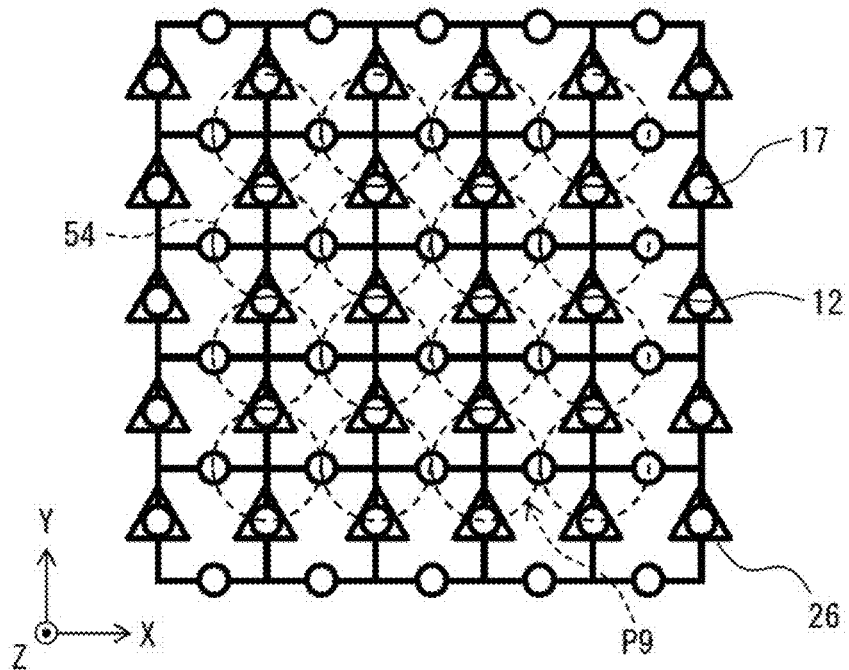
FIG. 32A is a first schematic view of a modification example of the arrangement state of the pixels illustrated in FIG. 31.
Figure 32B:
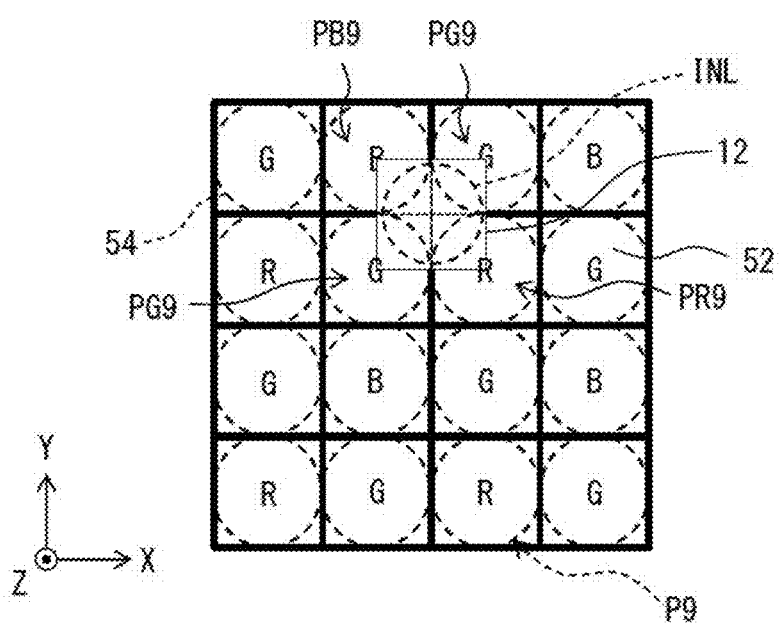
FIG. 32B is a second schematic view of a modification example of the arrangement state of the pixels illustrated in FIG. 31.

Furthermore, as illustrated in FIGS. 32A and 32B, in each pixel P9, for example, the central position of the color filter 52 and the central position of the photoelectric conversion region 12 may be displaced by a half in both the X-axis direction and the Y-axis direction. On this occasion, it is preferable that the arrangement position of the inner lens INL also be shifted in accordance with the arrangement position of the photoelectric conversion region 12. Doing so makes it possible to reduce variations in light reception sensitivity to infrared light in each photoelectric conversion region 12 and prevent color mixture between adjacent pixels P9. It is to be noted that FIGS. 32A and 32B schematically illustrate a modification example of the arrangement state of the plurality of pixels P9 in the pixel section 100. FIG. 32A specifically illustrates a positional relationship among the on-chip lenses 54, the photoelectric conversion regions 12, the through electrodes 17, and the readout electrodes 26. FIG. 32B specifically illustrates a positional relationship among the on-chip lenses 54, the color filters 52, the inner lenses INL, and the photoelectric conversion regions 12. The same applies to the pixel 9A using the light waveguide WG in place of the inner lens INL. Furthermore, even in a case where the inner lens INL and the light waveguide WG are not used, as with forms illustrated in FIGS. 32A and 32B, the central position of the color filter 52 and the central position of the photoelectric conversion region 12 may be displaced by a half in both the X-axis direction and the Y-axis direction. It is to be noted that the arrangement positions of the through electrodes 17 and the arrangement positions of the readout electrodes 26 in the plurality of pixels P9 and P9A are not limited to the arrangement positions illustrated in FIG. 31 and FIG. 32A.

10. Tenth Embodiment

Figure 33A:
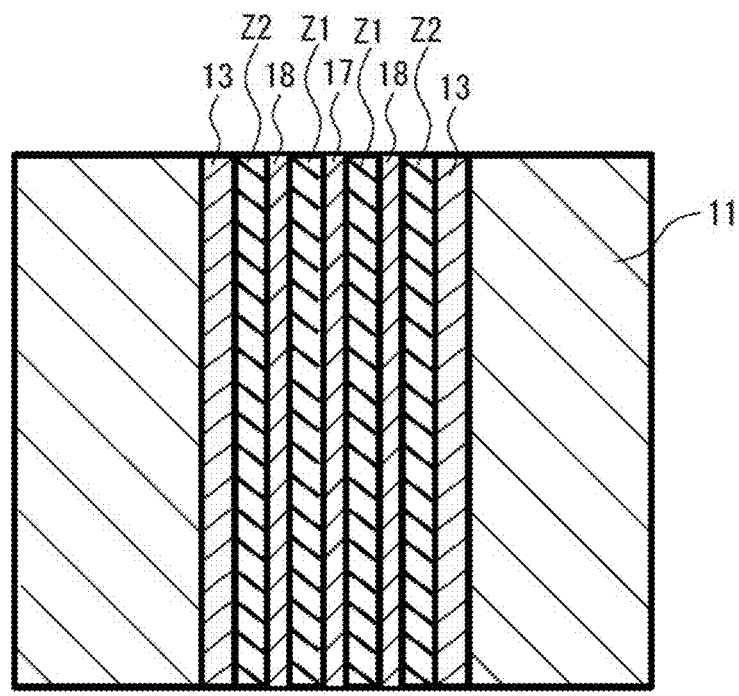
FIG. 33A is a schematic enlarged cross-sectional view of a through electrode and its surroundings in an imaging element according to a tenth embodiment of the present disclosure.
Figure 33B:
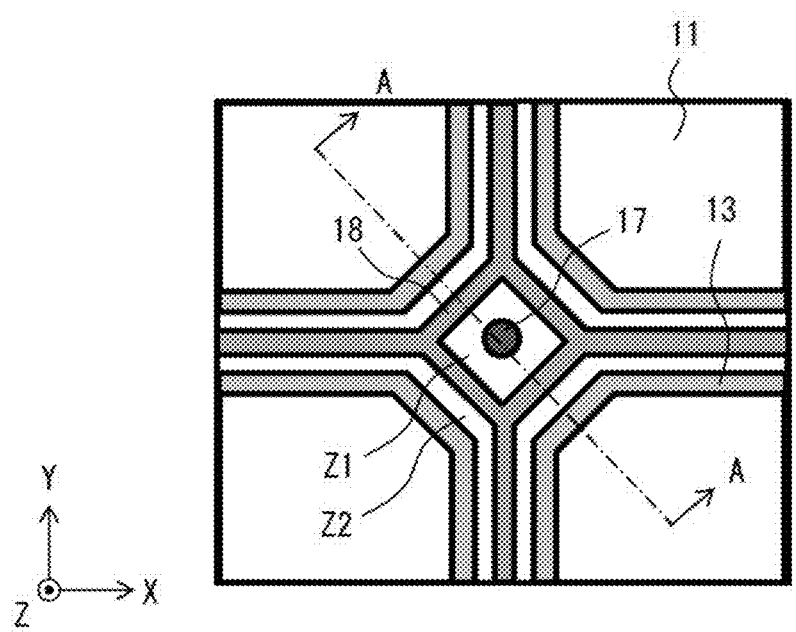
FIG. 33B is a schematic enlarged plan view of the through electrode and its surroundings in the imaging element according to the tenth embodiment of the present disclosure.

FIGS. 33A and 33B are respectively an enlarged vertical cross-sectional view and an enlarged horizontal cross-sectional view of a vicinity of the through electrode 17 in an imaging element as a tenth embodiment. It is to be noted that FIG. 33A illustrates a cross-section taken along a cutting line A-A illustrated in FIG. 33B. A configuration according to the present embodiment is applicable to any of the pixels P1 to P9 in the first to ninth embodiments described above and the pixels as the modification examples thereof.

The present embodiment has a configuration in which, a metal layer 18 is provided to surround the through electrode 17 in an XY cross section and extend in the Z-axis direction. The through electrode 17 and the metal layer 18 are electrically insulated from each other by an insulating layer Z1 that is provided to fill in a gap between the through electrode 17 and the metal layer 18. The metal layer 18 may also serve as the inter-pixel region light-shielding wall 16, for example. The fixed electric charge layer 13 is provided outside the metal layer 18 with the insulating layer Z2 interposed therebetween.

The through electrode 17 is formed using, for example, tungsten (W) or the like. In addition, the metal layer 18 is formed using, for example, tungsten (W). However, it is possible to use aluminum or the like for the metal layer 18. The insulating layers Z1 and Z2 are formed using, for example, an insulating material such as SiOx (silicon oxide) and aluminum oxide. In addition, a gap between the inter-pixel region light-shielding wall 16 and the through electrode 17 may be provided in place of the insulating layer Z1 to insulate the inter-pixel region light-shielding wall 16 and the through electrode 17 from each other. Likewise, a gap may be provided between the inter-pixel region light-shielding wall 16 and the fixed electric charge layer 13 in place of the insulating layer Z2 to insulate the inter-pixel region light-shielding wall 16 and the fixed electric charge layer 13 from each other. It is to be noted that constituent materials of respective components are not limited to those described above.

The through electrode 17 is, for example, a transmission path where signal electric charges generated in the organic photoelectric converter 20 are transmitted and a voltage that drives the electric charge accumulation electrode 25 is transmitted. The metal layer 18 is an inter-pixel region light-shielding wall as well as an electrostatic shielding film. In a case where the metal layer 18 is not present, a positive voltage is applied to the through electrode 17 when the fixed electric charge layer 13 has, for example, a negative fixed electric charge, which may impair functions of the fixed electric charge layer 13, thereby resulting in generation of a dark current. Accordingly, the metal layer 18 is provided to electrically shield the through electrode 17 and the fixed electric charge layer 13, which makes it possible to suppress such generation of the dark current. It is to be noted that it is possible to replace a portion, other than a portion surrounding the through electrode 17, of the metal layer 18 illustrated in FIG. 33B with a material having a light-shielding property and having non-electric conductivity. One reason for this is that the metal layer 18 of which the portion surrounding the through electrode 17 is formed using a metal material such as tungsten and aluminum achieves effects of the electrostatic shielding film described above. Furthermore, in a case where the metal layer 18 is provided as the electrostatic shielding film, the portion, other than the portion surrounding the through electrode 17, of the metal layer 18 may not be provided.

Figure 34A:
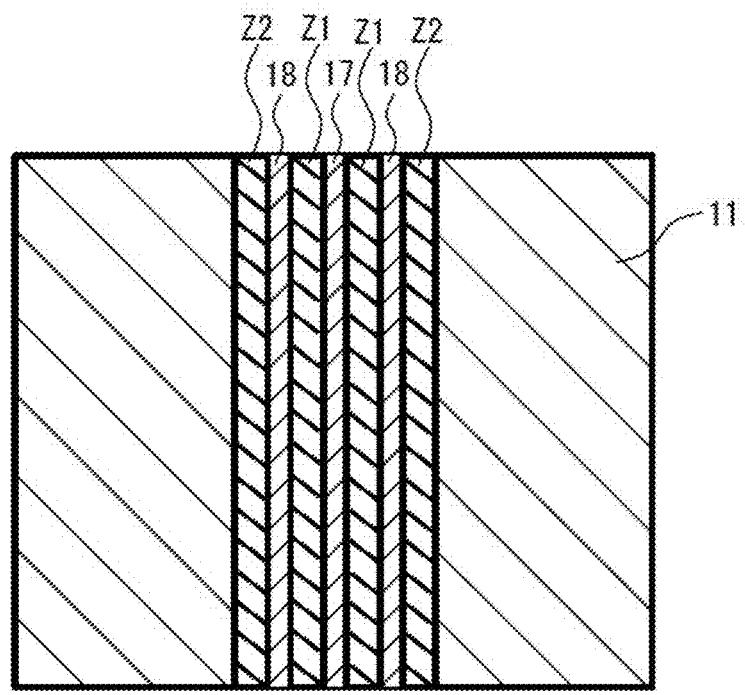
FIG. 34A is a schematic enlarged cross-sectional view of another configuration example of details of the through electrode and its surroundings in the imaging element according to the tenth embodiment of the present disclosure.
Figure 34B:
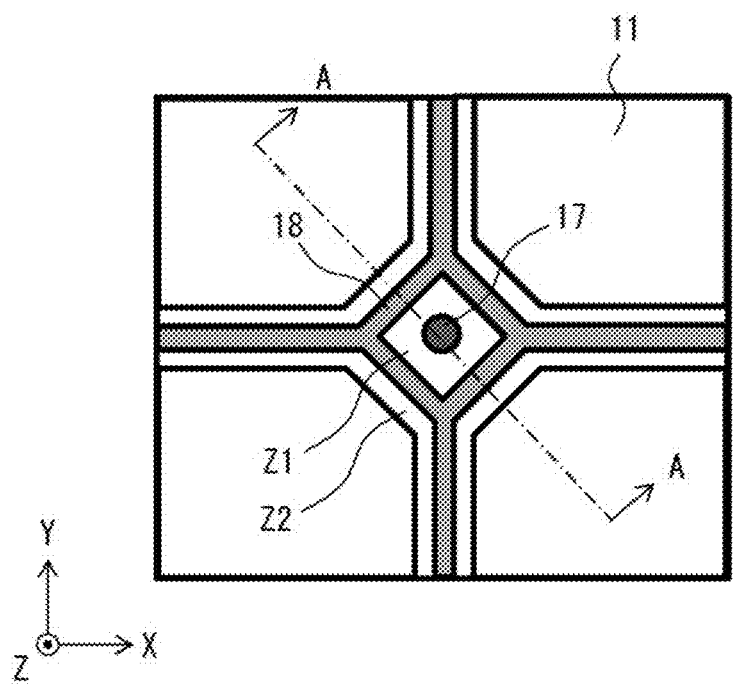
FIG. 34B is a schematic enlarged plan view of another configuration example of details of the through electrode and its surroundings in the imaging element according to the tenth embodiment of the present disclosure.

In addition, the vicinity of the through electrode 17 may have a configuration illustrated in FIGS. 34A and 34B. The configuration illustrated in FIGS. 34A and 34B is the same as the configuration illustrated in FIGS. 33A and 33B, except that the fixed electric charge layer 13 opposed to the metal layer 18 with the insulating layer Z2 interposed therebetween is not included. The metal layer 18 is an inter-pixel region light-shielding wall, and shields an electric field of the through electrode to prevent a voltage to be applied to the through electrode 17 from affecting the semiconductor substrate 11. Furthermore, applying an appropriate voltage to the metal layer 18 makes it possible to achieve effects similar to the fixed electric charge layer. Furthermore, it is possible to replace the portion, other than the portion surrounding the through electrode 17, of the metal layer 18 illustrated in FIG. 34B with a material having a light-shielding property and having non-electric conductivity. It is to be noted that even in the configuration illustrated in FIGS. 34A and 34B, it is preferable that the fixed electric charge layer 13 on the side of the back surface 11B of the semiconductor substrate 11 be provided.

Figure 35:
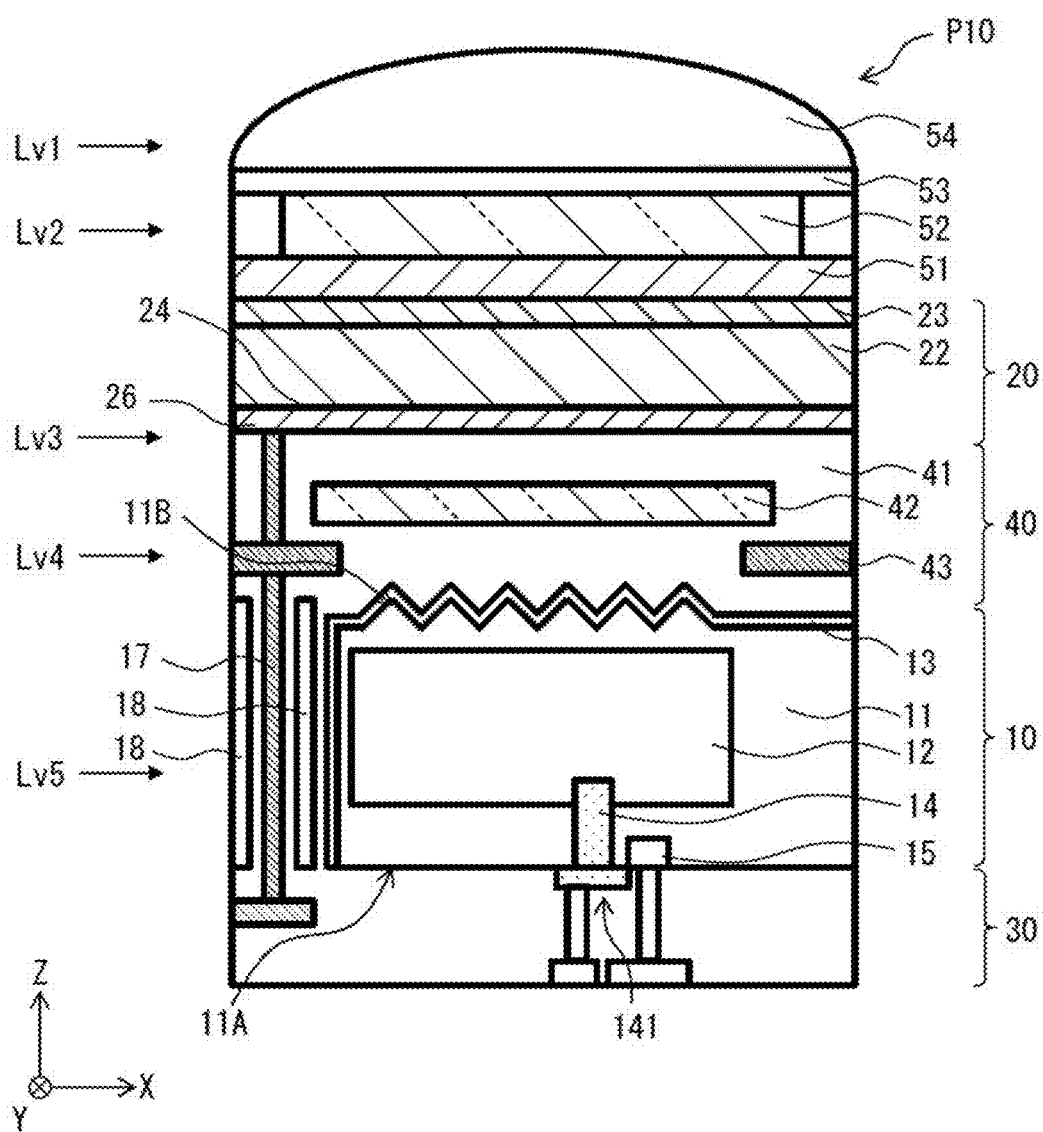
FIG. 35 is a schematic cross-sectional view of an example of a schematic configuration of an imaging element as a modification example according to the tenth embodiment of the present disclosure.

It is to be noted that the configurations according to the present embodiment illustrated in FIGS. 33A and 33B and FIGS. 34A and 34B, that is, a configuration in which the metal layer 18 is provided to surround the through electrode 17 in the XY cross section and extend in the Z-axis direction is applicable to pixels other than the pixels described in the first to ninth embodiments and the like described above. For example, the configuration is applicable to a pixel P10 as a modification example of the tenth embodiment illustrated in FIG. 35. The pixel P10 includes the readout electrode 26 extending throughout the pixel P10, and does not include the semiconductor layer 21 and the electric charge accumulation electrode 25. In addition, in the pixel P10 in FIG. 35, one TG 141, one FD 15, and the like are provided corresponding to one photoelectric conversion region 12. Furthermore, as described above, the metal layer 18 also serving as the inter-pixel region light-shielding wall 16 is provided. The pixel P10 in FIG. 35 has substantially the same configuration as that of the pixel P1 illustrated in FIG. 2A and the like, except for this point. It is to be noted that in FIG. 35, the pixel P10 includes the color filter 52; however, the pixel P10 may not include the color filter 52. In addition, in the pixel P10, a wavelength range to which each of the organic photoelectric converter 20 and the photoelectric converter 10 has sensitivity is freely settable. Furthermore, the organic photoelectric conversion layer 22 of the organic photoelectric converter 20 may include a photoelectric conversion material other than an organic matter, e.g., a quantum dot.

11. Eleventh Embodiment

Figure 36A:
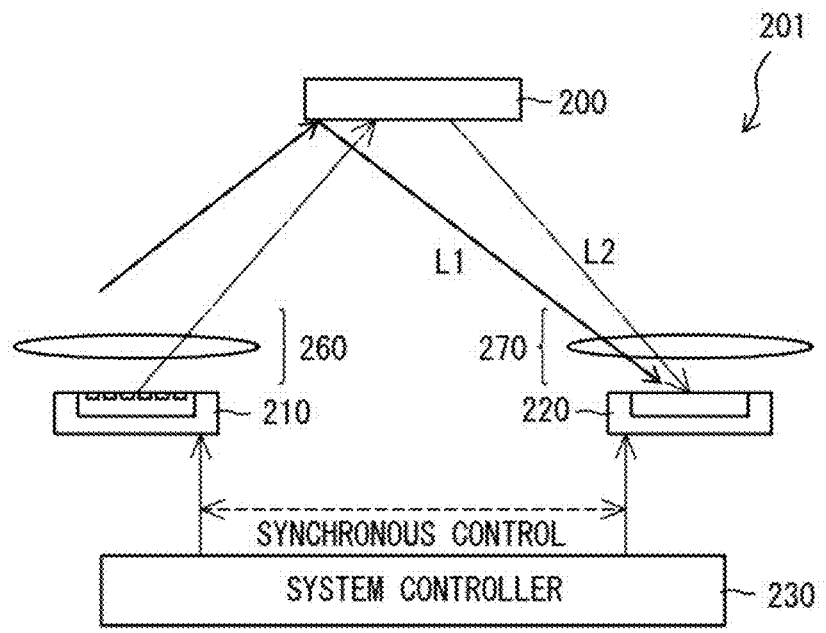
FIG. 36A is a schematic view of an example of an entire configuration of a photodetection system according to an eleventh embodiment of the present disclosure.
Figure 36B:
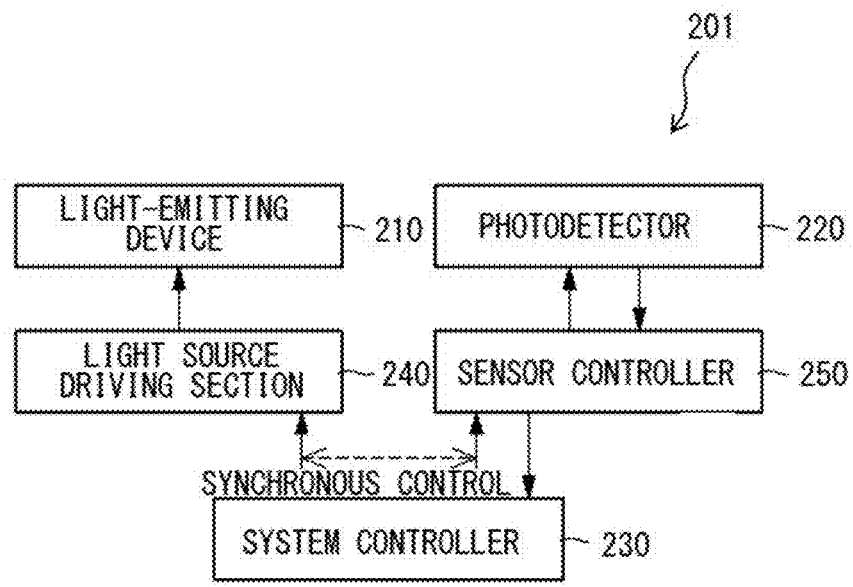
FIG. 36B is a schematic view of an example of a circuit configuration of the photodetection system illustrated in FIG. 36A.

FIG. 36A is a schematic view of an example of an entire configuration of a photodetection system 201 according to an eleventh embodiment of the present disclosure. FIG. 36B is a schematic view of an example of a circuit configuration of the photodetection system 201. The photodetection system 201 includes a light-emitting device 210 as a light source section that emits infrared light L2, and a photodetector 220 as a light-receiving section including a photoelectric conversion element. As the photodetector 220, it is possible to use the solid-state imaging device 1 described above. The photodetection system 201 may further include a system controller 230, a light source driving section 240, a sensor controller 250, a light source-side optical system 260, and a camera-side optical system 270.

The photodetector 220 is able to detect light L1 and light L2. The light L1 is ambient light from outside reflected by a subject (a measurement object) 200 (FIG. 36A). The light L2 is light emitted from the light-emitting device 210 and then reflected by the subject 200. The light L1 is, for example, visible light, and the light L2 is, for example, infrared light. The light L1 is detectable by an organic photoelectric converter in the photodetector 220, and the light L2 is detectable by a photoelectric converter in the photodetector 220. It is possible to obtain image information of the subject 200 from the light L1 and obtain distance information between the subject 200 and the photodetection system 201 from the light L2. It is possible to mount the photodetection system 201 on, for example, an electronic apparatus such as a smartphone and a mobile body such as a car. It is possible to configure the light-emitting device 210 with, for example, a semiconductor laser, a surface-emitting semiconductor laser, or a vertical cavity surface emitting laser (VCSEL). As a method of detecting the light L2 emitted from the light-emitting device 210 by the photodetector 220, for example, it is possible to adopt an iTOF method; however, the method is not limited thereto. In the iTOF method, the photoelectric converter is able to measure a distance to the subject 200 by time of flight (Time-of-Flight; TOF), for example. As a method of detecting the light L2 emitted from the light-emitting device 210 by the photodetector 220, it is possible to adopt, for example, a structured light method or a stereovision method. For example, in the structured light method, light having a predetermined pattern is projected on the subject 200, and distortion of the pattern is analyzed, thereby making it possible to measure the distance between the photodetection system 201 and the subject 200. In addition, in the stereovision method, for example, two or more cameras are used to obtain two or more images of the subject 200 viewed from two or more different viewpoints, thereby making it possible to measure the distance between the photodetection system 201 and the subject 200. It is to be noted that it is possible to synchronously control the light-emitting device 210 and the photodetector 220 by the system controller 230.

12. Application Example to Electronic Apparatus

Figure 37:
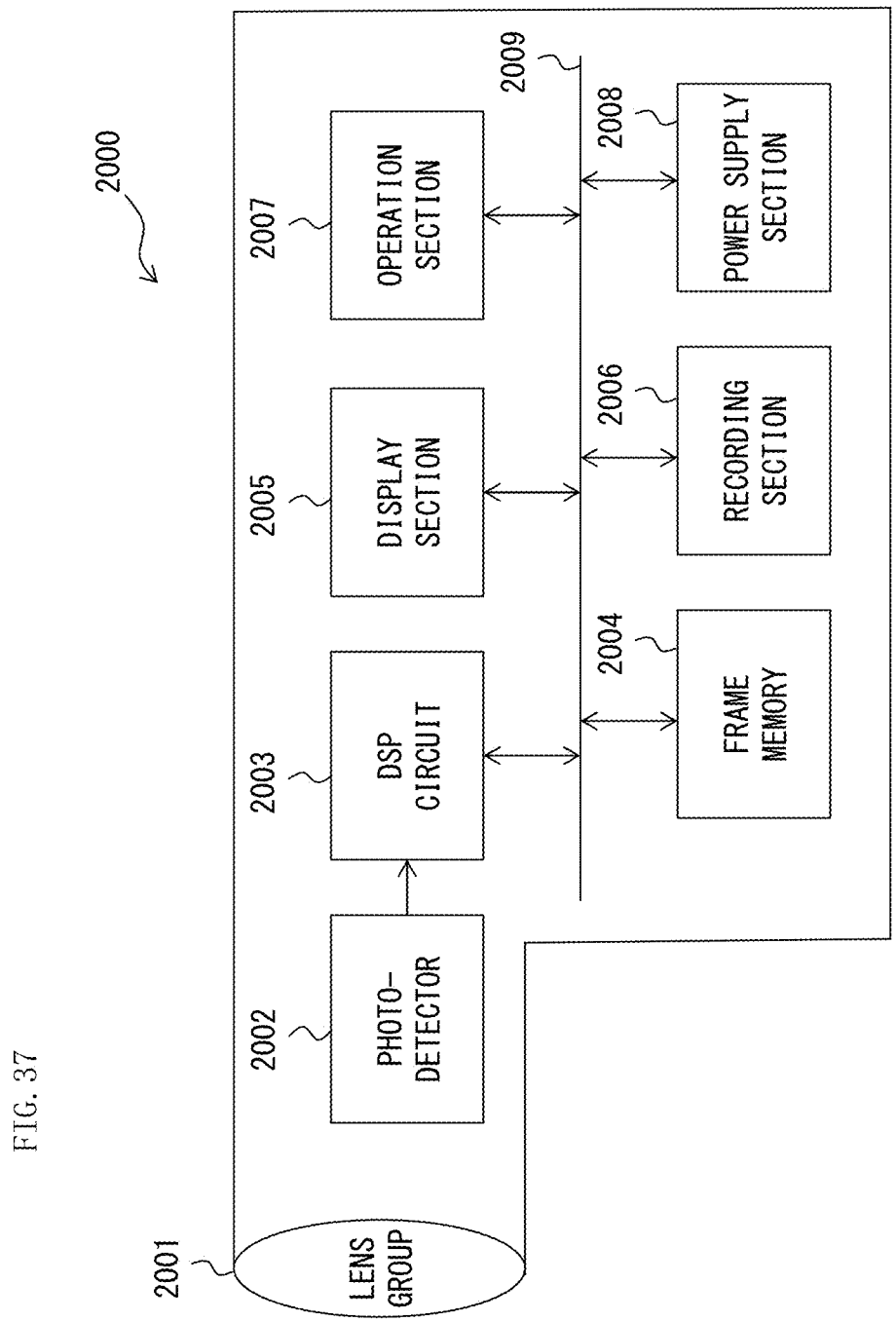
FIG. 37 is a schematic view of an entire configuration example of an electronic apparatus.

FIG. 37 is a block diagram illustrating a configuration example of an electronic apparatus 2000 to which the present technology is applied. The electronic apparatus 2000 has a function as a camera, for example.

The electronic apparatus 2000 includes an optical section 2001 including a lens group and the like, a photodetector 2002 to which the solid-state imaging device 1 or the like described above (hereinafter referred to as the solid-state imaging device 1 or the like) is applied, and a DSP (Digital Signal Processor) circuit 2003 that is a camera signal processing circuit. In addition, the electronic apparatus 2000 further includes a frame memory 2004, a display section 2005, a recording section 2006, an operation section 2007, and a power supply section 2008. The DSP circuit 2003, the frame memory 2004, the display section 2005, the recording section 2006, the operation section 2007, and the power supply section 2008 are coupled to one another through a bus line 2009.

The optical section 2001 captures incident light (image light) from a subject and forms an image of the incident light on an imaging plane of the imaging device 2002. The imaging device 2002 converts the light amount of the incident light of which the image is formed on the imaging plane by the optical section 2001 into an electric signal on a pixel-by-pixel basis, and outputs the electric signal as a pixel signal.

The display section 2005 includes, for example, a panel type display device such as a liquid crystal panel and an organic EL panel, and displays a moving image or a still image captured by the photodetector 2002. The recording section 2006 records the moving image or the still image captured by the photodetector 2002 on a recording medium such as a hard disk or a semiconductor memory.

The operation section 2007 is operated by a user to issue operation instructions for various functions of the electronic apparatus 2000. The power supply section 2008 supplies the DSP circuit 2003, the frame memory 2004, the display section 2005, the recording section 2006, and the operation section 2007 with various types of power as power for operating these supply targets as appropriate.

As described above, use of the solid-state imaging device 1 or the like described above as the photodetector 2002 makes it possible to expect obtainment of a favorable image.

13. Practical Application Example to In-Vivo Information Acquisition System

The technology (present technology) according to the present disclosure is applicable to various products. For example, the technology according to the present disclosure may be applied to an endoscopic surgery system.

Figure 38:
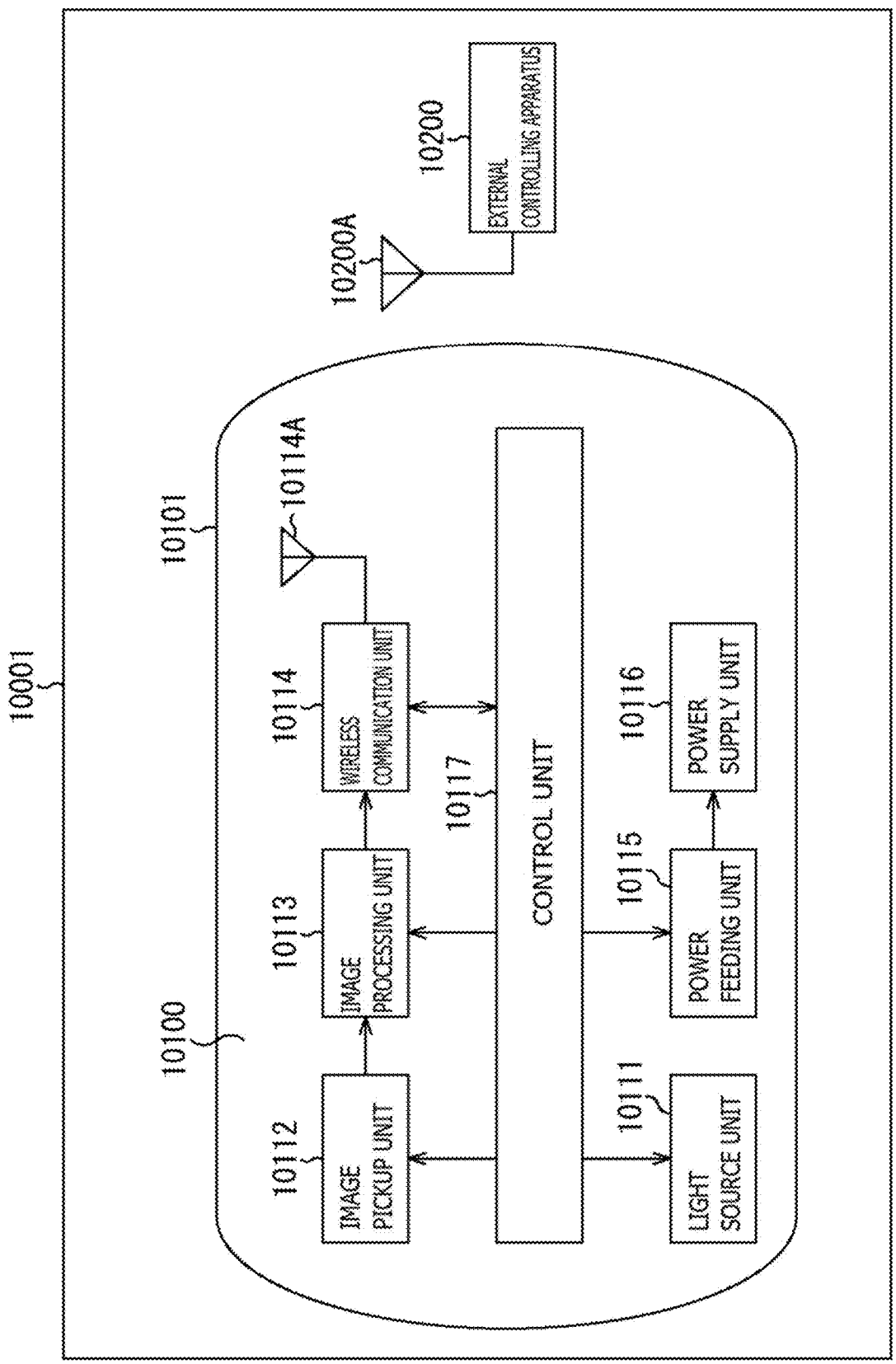
FIG. 38 is a block diagram depicting an example of a schematic configuration of an in-vivo information acquisition system.

FIG. 38 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 38, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure may be applied has been described above. The technology according to the present disclosure is applicable to, for example, the image pickup unit 10112 among the configurations described above. This makes it possible to achieve high image detection accuracy in spite of a small size.

14. Practical Application Example to Endoscopic Surgery System

The technology (present technology) according to the present disclosure is applicable to various products. For example, the technology according to the present disclosure may be applied to an endoscopic surgery system.

Figure 39:
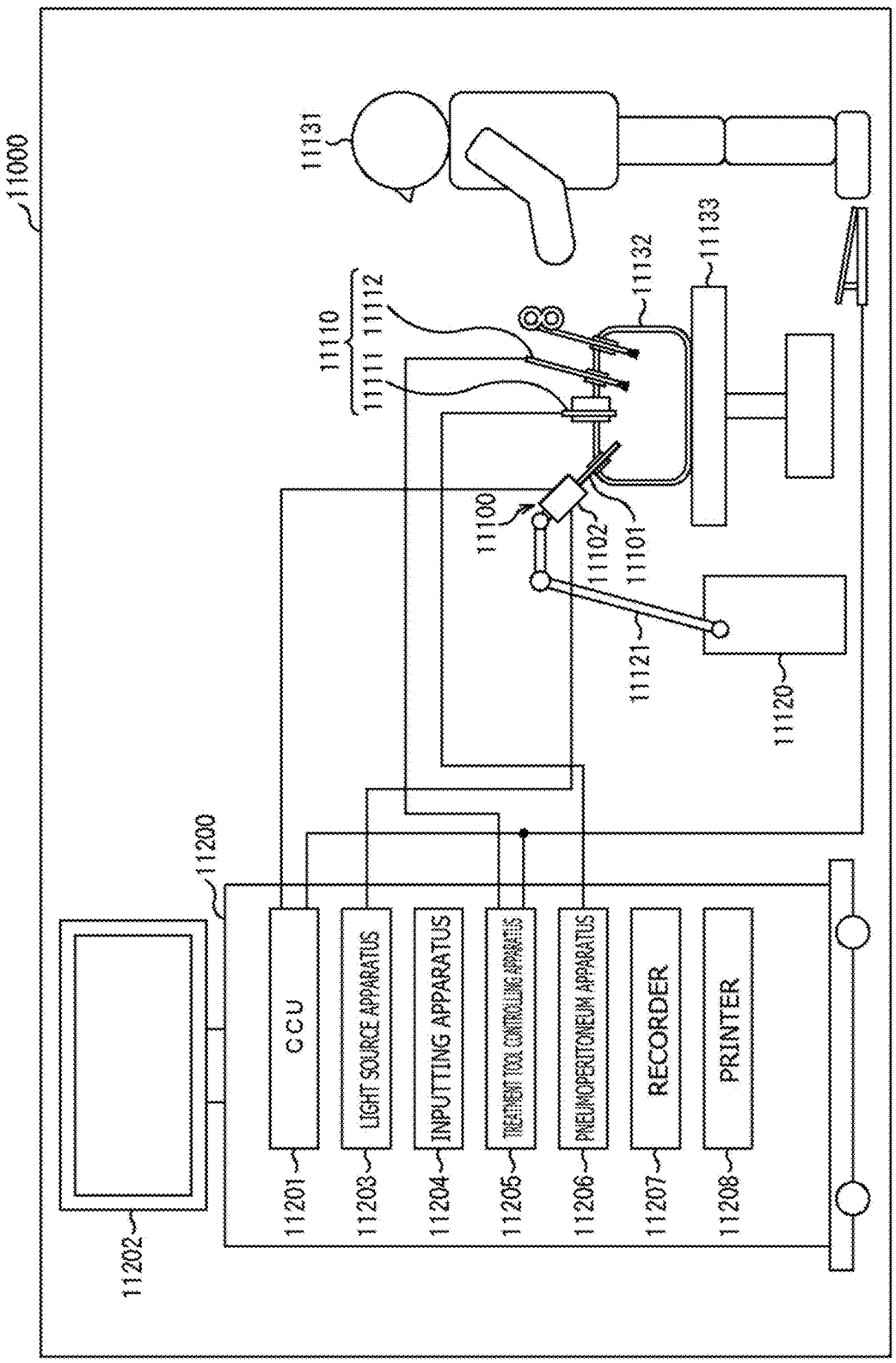
FIG. 39 is a view depicting an example of a schematic configuration of an endoscopic surgery system.

FIG. 39 is a view depicting an example of a schematic configuration of an endoscopic surgery system to which the technology according to an embodiment of the present disclosure (present technology) can be applied.

In FIG. 39, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 40:
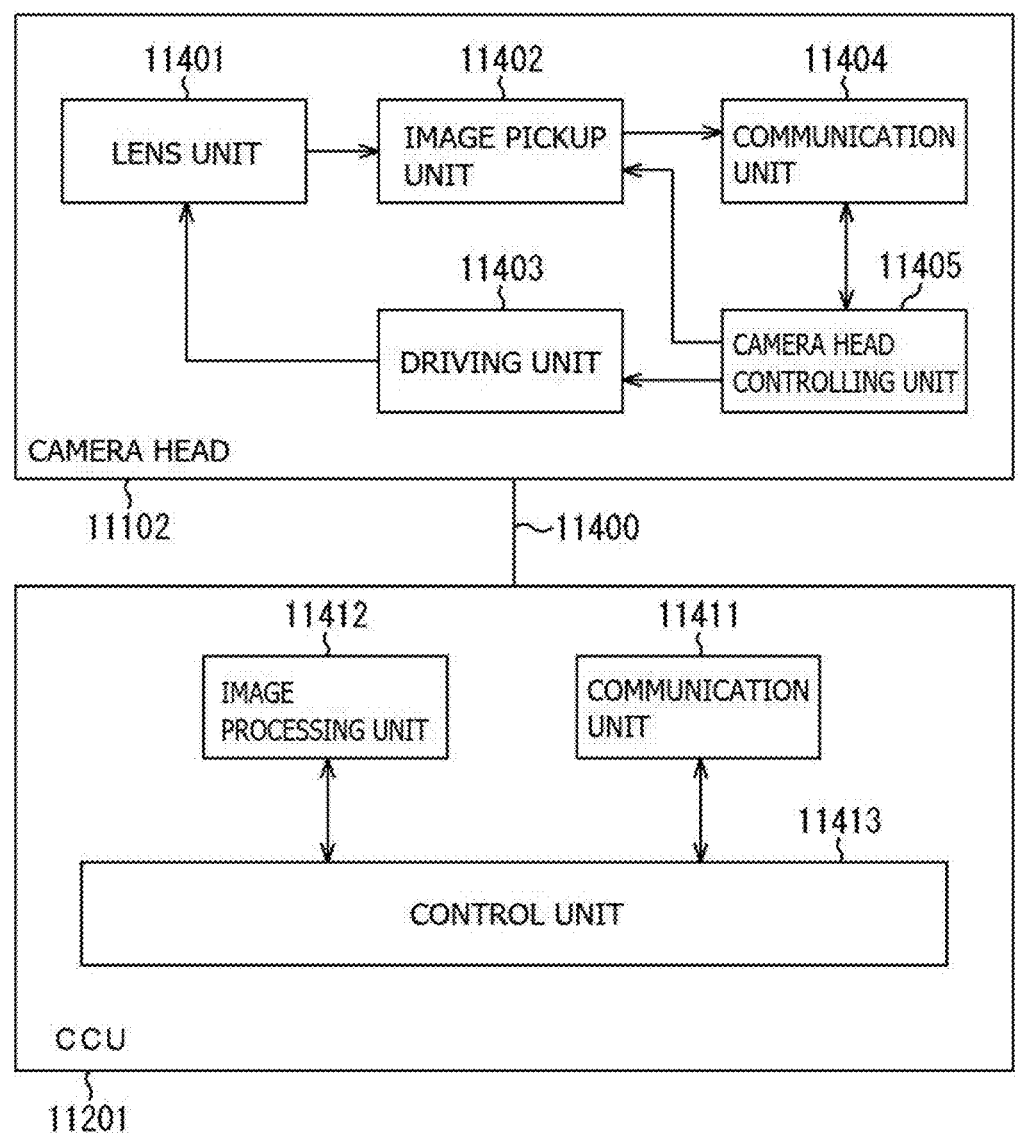
FIG. 40 is a block diagram depicting an example of a functional configuration of a camera head and a camera control unit (CCU).

FIG. 40 is a block diagram depicting an example of a functional configuration of the camera head 11102 and the CCU 11201 depicted in FIG. 39.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure is applicable to, for example, the image pickup unit 11402 of the camera head 11102 among the configurations described above. Applying the technology according to the present disclosure to the image pickup unit 11402 makes it possible to obtain a clearer image of the surgical region, thereby improving viewability of the surgical region for a surgeon.

It is to be noted that the endoscopic surgery system has been described here as an example, but the technology according to the present disclosure may be additionally applied to, for example, a microscopic surgery system and the like.

15. Practical Application Example to Mobile Body

The technology (present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

Figure 41:
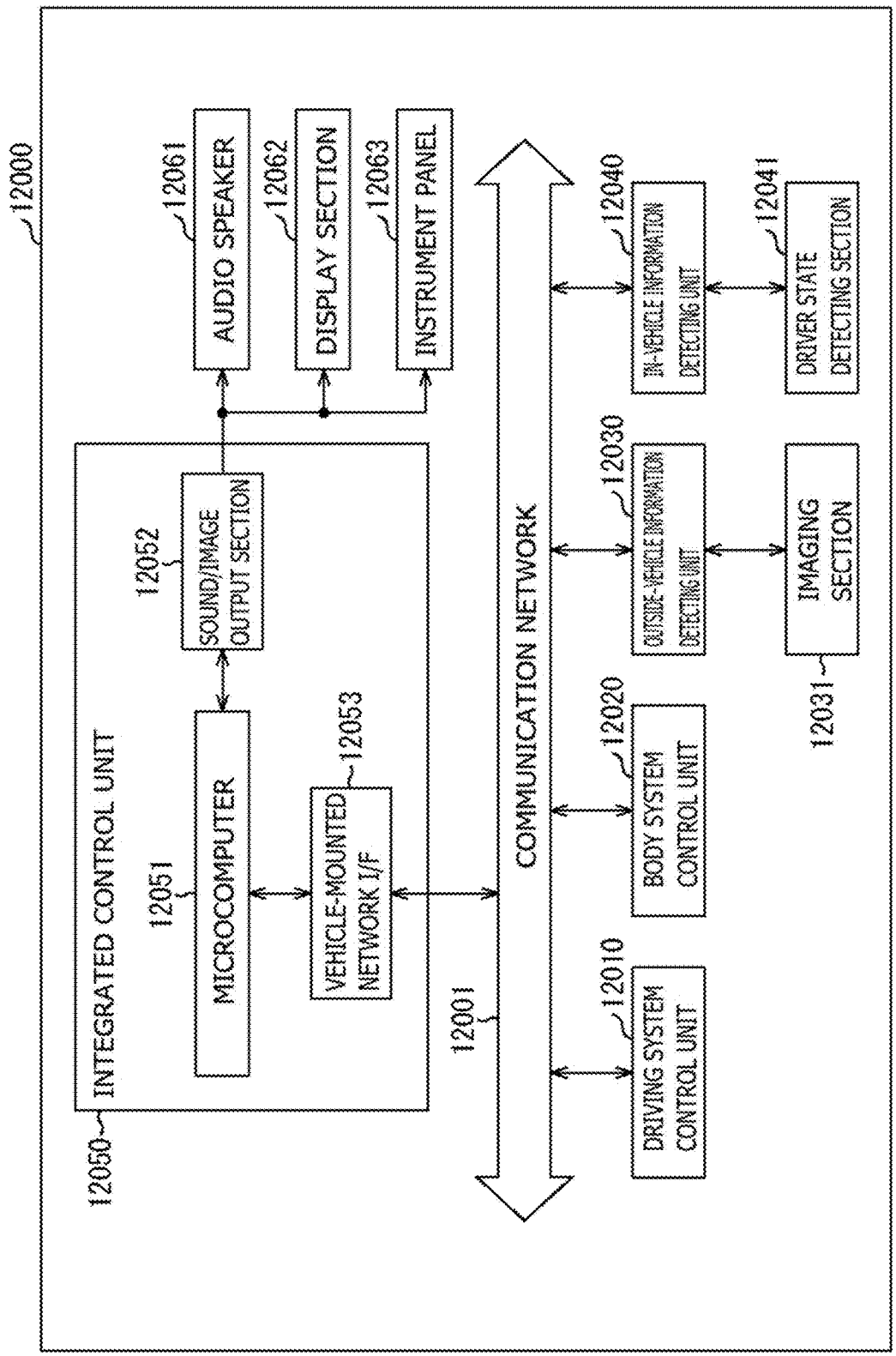
FIG. 41 is a block diagram depicting an example of schematic configuration of a vehicle control system.

FIG. 41 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 41, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 41, an audio speaker 12061, a display section 12062, and an instrument panel 12063 are illustrated as the output device. The display section 12062 may, for example, include at least one of an on-board display and a head-up display.

Figure 42:
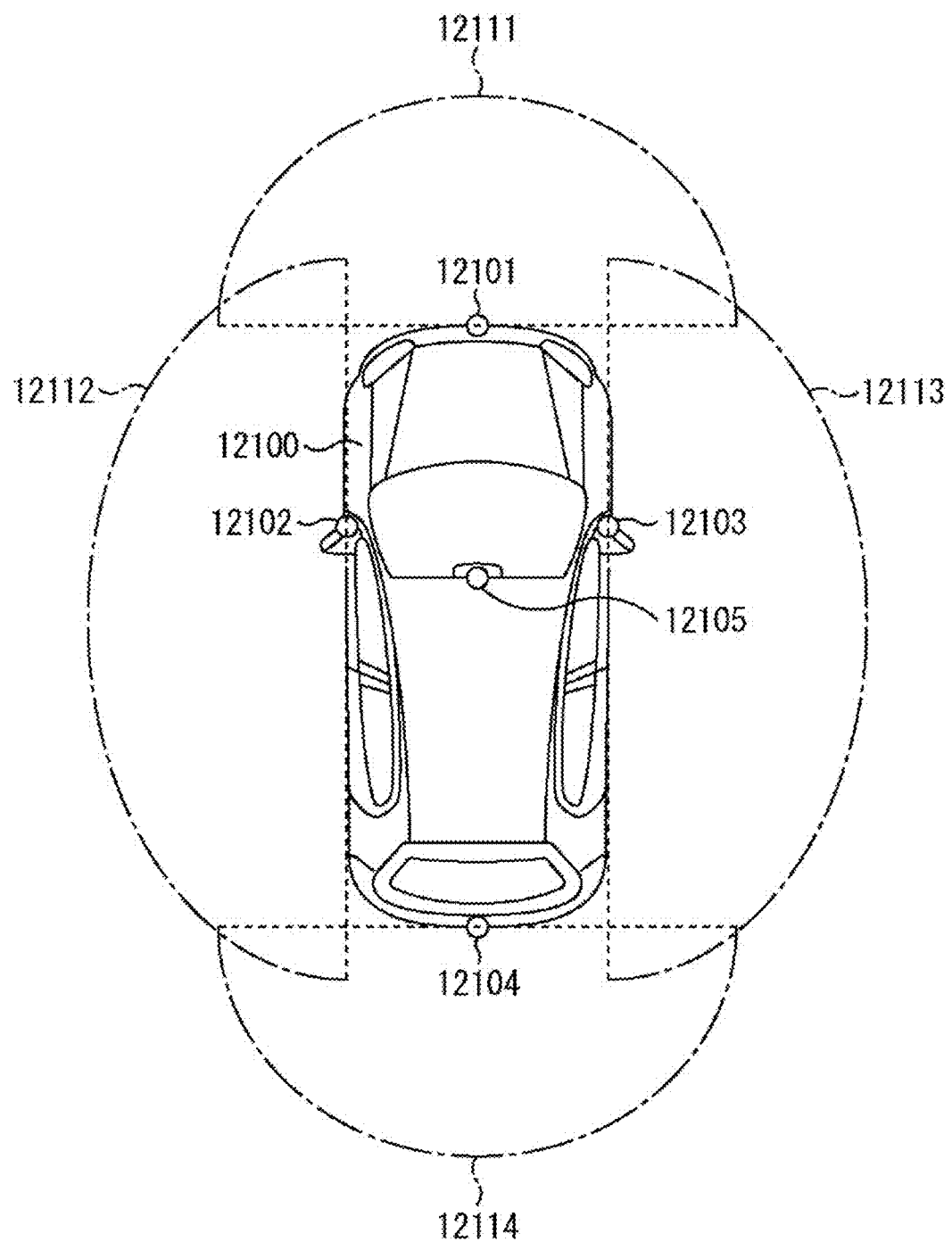
FIG. 42 is a diagram of assistance in explaining an example of installation positions of an outside-vehicle information detecting section and an imaging section.

FIG. 42 is a diagram depicting an example of the installation position of the imaging section 12031.

In FIG. 42, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 42 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure is applicable to the imaging section 12031 among the configurations described above. Applying the technology according to the present disclosure to the imaging section 12031 makes it possible to obtain a shot image that is easier to see. This makes it possible to decrease the fatigue of the driver.

16. Other Modification Examples

The present disclosure has been described above with reference to some embodiments and the modification examples, as well as application examples thereof or practical application examples thereof (hereinafter referred to as "embodiments and the like"), but the present disclosure are not limited to the embodiments and the like described above, and may be modified in a variety of ways. For example, the present disclosure is not limited to a back-illuminated image sensor, and is also applicable to a front-illuminated image sensor.

In addition, the imaging device of the present disclosure may have a form of a module in which an imaging section and a signal processor or an optical system are integrally packaged.

Furthermore, in the embodiments and the like described above, the solid-state imaging device in which the light amount of incident light of which an image is formed on an imaging plane through an optical lens system is converted into an electric signal on a pixel-by-pixel basis and the electric signal is outputted as a pixel signal, and the imaging element mounted to the solid-state imaging device have been described as examples; however, the photoelectric conversion element of the present disclosure is not limited to such an imaging element. For example, it is sufficient if the photoelectric conversion element detects and receives light from a subject, and generates electric charges corresponding to the amount of received light by photoelectric conversion and accumulates the electric charges. The signal to be outputted may be a signal of image information or a signal of distance measurement information.

In addition, in the embodiments and the like described above, a case where the photoelectric converter 10 as a second photoelectric converter is an iTOF sensor is described as an example; however, the present disclosure is not limited thereto. That is, the second photoelectric converter is not limited to a photoelectric converter that detects light having a wavelength in the infrared light range, and may be a photoelectric converter that detects light having a wavelength in another wavelength range. In addition, in a case where the photoelectric converter 10 is not an iTOF sensor, only one transfer transistor (TG) may be provided.

Furthermore, in the embodiments and the like described above, the imaging element in which the photoelectric converter 10 including the photoelectric conversion region 12 and the organic photoelectric converter 20 including the organic photoelectric conversion layer 22 are stacked with the intermediate layer 40 interposed therebetween is described as an example of the photoelectric conversion element of the present disclosure; however, the present disclosure is not limited thereto. For example, the photoelectric conversion element of the present disclosure may have a configuration in which two organic photoelectric conversion regions are stacked, or a configuration in which two inorganic photoelectric conversion regions are stacked. In addition, in the embodiments and the like described above, the photoelectric converter 10 mainly detects light having a wavelength in the infrared light range and photoelectrically converts the light, and the organic photoelectric converter 20 mainly detects light having a wavelength in the visible light range and photoelectrically converts the light; however, the photoelectric conversion element of the present disclosure is not limited thereto. In the photoelectric conversion element of the present disclosure, wavelength ranges to which the first photoelectric converter and the second photoelectric converter have sensitivity are freely settable.

In addition, constituent materials of respective components of the photoelectric conversion element of the present disclosure are not limited to the materials described in the embodiments and the like described above. For example, in a case where the first photoelectric converter or the second photoelectric converter receives light in the visible light region and photoelectrically convert the light, the first photoelectric converter or the second photoelectric converter may include a quantum dot.

In addition, in the fifth embodiment described above, the inter-pixel region light-shielding film 56 is provided between the organic photoelectric converter 20 and the on-chip lens 54 in the Z-axis direction; however, the inter-pixel region light-shielding film 56 may be provided similarly in each of the embodiments and the modification examples described above in addition to the fifth embodiment.

In addition, in the embodiments and the like described above, a case where one pair of gate electrodes and one pair of electric charge holding sections that each accumulate electric charges reaching from a second photoelectric conversion layer through a corresponding one of the pair of gate electrodes are included corresponding to one second photoelectric conversion layer is described as an example; however, the present disclosure is not limited thereto. One gate electrode and one electric charge holding section may be provided corresponding to one second photoelectric conversion layer. Alternatively, three or more gate electrodes and three or more electric charge holding sections may be provided corresponding to one second photoelectric conversion layer. In addition, in the present disclosure, a transistor that reads out electric charges of the second photoelectric conversion layer is not limited to a so-called vertical transistor, and may be a planar transistor.

According to a photoelectric conversion element as an embodiment of the present disclosure, it is possible to obtain, for example, visible light image information having high image quality and infrared light image information including distance information by the configuration described above.

It is to be noted that the effects described herein are merely illustrative and non-limiting, and other effects may be provided. In addition, the present technology may have the following configurations.

(1)
A photoelectric conversion element including:
a semiconductor substrate;
a first photoelectric converter that is provided on the semiconductor substrate, and detects light in a first wavelength range including a visible light range and photoelectrically converts the light;
a second photoelectric converter that is provided at a position overlapping the first photoelectric converter in a thickness direction of the semiconductor substrate in the semiconductor substrate, and detects light in a second wavelength range including an infrared light range and photoelectrically converts the light; and
an optical filter that is provided on side, opposite to the second photoelectric converter, of the first photoelectric converter, and allows light of a predetermined color component included in a predetermined wavelength range to pass therethrough,
the first photoelectric converter including a stacked structure and an electric charge accumulation electrode, the stacked structure including a first electrode, a first photoelectric conversion layer, and a second electrode that are stacked in order, and the electric charge accumulation electrode being disposed to be separated from the first electrode and be opposed to the first photoelectric conversion layer with an insulating layer interposed therebetween.

(2)

The photoelectric conversion element according to (1), in which the second photoelectric converter is configured to obtain distance information of a subject.

(3)

The photoelectric conversion element according to (1) or (2), in which the second photoelectric converter includes a second photoelectric conversion layer, a pair of gate electrodes, and a pair of electric charge holding sections that each accumulate electric charges reaching from the second photoelectric conversion layer through a corresponding one of the pair of gate electrodes.

(4)

The photoelectric conversion element according to any one of (1) to (3), in which a plurality of the electric charge accumulation electrodes is provided corresponding to one of the second photoelectric converters.

(5)

The photoelectric conversion element according to (4), in which one of the optical filters is provided corresponding to the one second photoelectric converter, and one of the first photoelectric converters is provided corresponding to the one second photoelectric converter.

(6)

The photoelectric conversion element according to any one of (1) to (5), in which a plurality of the electric charge accumulation electrodes is provided corresponding to one of the first photoelectric converters.

(7)

The photoelectric conversion element according to any one of (1) to (6), further including an inter-pixel region light-shielding film on incident side of the second photoelectric converter, the inter-pixel region light-shielding film including a plurality of opening portions at positions corresponding to the second photoelectric converter.

(8)

The photoelectric conversion element according to any one of (1) to (7), further including a through electrode that extracts electric charges accumulated in the electric charge accumulation electrode to side opposite to the second photoelectric converter as viewed from the first photoelectric converter.

(9)

The photoelectric conversion element according to (8), further including a metal layer that surrounds the through electrode with an insulating layer interposed therebetween.

(10)

The photoelectric conversion element according to any one of (1) to (9), in which the semiconductor substrate has a first surface opposed to the first photoelectric converter and a second surface on side opposite to the first surface, and a recessed and projected structure is formed on at least one of the first surface and the second surface.

(11)

The photoelectric conversion element according to any one of (1) to (10), in which the stacked structure in the first photoelectric conversion layer further includes a semiconductor layer provided between the first electrode and the first photoelectric conversion layer.

(12)

A photodetector provided with a plurality of photoelectric conversion elements, the photoelectric conversion elements each including:

a semiconductor substrate;

a first photoelectric converter that is provided on the semiconductor substrate, and detects light in a first wavelength range including a visible light range and photoelectrically converts the light;

a second photoelectric converter that is provided at a position overlapping the first photoelectric converter in a thickness direction of the semiconductor substrate in the semiconductor substrate, and detects light in a second wavelength range including an infrared light range and photoelectrically converts the light; and an optical filter that is provided on side, opposite to the second photoelectric converter, of the first photoelectric converter, and allows light of a predetermined color component included in a predetermined wavelength range to pass therethrough, the first photoelectric converter including a stacked structure and an electric charge accumulation electrode, the stacked structure including a first electrode, a first photoelectric conversion layer, and a second electrode that are stacked in order, and the electric charge accumulation electrode being disposed to be separated from the first electrode and be opposed to the first photoelectric conversion layer with an insulating layer interposed therebetween.

(13)

The photodetector according to (12), further including a light-shielding film that is positioned between the first photoelectric converter and the second photoelectric converter and is provided in a region between the photoelectric conversion elements adjacent to each other.

(14)

A photodetection system provided with a light-emitting device that emits infrared light and a photodetector that includes a photoelectric conversion element, the photoelectric conversion element including:

a semiconductor substrate;

a first photoelectric converter that is provided on the semiconductor substrate, and detects visible light from outside and photoelectrically converts the visible light;

a second photoelectric converter that is provided at a position overlapping the first photoelectric converter in a thickness direction of the semiconductor substrate in the semiconductor substrate, and detects the infrared light from the light-emitting device and photoelectrically converts the infrared light; and an optical filter that is provided on side, opposite to the second photoelectric converter, of the first photoelectric converter, and allows light of a predetermined color component included in a predetermined wavelength range to pass therethrough, the first photoelectric converter including a stacked structure and an electric charge accumulation electrode, the stacked structure including a first electrode, a first photoelectric conversion layer, and a second electrode that are stacked in order, and the electric charge accumulation electrode being disposed to be separated from the first electrode and be opposed to the first photoelectric conversion layer with an insulating layer interposed therebetween.

(15)

An electronic apparatus provided with an optical section, a signal processor, and a photoelectric conversion element, the photoelectric conversion element including:

a semiconductor substrate;

a first photoelectric converter that is provided on the semiconductor substrate, and detects light in a first wavelength range including a visible light range and photoelectrically converts the light;

a second photoelectric converter that is provided at a position overlapping the first photoelectric converter in a thickness direction of the semiconductor substrate in the semiconductor substrate, and detects light in a second wavelength range including an infrared light range and photoelectrically converts the light; and an optical filter that is provided on side, opposite to the second photoelectric converter, of the first photoelectric converter, and allows light of a predetermined color component included in a predetermined wavelength range to pass therethrough, the first photoelectric converter including a stacked structure and an electric charge accumulation electrode, the stacked structure including a first electrode, a first photoelectric conversion layer, and a second electrode that are stacked in order, and the electric charge accumulation electrode being disposed to be separated from the first electrode and be opposed to the first photoelectric conversion layer with an insulating layer interposed therebetween.

(16)

A mobile body provided with a photodetection system including a light-emitting device and a photodetector, the light-emitting device that emits first light included in a visible light range and second light included in an infrared light range, the photodetector including a photoelectric conversion element, the photoelectric conversion element including:

a semiconductor substrate;

a first photoelectric converter that is provided on the semiconductor substrate, and detects light in a first wavelength range including the first light and photoelectrically converts the light;

a second photoelectric converter that is provided at a position overlapping the first photoelectric converter in a thickness direction of the semiconductor substrate in the semiconductor substrate, and detects light in a second wavelength range including the second light and photoelectrically converts the light; and an optical filter that is provided on side, opposite to the second photoelectric converter, of the first photoelectric converter, and allows light of a predetermined color component included in a predetermined wavelength range to pass therethrough, the first photoelectric converter including a stacked structure and an electric charge accumulation electrode, the stacked structure including a first electrode, a first photoelectric conversion layer, and a second electrode that are stacked in order, and the electric charge accumulation electrode being disposed to be separated from the first electrode and be opposed to the first photoelectric conversion layer with an insulating layer interposed therebetween.

(17)

A photoelectric conversion element including:

a semiconductor substrate;

a first photoelectric converter that is provided on the semiconductor substrate, includes a stacked structure including a first electrode, a first photoelectric conversion layer, and a second electrode that are stacked in order from side of the semiconductor substrate, and detects light in a first wavelength range and photoelectrically converts the light;

a second photoelectric converter that is provided at a position overlapping the first photoelectric converter in a thickness direction of the semiconductor substrate in the semiconductor substrate, and detects light in a second wavelength range and photoelectrically converts the light;

a through electrode that is electrically coupled to the first electrode, and extracts electric charges generated in the first photoelectric conversion layer to side opposite to the semiconductor substrate as viewed from the first photoelectric converter; and a metal layer that surrounds the through electrode with an insulating layer interposed therebetween.

(18)

The photoelectric conversion element according to (17), in which the metal layer is provided to surround the second photoelectric converter in a plane orthogonal to a stacking direction where the stacked structure is stacked.

(19)

An electronic apparatus provided with a photodetection system including a light-emitting device and a photodetector, the light-emitting device that emits first light included in a visible light range and second light included in an infrared light range, the photodetector including a photoelectric conversion element, the photoelectric conversion element including:

a semiconductor substrate;

a first photoelectric converter that is provided on the semiconductor substrate, and detects light in a first wavelength range including the first light and photoelectrically converts the light;

a second photoelectric converter that is provided at a position overlapping the first photoelectric converter in a thickness direction of the semiconductor substrate in the semiconductor substrate, and detects light in a second wavelength range including the second light and photoelectrically converts the light; and an optical filter that is provided on side, opposite to the second photoelectric converter, of the first photoelectric converter, and allows light of a predetermined color component included in a predetermined wavelength range to pass therethrough, the first photoelectric converter including a stacked structure and an electric charge accumulation electrode, the stacked structure including a first electrode, a first photoelectric conversion layer, and a second electrode that are stacked in order, and the electric charge accumulation electrode being disposed to be separated from the first electrode and be opposed to the first photoelectric conversion layer with an insulating layer interposed therebetween.

(20)

An electronic apparatus provided with an optical section, a signal processor, and a photoelectric conversion element, the photoelectric conversion element including:

a semiconductor substrate;

a first photoelectric converter that is provided on the semiconductor substrate, includes a stacked structure including a first electrode, a first photoelectric conversion layer, and a second electrode that are stacked in order from side of the semiconductor substrate, and detects light in a first wavelength range and photoelectrically converts the light;

a second photoelectric converter that is provided at a position overlapping the first photoelectric converter in a thickness direction of the semiconductor substrate in the semiconductor substrate, and detects light in a second wavelength range and photoelectrically converts the light;

a through electrode that is electrically coupled to the first electrode, and extracts electric charges generated in the first photoelectric conversion layer to side opposite to the semiconductor substrate as viewed from the first photoelectric converter; and a metal layer that surrounds the through electrode with an insulating layer interposed therebetween.

This application claims the benefit of U.S. Provisional Patent Application No. 62/864,907 filed with the United States Patent and Trademark Office on Jun. 21, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion element comprising:
a semiconductor substrate;
a first photoelectric converter that is provided above the semiconductor substrate, and that detects and photoelectrically converts light in a first wavelength range including a visible light range;
a second photoelectric converter that is provided in the semiconductor substrate at a position overlapping the first photoelectric converter in a thickness direction of the semiconductor substrate, and that detects and photoelectrically converts light in a second wavelength range including an infrared light range; and
an optical filter that is provided above the first photoelectric converter, and that allows light of a predetermined color component included in a predetermined wavelength range to pass therethrough,
the first photoelectric converter including first and second electrodes, a third electrode, and a first photoelectric conversion layer disposed between the first and second electrodes and the third electrode,
the second photoelectric converter including a first photoelectric conversion region, and
the optical filter including a first color filter and a second color filter,
wherein the first color filter overlaps the first electrode and the first photoelectric conversion region and the second color filter overlaps the second electrode and the first photoelectric conversion region, and
wherein the first color filter is configured to allow light of a first predetermined color component to pass therethrough and the second color filter is configured to allow light of a second predetermined color component which is different than the first predetermined color component to pass therethrough.

2. The photoelectric conversion element according to claim 1, wherein the second photoelectric converter is configured to obtain distance information of a subject.

3. The photoelectric conversion element according to claim 1, wherein the second photoelectric converter includes a pair of gate electrodes, and a pair of electric charge holding sections that each accumulate electric charges that travel from the first photoelectric conversion region through a corresponding one of the pair of gate electrodes.

4. The photoelectric conversion element according to claim 1, wherein a plurality of electric charge accumulation electrodes are provided for the second photoelectric converter.

5. The photoelectric conversion element according to claim 1, wherein the first photoelectric converter includes a readout electrode disposed separately from the first and second electrodes, and wherein the first photoelectric conversion layer is disposed between the readout electrode and the third electrode, and wherein an insulating layer is between the first photoelectric conversion layer and the first and second electrodes.

6. The photoelectric conversion element according to claim 1, wherein a plurality of first electrodes are provided for the first photoelectric converter.

7. The photoelectric conversion element according to claim 1, further comprising an inter-pixel region light-shielding film on a light incident side of the second photoelectric converter, the inter-pixel region light-shielding film including a plurality of opening portions at positions corresponding to the second photoelectric converter.

8. The photoelectric conversion element according to claim 1, further comprising a through electrode that extracts electric charges accumulated in the first electrode or the second electrode to a side opposite to the second photoelectric converter as viewed from the first photoelectric converter.

9. The photoelectric conversion element according to claim 8, further comprising a metal layer that surrounds the through electrode with the insulating layer interposed therebetween.

10. The photoelectric conversion element according to claim 1, wherein
the semiconductor substrate has a first surface opposed to the first photoelectric converter and a second surface opposite to the first surface, and
a recessed and projected structure is formed on at least one of the first surface and the second surface.

11. The photoelectric conversion element according to claim 1, wherein the first photoelectric converter further includes a semiconductor layer provided between the first electrode and the first photoelectric conversion layer.

12. The photoelectric conversion element according to claim 1,
wherein the first photoelectric converter includes fourth and fifth electrodes, the first photoelectric conversion layer being disposed between the fourth and fifth electrodes and the third electrode,
wherein the second photoelectric converter includes a second photoelectric conversion region,
wherein the optical filter includes a third color filter and a fourth color filter,
wherein the third color filter overlaps the fourth electrode and the second photoelectric conversion region and the fourth color filter overlaps the fifth electrode and the second photoelectric conversion region, and
wherein the third color filter is configured to allow light of the first predetermined color component to pass therethrough and the fifth color filter is configured to allow light of the second predetermined color component to pass therethrough.

13. A photodetector comprising:
a plurality of photoelectric conversion elements, at least one of the photoelectric conversion elements comprising:
a semiconductor substrate;
a first photoelectric converter that is provided above the semiconductor substrate, and that detects and photoelectrically converts light in a first wavelength range including a visible light range;
a second photoelectric converter that is provided in the semiconductor substrate at a position overlapping the first photoelectric converter in a thickness direction of the semiconductor substrate, and that detects light in a second wavelength range including an infrared light range and photoelectrically converts the light; and
an optical filter that is provided above first photoelectric converter, and that allows light of a predetermined color component included in a predetermined wavelength range to pass therethrough, the first photoelectric converter including first and second electrodes, a third electrode, and a first photoelectric conversion layer disposed between the first and second electrodes and the third electrode, the second photoelectric converter including a first photoelectric conversion region, the optical filter including a first color filter and a second color filter, wherein the first color filter overlaps the first electrode and the first photoelectric conversion region and the second color filter overlaps the second electrode and the first photoelectric conversion region, and wherein the first color filter is configured to allow light of a first predetermined color component to pass therethrough and the second color filter is configured to allow light of a second predetermined color component which is different than the first predetermined color component to pass therethrough.

14. The photodetector according to claim 13, further comprising a light-shielding film that is positioned between the first photoelectric converter and the second photoelectric converter in a region between adjacent photoelectric conversion elements.

15. A photodetection system comprising:

a light-emitting device that emits infrared light and a photodetector that includes a photoelectric conversion element, the photoelectric conversion element comprising:

a semiconductor substrate;

a first photoelectric converter that is provided above the semiconductor substrate, and that detects and photoelectrically converts visible light;

a second photoelectric converter that is provided in the semiconductor substrate at a position overlapping the first photoelectric converter in a thickness direction of the semiconductor substrate, and that detects and photoelectrically converts the infrared light from the light-emitting device; and an optical filter that is provided above the first photoelectric converter, and that allows light of a predetermined color component included in a predetermined wavelength range to pass therethrough, the first photoelectric converter including first and second electrodes, a third electrode, and a first photoelectric conversion layer disposed between the first and second electrodes and the third electrode, the second photoelectric converter including a first photoelectric conversion region, and the optical filter including a first color filter and a second color filter, wherein the first color filter overlaps the first electrode and the first photoelectric conversion region and the second color filter overlaps the second electrode and the first photoelectric conversion region, and wherein the first color filter is configured to allow light of a first predetermined color component to pass therethrough and the second color filter is configured to allow light of a second predetermined color component which is different than the first predetermined color component to pass therethrough.

16. An electronic apparatus comprising:

an optical section, a signal processor, and a photoelectric conversion element, the photoelectric conversion element comprising:

a semiconductor substrate;

a first photoelectric converter that is provided above the semiconductor substrate, and that detects and photoelectrically converts light in a first wavelength range including a visible light range;

a second photoelectric converter that is provided in the semiconductor substrate at a position overlapping the first photoelectric converter in a thickness direction of the semiconductor substrate, and that detects and photoelectrically converts light in a second wavelength range including an infrared light range; and an optical filter that is provided above the first photoelectric converter, and that allows light of a predetermined color component included in a predetermined wavelength range to pass therethrough, the first photoelectric converter including first and second electrodes, a third electrode, and a first photoelectric conversion layer disposed between the first and second electrodes and the third electrode, the second photoelectric converter including a first photoelectric conversion region, and the optical filter including a first color filter and a second color filter, wherein the first color filter overlaps the first electrode and the first photoelectric conversion region and the second color filter overlaps the second electrode and the first photoelectric conversion region, and wherein the first color filter is configured to allow light of a first predetermined color component to pass therethrough and the second color filter is configured to allow light of a second predetermined color component which is different than the first predetermined color component to pass therethrough.

17. A mobile body comprising:

a photodetection system including a light-emitting device and a photodetector, the light-emitting device emitting first light in a visible light range and second light in an infrared light range, the photodetector including a photoelectric conversion element, the photoelectric conversion element comprising:

a semiconductor substrate;

a first photoelectric converter that is provided above the semiconductor substrate, and that detects and photoelectrically converts light in a first wavelength range including the first light;

a second photoelectric converter that is provided in the semiconductor substrate at a position overlapping the first photoelectric converter in a thickness direction of the semiconductor substrate, and that detects and photoelectrically converts light in a second wavelength range including the second light; and an optical filter that is provided above the first photoelectric converter, and that allows light of a predetermined color component included in a predetermined wavelength range to pass therethrough, the first photoelectric converter including first and second electrodes, a third electrode, and a first photoelectric conversion layer disposed between the first and second electrodes and the third electrode, the second photoelectric converter including a first photoelectric conversion region, and the optical filter including a first color filter and a second color filter, wherein the first color filter overlaps the first electrode and the first photoelectric conversion region and the second color filter overlaps the second electrode and the first photoelectric conversion region, and wherein the first color filter is configured to allow light of a first predetermined color component to pass therethrough and the second color filter is configured to allow light of a second predetermined color component which is different than the first predetermined color component to pass therethrough.

18. A photoelectric conversion element comprising:
a semiconductor substrate;
a first photoelectric converter that is provided above the semiconductor substrate, that includes first and second electrodes, a third electrode, and a first photoelectric conversion layer disposed between the first and second electrodes and the third electrode, and that detects and photoelectrically converts light in a first wavelength range;
a second photoelectric converter that is provided in the semiconductor substrate at a position overlapping the first photoelectric converter in a thickness direction of the semiconductor substrate, and that detects and photoelectrically converts light in a second wavelength range;
a through electrode that is electrically coupled to the first electrode, and that extracts electric charges generated in the first photoelectric conversion layer to a side opposite to the semiconductor substrate as viewed from the first photoelectric converter; and
a metal layer that surrounds the through electrode with an insulating layer interposed therebetween,
the second photoelectric converter including a first photoelectric conversion region, and
an optical filter including a first color filter and a second color filter,
wherein the first color filter overlaps the first electrode and the first photoelectric conversion region and the second color filter overlaps the second electrode and the first photoelectric conversion region, and
wherein the first color filter is configured to allow light of a first predetermined color component to pass therethrough and the second color filter is configured to allow light of a second predetermined color component which is different than the first predetermined color component to pass therethrough.

19. The photoelectric conversion element according to claim 18, wherein the metal layer is provided to surround the second photoelectric converter in a plane orthogonal to the thickness direction.

20. An electronic apparatus comprising:
a photodetection system including a light-emitting device and a photodetector, the light-emitting device emitting first light in a visible light range and second light in an infrared light range, the photodetector including a photoelectric conversion element, the photoelectric conversion element comprising:
a semiconductor substrate;
a first photoelectric converter that is provided above the semiconductor substrate, and that detects and photoelectrically converts light in a first wavelength range including the first light;
a second photoelectric converter that is provided in the semiconductor substrate at a position overlapping the first photoelectric converter in a thickness direction of the semiconductor substrate, and that detects and photoelectrically converts light in a second wavelength range including the second light; and
an optical filter that is provided above the first photoelectric converter, and that allows light of a predetermined color component included in a predetermined wavelength range to pass therethrough,
the first photoelectric converter including first and second electrodes, a third electrode, and a first photoelectric conversion layer disposed between the first and second electrodes and the third electrode,
the second photoelectric converter including a first photoelectric conversion region, and
the optical filter including a first color filter and a second color filter,
wherein the first color filter overlaps the first electrode and the first photoelectric conversion region and the second color filter overlaps the second electrode and the first photoelectric conversion region, and
wherein the first color filter is configured to allow light of a first predetermined color component to pass therethrough and the second color filter is configured to allow light of a second predetermined color component which is different than the first predetermined color component to pass therethrough.

21. An electronic apparatus comprising:
an optical section, a signal processor, and a photoelectric conversion element, the photoelectric conversion element comprising:
a semiconductor substrate;
a first photoelectric converter that is provided above the semiconductor substrate, that includes first and second electrodes, a third electrode, and a first photoelectric conversion layer disposed between the first and second electrodes and the third electrode, and that detects and photoelectrically converts light in a first wavelength range;
a second photoelectric converter that is provided in the semiconductor substrate at a position overlapping the first photoelectric converter in a thickness direction of the semiconductor substrate, and that detects and photoelectrically converts light in a second wavelength range;
a through electrode that is electrically coupled to the first electrode, and that extracts electric charges generated in the first photoelectric conversion layer to a side opposite to the semiconductor substrate as viewed from the first photoelectric converter; and
a metal layer that surrounds the through electrode with an insulating layer interposed therebetween,
the second photoelectric converter including a first photoelectric conversion region, and
an optical filter including a first color filter and a second color filter,
wherein the first color filter overlaps the first electrode and the first photoelectric conversion region and the second color filter overlaps the second electrode and the first photoelectric conversion region, and
wherein the first color filter is configured to allow light of a first predetermined color component to pass therethrough and the second color filter is configured to allow light of a second predetermined color component which is different than the first predetermined color component to pass therethrough.

* * * * *